(12) United States Patent
Im et al.

(10) Patent No.: US 12,255,223 B2
(45) Date of Patent: Mar. 18, 2025

(54) DISPLAY DEVICE, AND METHOD FOR PRODUCING SAME

(71) Applicant: SAMSUNG DISPLAY CO., LTD., Yongin-si (KR)

(72) Inventors: Hyun Deok Im, Yongin-si (KR); Jong Hyuk Kang, Yongin-si (KR); Dae Hyun Kim, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 421 days.

(21) Appl. No.: 17/640,693

(22) PCT Filed: Aug. 24, 2020

(86) PCT No.: PCT/KR2020/095120
§ 371 (c)(1),
(2) Date: Mar. 4, 2022

(87) PCT Pub. No.: WO2021/045605
PCT Pub. Date: Mar. 11, 2021

(65) Prior Publication Data
US 2022/0375990 A1    Nov. 24, 2022

(30) Foreign Application Priority Data
Sep. 5, 2019    (KR) .................. 10-2019-0110147

(51) Int. Cl.
*H01L 27/15*    (2006.01)
*H01L 33/00*    (2010.01)
(Continued)

(52) U.S. Cl.
CPC .......... *H01L 27/156* (2013.01); *H01L 33/005* (2013.01); *H01L 33/24* (2013.01);
(Continued)

(58) Field of Classification Search
None
See application file for complete search history.

(56) References Cited

U.S. PATENT DOCUMENTS 9,773,761 B2    9/2017 Do
10,490,537 B2    11/2019 Bae et al.
(Continued)

FOREIGN PATENT DOCUMENTS

KR    10-1490758 B1    2/2015
KR    10-2018-0007376 A    1/2018
(Continued)

OTHER PUBLICATIONS

International Search Report issued in corresponding Application No. PCT/KR2020/095120 dated Dec. 15, 2020, 9 pages.
(Continued)

*Primary Examiner* — Cory W Eskridge
(74) *Attorney, Agent, or Firm* — Womble Bond Dickinson (US) LLP

(57) ABSTRACT

A display device includes a pixel in a display area. The pixel includes: spaced apart first and second electrodes; a first insulating layer on the first electrode and the second electrode and between the first electrode and the second electrode and having a first etch selectivity; a first insulating pattern on the first insulating layer between the first electrode and the second electrode, and having a second etch selectivity; a light emitting element on the first insulating pattern; a second insulating pattern having the second etch selectivity and being on one area of the light emitting element such that a first end and the second end of the light emitting element are exposed; and third and fourth electrodes configured to electrically connect the first end and the second end of the light emitting element to the first and second electrodes, respectively.

20 Claims, 27 Drawing Sheets

(51) Int. Cl.
  *H01L 33/24* (2010.01)
  *H01L 33/38* (2010.01)
  *H01L 33/44* (2010.01)
(52) U.S. Cl.
  CPC .............. *H01L 33/38* (2013.01); *H01L 33/44* (2013.01); *H01L 2933/0016* (2013.01)

(56) References Cited

U.S. PATENT DOCUMENTS

| | | | |
|---|---|---|---|
| 10,607,968 | B2 | 3/2020 | Woo et al. |
| 10,672,946 | B2 | 6/2020 | Cho et al. |
| 11,074,858 | B2 | 7/2021 | Cho et al. |
| 2017/0287789 | A1 | 10/2017 | Bower et al. |
| 2018/0019369 | A1* | 1/2018 | Cho ........................ H01L 33/38 |
| 2018/0033915 | A1 | 2/2018 | Crowder et al. |
| 2018/0175106 | A1 | 6/2018 | Kim et al. |
| 2019/0172819 | A1 | 6/2019 | Bae et al. |
| 2019/0244567 | A1 | 8/2019 | Cho et al. |
| 2021/0167050 | A1* | 6/2021 | Cho ........................ H01L 33/22 |
| 2021/0167124 | A1* | 6/2021 | Min ..................... H01L 33/0062 |
| 2021/0280746 | A1* | 9/2021 | Kim ....................... H01L 33/382 |

FOREIGN PATENT DOCUMENTS

| | | |
|---|---|---|
| KR | 10-2019-0034379 A | 4/2019 |
| KR | 10-2019-0067296 A | 6/2019 |
| KR | 10-2019-0096475 A | 8/2019 |
| KR | 10-2020-0077671 A | 7/2020 |

OTHER PUBLICATIONS

International Written Opinion issued in corresponding Application No. PCT/KR2020/095120 dated Dec. 15, 2020, including English Translation, 7 pages.

* cited by examiner

DISPLAY DEVICE, AND METHOD FOR PRODUCING SAME

CROSS-REFERENCE TO RELATED APPLICATION

This application is a U.S. National Phase Patent Application of International Patent Application Number PCT/KR2020/095120, filed on Aug. 24, 2020, which claims priority to Korean Patent Application Number 10-2019-0110147, filed on Sep. 5, 2019, the entire content of all of which is incorporated herein by reference.

BACKGROUND

1. Field

Aspects of embodiments of the present disclosure relate to a display device and a method of producing (or fabricating) the same.

2. Description of the Related Art

Recently, a technique of manufacturing a subminiature light emitting element using a material having a reliable inorganic crystal structure and manufacturing a light emitting device using the light emitting element has been developed. For example, a technique of fabricating a plurality of subminiature light emitting elements, each having a small size corresponding to a range from the nanometer scale to the micrometer scale, and forming light sources of various light emitting devices, including pixels of display devices, using the subminiature light emitting elements, has been developed.

SUMMARY

Aspects and features of the present disclosure provide a display device including light emitting elements and a method of fabricating the same.

A display device in accordance with an embodiment of the present disclosure includes a pixel in a display area. The pixel includes: a first electrode and a second electrode spaced apart from each other; a first insulating layer on one area of each of the first electrode and the second electrode and in an area between the first electrode and the second electrode, and having a first etch selectivity; a first insulating pattern on the first insulating layer in the area between the first electrode and the second electrode, and having a second etch selectivity; a light emitting element on the first insulating pattern, and having a first end and a second end; a second insulating pattern having the second etch selectivity, and being on one area of the light emitting element such that the first end and the second end of the light emitting element are exposed; and a third electrode and a fourth electrode configured to electrically connect the first end and the second end of the light emitting element to the first electrode and the second electrode, respectively.

In an embodiment, the first insulating layer may include a first insulating material. The first insulating pattern and the second insulating pattern may include a second insulating material different from the first insulating material.

In an embodiment, the light emitting element may be spaced apart from the first insulating layer with the first insulating pattern therebetween.

In an embodiment, the first insulating pattern may be on the first insulating layer and only under the light emitting element and the second insulating pattern.

In an embodiment, the light emitting element may be spaced apart from the first insulating layer by a distance equal to or greater than a thickness of the first insulating pattern.

In an embodiment, the pixel may further include: a first bank pattern under one area of the first electrode; and a second bank pattern under one area of the second electrode.

In an embodiment, the first bank pattern may have a first sidewall facing the first end of the light emitting element. The second bank pattern may have a second sidewall facing the second end of the light emitting element.

In an embodiment, the third electrode may be on the first end and may extend to an upper portion of the first electrode via an upper portion of the first sidewall. The fourth electrode may be on the second end of the light emitting element and may extend to an upper portion of the second electrode via an upper portion of the second sidewall.

In an embodiment, the pixel may include a plurality of light emitting elements including the light emitting element and being connected between the first electrode and the second electrode. The plurality of light emitting elements may be closer to the first electrode than to the second electrode.

In an embodiment, the first electrode may be connected to a first power source, and the second electrode may be connected to a second power source.

In an embodiment, the pixel may further include a pixel circuit connected between the first power source and the first electrode. The display device may include, in the display area: a circuit layer including circuit elements of the pixel circuit; and a display layer overlapping the circuit layer, and including first electrode, the second electrode, the light emitting element.

A method of fabricating a display device in accordance with an embodiment of the present disclosure includes: forming a first electrode and a second electrode on a base layer; forming a first insulating layer having a first etch selectivity on the base layer so that the first insulating layer covers the first electrode and the second electrode; forming a first insulating material layer having a second etch selectivity on the first insulating layer; supplying a light emitting element onto the base layer on which the first insulating material layer is formed, and aligning the light emitting element between the first electrode and the second electrode; forming a second insulating material layer having the second etch selectivity on the base layer so that the second insulating material layer covers the first insulating material layer and the light emitting element; exposing a first end and a second end of the light emitting element by etching the first insulating material layer and the second insulating material layer; exposing one area of each of the first electrode and the second electrode by etching the first insulating layer; and forming a third electrode and a fourth electrode configured to electrically connect the first end and the second end of the light emitting element to the first electrode and the second electrode, respectively.

In an embodiment, the first insulating layer may include a first insulating material. The first insulating material layer may include a second insulating material different from the first insulating material.

In an embodiment, the second insulating material layer may include the second insulating material.

In an embodiment, the first insulating material layer and the second insulating material layer may be simultaneously etched. A first insulating pattern may be formed by etching the first insulating material layer such that the first insulating pattern is under a lower portion of the light emitting element including the first end and the second end of the light emitting element. A second insulating pattern may be formed by etching the second insulating material layer such that the second insulating pattern is over one area of the light emitting element other than the first end and the second end of the light emitting element.

In an embodiment, the method may further include forming a first bank pattern and a second bank pattern on the base layer before forming the first electrode and the second electrode.

In an embodiment, the first electrode may be formed on the first bank pattern such that one area of the first electrode protrudes due to the first bank pattern. The second electrode may be formed on the second bank pattern such that one area of the second electrode protrudes due to the second bank pattern.

In an embodiment, the supplying and aligning of the light emitting element may include: supplying a plurality of light emitting elements including the light emitting element to each pixel area in which the first electrode and the second electrode are formed; and aligning the light emitting elements between the first electrode and the second electrode by forming an electric field between the first electrode and the second electrode.

In an embodiment, the light emitting elements may be aligned to be closer to the first electrode than to the second electrode.

In an embodiment, the method may include forming a circuit layer including a pixel circuit on the base layer before forming the first electrode and the second electrode.

In a display device and a method of fabricating the display device in accordance with an embodiment of the present disclosure, a light emitting element may be reliably connected between a first electrode and a second electrode of a pixel. Therefore, a utilization rate of light emitting elements supplied to each pixel area may be improved and emission characteristics of the pixel may be stabilized.

DETAILED DESCRIPTION

Figure 1A:
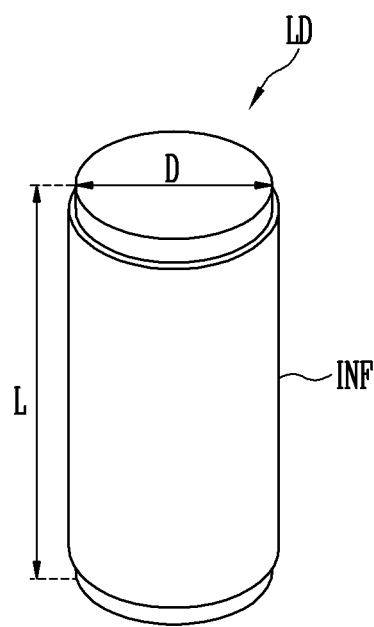
FIGS. 1A and 1B are, respectively, a perspective view and a sectional view illustrating a light emitting element in accordance with an embodiment of the present disclosure.

Reference will now be made, in detail, to various embodiments of the present disclosure, examples of which are illustrated in the accompanying drawings and are described below. Because the embodiments of the present disclosure can be variously modified in many different forms, the present disclosure is not limited to the following embodiments and may be modified into various forms. Each embodiment to be described below may be implemented alone or may be combined with at least another embodiment or aspects of another embodiment to make various combinations of embodiments.

Some elements that are not directly related to the features of the present disclosure and that are understood by those skilled in the art to which the present disclosure pertain may not be described to more clearly explain the aspects and features of the present disclosure. Furthermore, the sizes, ratios, etc. of elements in the drawings may be exaggerated. It should be noted that the same reference numerals are used to designate the same or similar elements throughout the drawings, and repetitive explanation thereof will be omitted.

It will be understood that, although the terms "first", "second", etc. may be used herein to describe various elements, these elements should not be limited by these terms. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may intervene (or be interposed) between them. Furthermore, the term "position", "direction", etc. used in the following description are defined in relative terms, and it should be noted that they may be changed into a reverse position or direction depending on a view angle or direction. Furthermore, a singular form may include a plural form as long as it is not specifically mentioned in a sentence.

As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

FIGS. 1A, 1B, 2A, 2B, 3A, and 3B are perspective views and sectional views, each illustrating a light emitting element LD in accordance with an embodiment of the present disclosure. Although FIGS. 1A to 3B illustrate cylindrical rod-type light emitting elements LD, the type and/or shape of the light emitting elements LD in accordance with the present disclosure is not limited thereto.

Figure 1B:
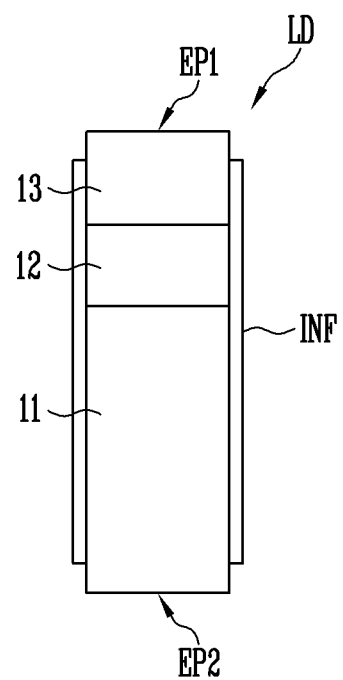

Referring to FIGS. 1A and 1B, a light emitting element LD in accordance with an embodiment of the present disclosure may include a first semiconductor layer 11, a second semiconductor layer 13, and an active layer 12 interposed between the first and second semiconductor layers 11 and 13. For example, the light emitting element LD may include the first semiconductor layer 11, the active layer 12, and the second semiconductor layer 13, which are successively stacked in a longitudinal direction (L).

In an embodiment, the light emitting element LD may be a rod-type light emitting element (also referred to as "rod-type light emitting diode"). For example, the light emitting element LD may be fabricated in the form of a rod extending in one direction (e.g., the longitudinal direction (L)) through an etching scheme or the like.

Herein, the term "rod-shape" embraces a rod-like shape and a bar-like shape, such as a cylindrical shape and a prismatic shape extending in a longitudinal direction (i.e., having an aspect ratio greater than 1), and the cross-sectional shape thereof is not limited to a particular shape. For example, the length L of the light emitting element LD may be greater than a diameter D thereof (or a width of the cross-section thereof).

When the direction in which the light emitting element LD extends is defined as the longitudinal direction (L), the light emitting element LD may have a first end EP1 and a second end EP2 with respect to the longitudinal direction (L). The first and second ends EP1 and EP2 may be areas including surfaces (e.g., two outer surfaces of a cylinder) disposed on opposite ends of the light emitting element LD with respect to the longitudinal direction (L) and may be areas including not only the surfaces of the opposite ends but also areas formed around the surfaces.

In an embodiment, the light emitting element LD may have a small size ranging from the nanometer scale to the micrometer scale. For example, each light emitting element LD may have a diameter D (or a width) and/or a length L ranging from the nanometer scale to the micrometer scale. However, in the present disclosure, the size of the light emitting element LD is not limited thereto. For example, the size of the light emitting element LD may be changed in various ways depending on design conditions of various devices, such as a display device that employs, as a light source, a light emitting device using a light emitting element LD.

Any one of the first and second semiconductor layers 11 and 13 may be disposed at the first end EP1 of the light emitting element LD. The other one of the first and second semiconductor layers 11 and 13 may be disposed at the second end EP2 of the light emitting element LD.

The first semiconductor layer 11 may be formed of a first conductive semiconductor layer. For example, the first semiconductor layer 11 may include at least one N-type semiconductor layer. For instance, the first semiconductor layer 11 may include an N-type semiconductor layer including any one semiconductor material from among InAlGaN, GaN, AlGaN, InGaN, AlN, and InN and that is doped with a first conductive dopant, such as Si, Ge, or Sn. However, the constituent material of the first semiconductor layer 11 is not limited thereto, and various other suitable materials may be used to form the first semiconductor layer 11.

The active layer 12 may be disposed on the first semiconductor layer 11 and may have a single or multi-quantum well (MQW) structure. In an embodiment, a cladding layer doped with a conductive dopant may be formed over and/or under the active layer 12. For example, the cladding layer may be formed of an AlGaN layer or an InAlGaN layer. In an embodiment, a material, such as AlGaN or AlInGaN, may be used to form the active layer 12, and various other suitable materials may be used to form the active layer 12.

The second semiconductor layer 13 may be disposed on the active layer 12 and may be formed of a second conductive semiconductor layer having a type different from that of the first semiconductor layer 11. For example, the second semiconductor layer 13 may include at least one P-type semiconductor layer. For instance, the second semiconductor layer 13 may include a P-type semiconductor layer including at least one semiconductor material from among InAlGaN, GaN, AlGaN, InGaN, AlN, and InN and that is doped with a second conductive dopant, such as Mg. However, the material for forming the second semiconductor layer 13 is not limited thereto, and the second semiconductor layer 13 may be formed of various other suitable materials.

When a voltage having a threshold voltage or more is applied between the opposite ends (e.g., the first and second ends EP1 and EP2) of the light emitting element LD, the light emitting element LD emits light by the combination of electron-hole pairs in the active layer 12. Because light emission of the light emitting element LD can be controlled based on the foregoing principle, the light emitting element LD may be used as a light source of various light emitting devices as well as a pixel of the display device.

In an embodiment, the light emitting element LD may further include an insulating film INF provided on the surface of the light emitting element LD. The insulating film INF may be formed on the surface of the light emitting element LD to enclose an outer circumferential surface of at least the active layer 12 and may further enclose one area (or one portion) of each of the first and second semiconductor layers 11 and 13. The insulating film INF may allow the opposite ends of the light emitting element LD that have different polarities to be exposed to the outside. For example, the insulating film INF may expose the first and second ends EP1 and EP2 that are disposed on the respective opposite ends of the light emitting element LD with respect to the longitudinal direction (L) (e.g., the insulating film INF may expose the top and bottom surfaces of the light emitting element LD that correspond to two base sides of the cylinder as shown in FIGS. 1A and 1B) rather than covering the first and second ends EP1 and EP2.

In an embodiment, the insulating film INF may include at least one insulating material from among silicon dioxide ($SiO_2$), silicon nitride ($Si_3N_4$), aluminum oxide ($Al_2O_3$), and titanium dioxide ($TiO_2$), but it is not limited thereto. The material that forms the insulating film INF is not limited to a particular material, and the insulating film INF may be formed of various well-known and suitable insulating materials.

In an embodiment, the light emitting element LD may further include additional other components as well as the first semiconductor layer 11, the active layer 12, the second semiconductor layer 13, and/or the insulating film INF. For example, the light emitting element LD may further include at least one fluorescent layer, additional active layer(s), additional semiconductor layer(s), and/or additional electrode layer(s) disposed on one end of the first semiconductor layer 11, the active layer 12, and/or the second semiconductor layer 13.

Figure 2A:
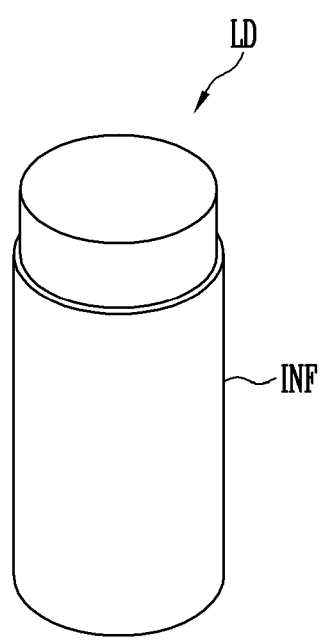
FIGS. 2A and 2B are, respectively, a perspective view and a sectional view illustrating a light emitting element in accordance with an embodiment of the present disclosure.
Figure 2B:
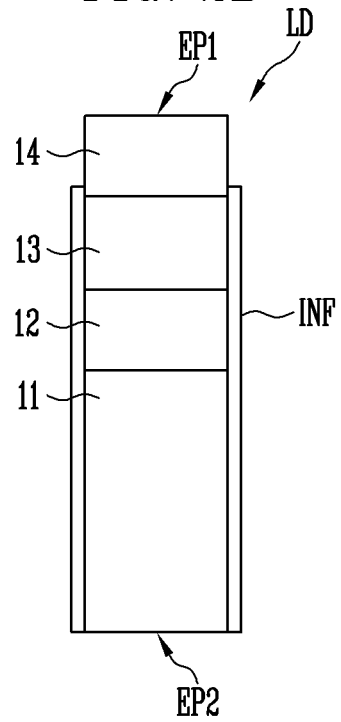

For example, as illustrated in FIGS. 2A and 2B, the light emitting element LD may further include an electrode layer 14 disposed on one end of the second semiconductor layer 13. For example, the light emitting element LD may further include an electrode layer 14 disposed on the first end EP1.

Figure 3A:
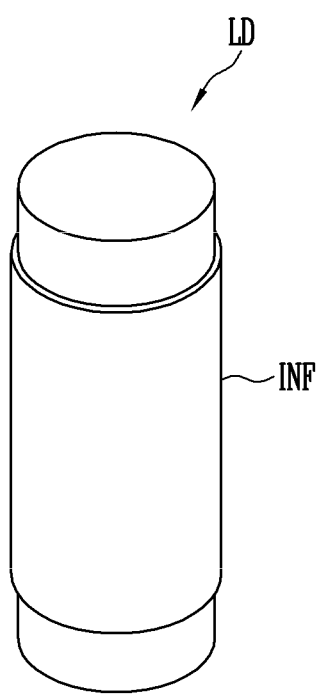
FIGS. 3A and 3B are, respectively, a perspective view and a sectional view illustrating a light emitting element in accordance with an embodiment of the present disclosure.
Figure 3B:
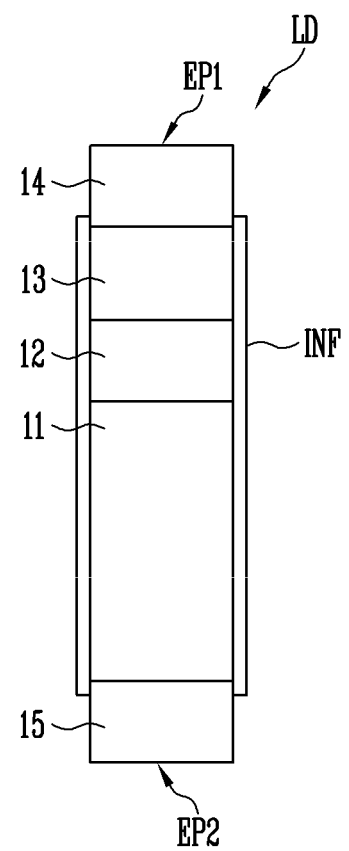

In an embodiment, as illustrated in FIGS. 3A and 3B, the light emitting element LD may further include an electrode layer 15 disposed on one end of the first semiconductor layer 11. For example, the light emitting element LD may include electrode layers 14 and 15 that are respectively disposed on the first and second ends EP1 and EP2.

The electrode layers 14 and 15 may be contact electrodes configured to connect each light emitting element LD to other circuit elements, lines, and/or electrodes, etc., but the present disclosure is not limited thereto. In an embodiment, each of the electrode layers 14 and 15 may include metal or metal oxide. For example, each of the electrode layers 14 and 15 may be formed of transparent electrode materials, such as chromium (Cr), titanium (Ti), aluminum (Al), gold (Au), nickel (Ni), oxides or alloys thereof, indium tin oxide (ITO), indium zinc oxide (IZO), zinc oxide (ZnO), or indium tin zinc oxide (ITZO), alone or in combination. In an embodiment, the electrode layers 14 and 15 may be substantially transparent or translucent. Thereby, light generated from the light emitting element LD may be emitted to the outside after passing through the electrode layers 14 and 15.

The insulating film INF may at least partially enclose the outer circumferential surfaces of the electrode layers 14 and 15 or may not enclose the outer circumferential surfaces. For example, the insulating film INF may be formed to selectively cover the surfaces of the electrode layers 14 and 15. Furthermore, the insulating film INF may be formed to expose the opposite ends of the light emitting element LD that have different conductivity types (e.g., P-type and N-type, respectively). For example, the insulating film INF may expose at least one area of each of the electrode layers 14 and 15 at the first and second ends EP1 and EP2 of the light emitting element LD. In another embodiment, the insulating film INF may be omitted from the light emitting element LD.

When the insulating film INF is provided to cover a surface of the light emitting element LD, including an outer circumferential surface of the active layer 12, the active layer 12 may not be short-circuited with an electrode (e.g., a first or second electrode of the pixel), to be described later. Consequently, the electrical stability of the light emitting element LD may be secured. In the description of the embodiments of the present disclosure, the term "connection (or coupling)" may comprehensively refer to physical and/or electrical connection (or coupling). Furthermore, the term "connection (or coupling)" may comprehensively refer to direct or indirect connection (or coupling) and integral or non-integral connection (or coupling).

Furthermore, the insulating film INF formed on the surface of the light emitting element LD may reduce or prevent a defect on the surface of the light emitting element LD such that the lifetime and efficiency of the light emitting element LD may be improved. In addition, when the insulating film INF is formed on each light emitting element LD, even when a plurality of light emitting elements LD are disposed adjacent to each other, the light emitting elements LD may not undesirably short-circuit with each other.

In an embodiment of the present disclosure, a surface treatment process may be performed during the fabrication of the light emitting element LD. For example, each light emitting element LD may be surface-treated so that, when a plurality of light emitting elements LD are mixed with a fluidic solution (or solvent) and then supplied to each emission area (e.g., an emission area of each pixel), the light emitting elements LD are evenly dispersed rather than unevenly aggregating in the solution.

In some embodiments, the insulating film INF itself may be formed of a hydrophobic film using hydrophobic material or an additional hydrophobic film formed of the hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). In such an embodiment, the hydrophobic material may include octadecyl trichlorosilane, fluoroalkyl trichlorosilane, perfluoroalkyl triethoxysilane, etc. Furthermore, the hydrophobic material may be a commercially available fluorine containing material, such as Teflon® (a registered trademark of The Chemours Company FC, LLC), Cytop® (a registered trademark of AGC, Inc. Corporation), or a corresponding material.

The above-described light emitting element LD may be used as a light source in different types of light emitting devices, including a pixel of a display device. For instance, one or a plurality of subminiature light emitting elements LD, each having a size ranging from the nanoscale to the microscale, may be disposed in each pixel area of the display panel for forming a screen of the display device, and a light source (or a light source unit) of the corresponding pixel may be formed by using the subminiature light emitting elements LD. The field of application of the light emitting element LD according to the present disclosure is not limited to a display device. For example, the light emitting element LD may also be used in other types of devices, such as a lighting device that uses (or includes) a light source.

Figure 4A:
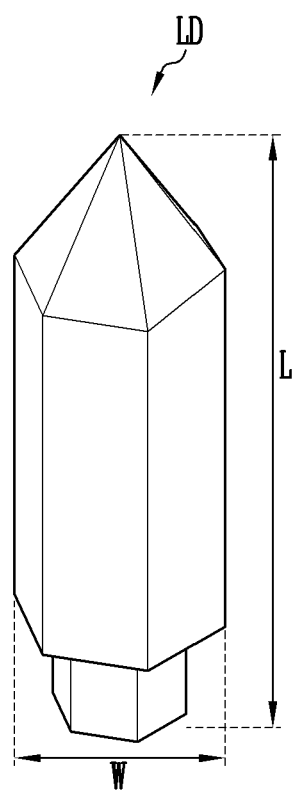
FIGS. 4A and 4B are, respectively, a perspective view and a sectional view illustrating a light emitting element in accordance with an embodiment of the present disclosure.
Figure 4B:
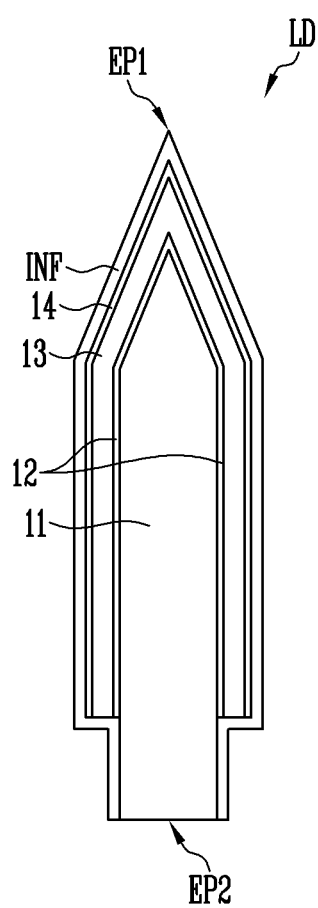

FIGS. 4A and 4B are, respectively, a perspective view and a sectional view illustrating a light emitting element LD in accordance with an embodiment of the present disclosure. As can be seen, the type, the structure, and/or the shape of the light emitting element LD in accordance with an embodiment of the present disclosure may be changed in various ways. In describing the embodiment shown in FIGS. 4A and 4B, like reference numerals are used to designate components similar or equal (or corresponding) to those of the embodiments shown in FIGS. 1A to 3B, and detailed descriptions thereof will be omitted.

Referring to FIGS. 4A and 4B, the light emitting element LD in accordance with an embodiment of the present disclosure may include a first semiconductor layer 11, a second semiconductor layer 13, and an active layer 12 interposed between the first and second semiconductor layers 11 and 13. In an embodiment, the first semiconductor layer 11 may be disposed at a central area of the light emitting element LD, and the active layer 12 may be disposed at a surface of the first semiconductor layer 11 to enclose at least one area (or portion) of the first semiconductor layer 11. The second semiconductor layer 13 may be disposed on a surface of the active layer 12 to enclose at least one area of the active layer 12.

The light emitting element LD may selectively further include an electrode layer 14 configured to enclose at least one area of the second semiconductor layer 13 and/or an insulating film INF disposed on an outermost surface of the light emitting element LD. For example, the light emitting element LD may further include the electrode layer 14 disposed on a surface of the second semiconductor layer 13 to enclose at least one area of the second semiconductor layer 13 and the insulating film INF disposed on a surface of the electrode layer 14 to enclose at least one area of the electrode layer 14.

In an embodiment, the insulating film INF may be provided on the surface of the light emitting element LD to cover a portion of the outer circumferential surface of the first semiconductor layer 11 and an outer circumferential surface of the electrode layer 14. The insulating film INF may be formed to be transparent or translucent.

In an embodiment, after the insulating film INF is formed to cover the entirety of the outer circumferential surface of the electrode layer 14 included in the light emitting element LD, the insulating film INF may be partially removed to expose one area of the electrode layer 14 for electrical connection with an electrode (e.g., a first electrode of a pixel).

The light emitting element LD in accordance with the foregoing embodiment may be a core-shell light emitting element (also referred to as "core-shell light emitting diode") fabricated by a growth scheme or the like. For example, the light emitting element LD may have a core-shell structure including the first semiconductor layer 11, the active layer 12, the second semiconductor layer 13, the electrode layer 14, and the insulating film INF, which are successively disposed in a direction from the center to the periphery. The electrode layer 14 and the insulating film INF may be selectively provided in different embodiments. For example, in an embodiment, the light emitting element LD may omit at least one of the electrode layer 14 and the insulating film INF.

In an embodiment, the light emitting element LD may have a polypyramid shape extending in one direction. For example, at least one area of the light emitting element LD may have a hexagonal pyramid shape.

When the direction in which the light emitting element LD extends is defined as the longitudinal direction (L), the light emitting element LD may have a first end EP1 and a second end EP2 with respect to the longitudinal direction (L). In an embodiment, any one of the first and second semiconductor layers 11 and 13 (or an electrode layer configured to enclose any one of the first and second semiconductor layers 11 and 13) is disposed on the first end EP1 of the light emitting element LD. The other one of the first and second semiconductor layers 11 and 13 (or an electrode layer configured to enclose the other one of the first and second semiconductor layers 11 and 13) may be disposed on the second end EP2 of the light emitting element LD.

In an embodiment of the present disclosure, the light emitting element LD may be a light emitting diode having a core-shell structure with the first end EP1 protruding in a polypyramid shape (e.g., a hexagonal pyramid shape) and may have a subminiature size. For example, the light emitting element LD may have a shape corresponding to a combination of a hexagonal pyramid and a hexagonal prism, a small size ranging from the nanoscale to the microscale (e.g., a width W and/or a length L corresponding to the nanoscale or the microscale). The size and the shape of the light emitting element LD may be changed depending on design conditions of various devices, such as a display device that employs the light emitting element LD as a light source.

In an embodiment, the opposite ends of the first semiconductor layer 11 may have shapes protruding in the longitudinal direction (L) of the light emitting element LD. In an embodiment, the protruding shapes of the opposite ends of the first semiconductor layer 11 may differ from each other. For example, disposed at an upper position, one end of the opposite ends of the first semiconductor layer 11 may have a pyramid shape (e.g., a hexagonal pyramid shape), the width of which is reduced upwardly to converge at one apex. Furthermore, disposed at a lower position, the other end of the opposite ends of the first semiconductor layer 11 may have a prismatic shape (e.g., a hexagonal prism shape) having a constant width, but the present disclosure is not limited thereto. For example, in another embodiment, the first semiconductor layer 11 may have a pillar-shaped or stepped cross-section, the width of which is gradually reduced downward. For example, the shapes of the opposite ends of the first semiconductor layer 11 may be changed in various suitable ways depending on embodiments.

The first semiconductor layer 11 may be disposed in a core of the light emitting element LD (e.g., a central (or middle) area thereof). Furthermore, the light emitting element LD may have a shape corresponding to the shape of the first semiconductor layer 11. For instance, when the first semiconductor layer 11 has a hexagonal pyramid shape on the upper one end thereof, the light emitting element LD may have a hexagonal pyramid shape on an upper one end thereof (e.g., the first end EP1).

The active layer 12 may be provided and/or formed in a shape enclosing an outer circumferential surface of the first semiconductor layer 11. For example, the active layer 12 may be provided and/or formed in a shape enclosing an area of the first semiconductor layer 11 other than one end (e.g., the second end EP2 at the lower position) of the first semiconductor layer 11 with respect to the longitudinal direction (L) of the light emitting element LD.

The second semiconductor layer 13 may be provided and/or formed in a shape enclosing an outer circumferential surface of the active layer 12 and may include a semiconductor layer having a type different from that of the first semiconductor layer 11. For example, when the first semiconductor layer 11 includes an N-type semiconductor layer, the second semiconductor layer 13 may include a P-type semiconductor layer.

In an embodiment, the light emitting element LD may further include an electrode layer 14 that encloses an outer circumferential surface of the second semiconductor layer 13. The electrode layer 14 may be a contact electrode electrically connected to the second semiconductor layer 13, but the present disclosure is not limited thereto.

As described above, the light emitting element LD may have a core-shell structure with the opposite ends protruding outwardly and may include the first semiconductor layer 11 provided in the central portion thereof, the active layer 12 which encloses the first semiconductor layer 11, and the second semiconductor layer 13 which encloses the active layer 12. Furthermore, the light emitting element LD may selectively further include the electrode layer 14 that encloses the second semiconductor layer 13. One end of the electrode layer 14 may be disposed at the first end EP1 of the light emitting element LD, and one end of the first semiconductor layer 11 may be disposed at the second end EP2 of the light emitting element LD.

The above-described light emitting element LD may be used as a light source in different types of light emitting devices, including a pixel. For instance, one or a plurality of subminiature light emitting elements LD, each having a size ranging from the nanoscale to the microscale, may be disposed in each pixel area of the display panel to form a light source (or a light source unit) of the corresponding pixel by using the subminiature light emitting elements LD.

In an embodiment, each pixel may include at least one rod-type light emitting element LD, at least one core-shell light emitting element LD or a combination of the rod-type light emitting element LD and the core-shell light emitting element LD. In an embodiment, each pixel may include other light emitting elements having a type and/or shape different from that of the rod-type light emitting element LD or the core-shell light emitting element LD.

Figure 5:
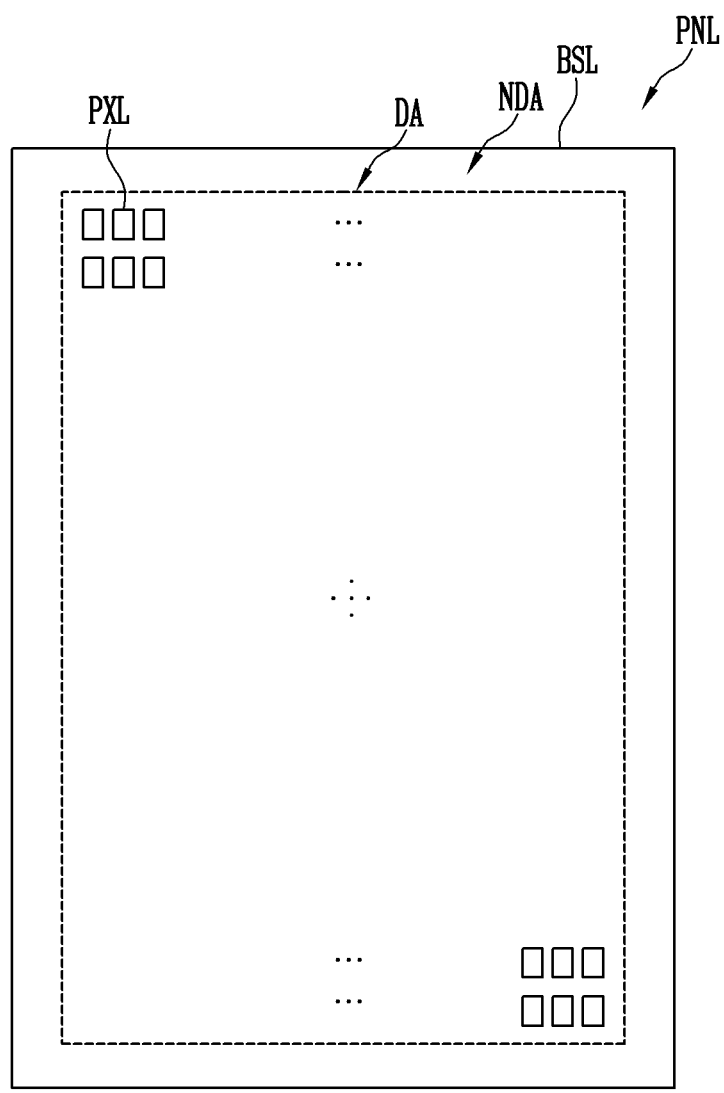
FIG. 5 is a plan view illustrating a display device in accordance with an embodiment of the present disclosure.

FIG. 5 is a plan view illustrating a display device in accordance with an embodiment of the present disclosure. FIG. 5 illustrates a display device and a display panel PNL provided in the display device as an example of an electronic device which may use, as a light source, the light emitting element LD described in connection with FIGS. 1A to 4B. For example, each of the pixels PXL of the display panel PNL may have at least one light emitting element LD.

For the sake of explanation, FIG. 5 simply illustrates the structure of the display panel PNL in accordance with an embodiment by focusing on a display area DA. In some embodiments, at least one driving circuit (e.g., at least one of a scan driver and a data driver) and/or a plurality of lines may be further provided on (or in) the display panel PNL.

Referring to FIG. 5, the display panel PNL in accordance with an embodiment of the present disclosure may include a base layer BSL and a plurality of pixels PXL disposed on the base layer BSL. In an embodiment, each pixel PXL may be (or may include) a first color pixel configured to emit light having a first color (e.g., red), a second color pixel configured to emit light having a second color (e.g., green), and a third color pixel configured to emit light having a third color (e.g., blue). The type and/or arrangement structure of the pixels PXL may be changed in various suitable ways depending on embodiments.

The display panel PNL and the base layer BSL of the display panel PNL may have a display area DA for displaying an image and a non-display area NDA other than the display area DA. The pixels PXL may be disposed in the display area DA on the base layer BSL.

In an embodiment, the display area DA may be disposed at a central area of the display panel PNL, and the non-display area NDA may be disposed in a peripheral area of the display panel PNL in such a way as to enclose (e.g., to surround a periphery of) the display area DA. The locations of the display area DA and the non-display area NDA are not limited thereto, and the locations thereof may be changed. The display area DA may form a screen on which an image is displayed.

The base layer BSL may form a base of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the present disclosure is not limited thereto. For instance, the base layer BSL may be a transparent, translucent, opaque, or reflective base.

One area on the base layer BSL may be defined as the display area DA in which the pixels PXL are disposed, and the other area thereof may be defined as the non-display area NDA. For example, the base layer BSL may have the display area DA including a plurality of pixel areas in which the respective pixels PXL are formed and the non-display area NDA located around the display area DA. Various lines and/or internal circuits, which are connected to the pixels PXL of the display area DA, may be disposed in the non-display area NDA.

A plurality of pixels PXL may be dispersed and disposed in the display area DA. For example, the plurality of pixels PXL may be regularly arranged in the display area DA in a stripe or PenTile® (a registered trademark of Samsung Display Co., Ltd.) arrangement manner or the like. The arrangement structure of the pixels PXL is not limited thereto, and the pixels PXL may be arranged on the display area DA in various structures and/or schemes.

Each pixel PXL may include at least one light source, which is driven by a control signal (e.g., a scan signal and a data signal) and/or a power source (e.g., a first power source and a second power source). In an embodiment, each pixel PXL may include at least one light emitting element LD in accordance with any one of the embodiments shown in FIGS. 1A to 3B (e.g., at least one subminiature rod-type light emitting element LD fabricated through an etching scheme to have a small size ranging from the nanoscale to the microscale). In an embodiment, each pixel PXL may include at least one light emitting element LD in accordance with the embodiment shown in FIGS. 4A and 4B (e.g., at least one subminiature core-shell light emitting element LD fabricated through a growth scheme to have a small size ranging from the nanoscale to the microscale). In addition, different types of light emitting elements LD may be used as a light source of the pixel PXL.

In an embodiment, each pixel PXL may be an active pixel. For example, the pixel PXL may further include a light emitting element LD and a pixel circuit configured to control emission of the light emitting element LD. However, the types, structures, and/or driving schemes of the pixels PXL capable of being applied to the display device according to the present disclosure are not particularly limited. For example, each pixel PXL may have the same structure as that of a pixel for passive or active light emitting display devices, which have various known structures and/or may be operated according to various known driving schemes.

FIGS. 6A to 6G are circuit diagrams each illustrating a pixel PXL in accordance with an embodiment of the present disclosure. For example, FIGS. 6A to 6G illustrate different embodiments of the pixel PXL which can be applied to an active display device. However, the types of pixels PXL and display devices to which embodiments of the present disclosure may be applied are not limited thereto. In an embodiment, each pixel PXL illustrated in FIGS. 6A to 6G may be any of the pixels PXL provided on the display panel PNL shown in FIG. 5. The pixels PXL may have substantially the same or similar structure as each other.

Figure 6A:
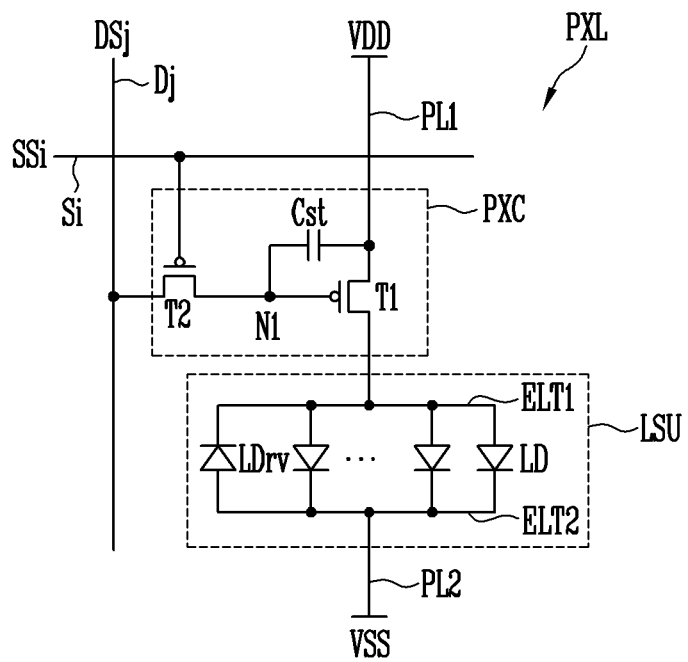
FIGS. 6A to 6G are circuit diagrams, each illustrating a pixel in accordance with an embodiment of the present disclosure.

Referring to FIG. 6A, the pixel PXL in accordance with an embodiment of the present disclosure may include a light source unit LSU configured to generate light having a luminance corresponding to a data signal. The pixel PXL may selectively further include a pixel circuit PXC configured to drive the light source unit LSU.

In an embodiment, the light source unit LSU may include one or a plurality of light emitting elements LD connected between the first power source (or first power supply) VDD and the second power source (or second power supply) VSS. For example, the light source unit LSU may include a first electrode ELT1 (also referred to as "first pixel electrode" or "first alignment electrode") connected to the first power source VDD via the pixel circuit PXC and the first power line PL1, a second electrode ELT2 (also referred to as "second pixel electrode" or "second alignment electrode") connected to the second power source VSS through the second power line PL2, and a plurality of light emitting elements LD connected in parallel to each other in the same direction between the first and second electrodes ELT1 and ELT2. In an embodiment, the first electrode ELT1 may be an anode electrode, and the second electrode ELT2 may be a cathode electrode.

In an embodiment, each of the light emitting elements LD may include a first end (e.g., a P-type end) connected to the first power source VDD through the first electrode ELT1 and/or the pixel circuit PXC and a second end (e.g., an N-type end) connected to the second power source VSS through the second electrode ELT2. In an embodiment, the light emitting elements LD may be connected in parallel between the first electrode ELT1 and the second electrode ELT2 in a forward direction. Each of the light emitting elements LD connected in a forward direction between the first power source VDD and the second power source VSS may form a valid light source. The valid light sources may form the light source unit LSU of the pixel PXL.

In an embodiment, the first power source VDD and the second power source VDD may have different potentials to allow the light emitting elements LD to emit light. For example, the first power source VDD may be set as a high-potential power source, and the second power source VSS may be set as a low-potential power source. A difference in potential between the first and second power sources VDD and VSS may be set to a threshold voltage of the light emitting elements LD or more during at least an emission period of the pixel PXL.

In an embodiment, one end (e.g., P-type ends) of the light emitting elements LD that form each light source unit LSU may be connected in common to the pixel circuit PXC through one electrode of the light source unit LSU (e.g., the first electrode ELT1 of each pixel PXL) and may be connected to the first power source VDD through the pixel circuit PXC and the first power line PL1. Another (e.g., the remaining) end (e.g., N-type ends) of the light emitting elements LD may be connected in common to the second power source VSS through another electrode of the light source unit LSU (e.g., the second electrode ELT2 of each pixel PXL) and the second power line PL2.

The light emitting elements LD may emit light having a luminance corresponding to driving current supplied thereto through the corresponding pixel circuit PXC. For example, during each frame period, the pixel circuit PXC may supply driving current corresponding to a gray scale value to be expressed in the corresponding frame to the light source unit LSU. The driving current supplied to the light source unit LSU may be divided into parts that flow to the light emitting elements LD connected in the forward direction. Hence, each of the light emitting elements LD may emit light having a luminance corresponding to current applied thereto so that the light source unit LSU may emit light having a luminance corresponding to the driving current.

In an embodiment, the light source unit LSU may further include at least one invalid light source, as well as including the light emitting elements LD that form valid light sources. For example, at least one reverse light emitting element LDrv may be connected between the first and second electrodes ELT1 and ELT2.

Each reverse light emitting element LDrv, along with the light emitting elements LD that form the valid light sources, may be connected in parallel to each other between the first and second electrodes ELT1 and ELT2 and may be connected between the first and second electrodes ELT1 and ELT2 in a direction opposite to that of the light emitting elements LD. For example, the N-type end of the reverse light emitting element LDrv may be connected to the first power source VDD via the first electrode ELT1 and the pixel circuit PXC. The P-type end of the reverse light emitting element LDrv may be connected to the second power source VSS via the second electrode ELT2. When a driving voltage (e.g., a normal directional driving voltage) is applied between the first and second electrodes ELT1 and ELT2, the reverse light emitting element LDrv remains deactivated (e.g., does not emit light). Hence, current does not substantially flow through the reverse light emitting element LDrv.

Furthermore, in an embodiment, at least one pixel PXL may include at least one invalid light source that is not completely connected between the first and second electrodes ELT1 and ELT2. For example, at least one pixel PXL may further include at least one invalid light emitting element which is disposed in the light source unit LSU but the first and second ends EP1 and EP2 of which are not completely connected to the first and second electrodes ELT1 and ELT2.

The pixel circuit PXC is connected between the first power source VDD and the first electrode ELT1 of the light source unit LSU. The pixel circuit PXC may be connected to a scan line Si and a data line Dj of the corresponding pixel PXL. For example, when the pixel PXL is disposed on an i-th (i is a natural number) horizontal line (row) and a j-th (j is a natural number) vertical line (column) of the display area DA, the pixel circuit PXC of the pixel PXL may be connected to an i-th scan line Si and a j-th data line Dj of the display area DA.

In an embodiment, the pixel circuit PXC may include a plurality of transistors and at least one capacitor. For example, the pixel circuit PXC may include a first transistor T1, a second transistor T2, and a storage capacitor Cst.

The first transistor T1 may be connected between the first power source VDD and the light source unit LSU. For example, a first electrode (e.g., a source electrode) of the first transistor T1 may be connected to the first power source VDD, and a second electrode (e.g., a drain electrode) of the first transistor T1 may be connected to the first electrode ELT1 of the light source unit LSU. A gate electrode of the first transistor T1 is connected to a first node N1. The first transistor T1 may control driving current to be supplied to the light source unit LSU in response to the voltage of the first node N1. For example, the first transistor T1 may be a driving transistor configured to control the driving current of the pixel PXL.

The second transistor T2 may be connected between the data line Dj and the first node N1. For example, a first electrode (e.g., a source electrode) of the second transistor T2 may be connected to the data line Dj, and a second electrode (e.g., a drain electrode) of the second transistor T2 may be connected to the first node N1. A gate electrode of the second transistor T2 is connected to the scan line Si. When a scan signal having a gate-on voltage (e.g., a low level voltage) is supplied from the scan line Si, the second transistor T2 may be turned on to electrically connect the first node N1 to the data line Dj.

During each frame period, a data signal DSj of a corresponding frame is supplied to the data line Dj, and the data signal DSj is transmitted to the first node N1 through the second transistor T2 that is turned on during a period in which the scan signal SSi having the gate-on voltage is supplied. For example, the second transistor T2 may be a switching transistor configured to transmit each data signal DSj to the pixel PXL.

One electrode of the storage capacitor Cst is connected to the first power source VDD, and the other electrode thereof is connected to the first node N1. The storage capacitor Cst may be charged with a voltage corresponding to a data signal DSj to be supplied to the first node N1 during each frame period.

Although the transistors (e.g., the first and second transistors T1 and T2) included in the pixel circuit PXC are illustrated in FIG. 6A as being P-type transistors, the present disclosure is not limited to this. For example, at least one of the first and second transistors T1 and T2 may be changed to an N-type transistor.

Figure 6B:
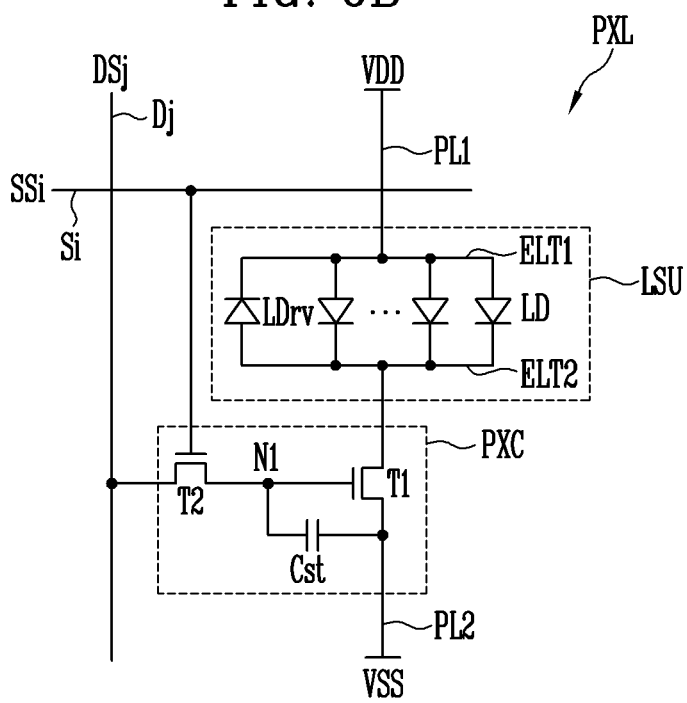

For example, as shown in FIG. 6B, each of the first and second transistors T1 and T2 may be an N-type transistor. In such an embodiment, the gate-on voltage of the scan signal SSi for writing the data signal DSj supplied to the data line Dj in each frame period to the pixel PXL may be a high level voltage (also referred to as "gate-high voltage"). Similarly, the voltage of the data signal DSj for turning on the first transistor T1 may be a voltage having a level opposite to that of the embodiment shown in FIG. 6A. For example, in the embodiment shown in FIG. 6B, a data signal DSj having an increasing voltage may be supplied to express an increasing gray scale value. In an embodiment, the first and second transistors T1 and T2 may be different conductive transistors (e.g., different type conductive transistors). For example, one of the first and second transistors T1 and T2 may be a P-type transistor, and the other one may be an N-type transistor.

In an embodiment, an interconnection position between the pixel circuit PXC and the light source unit LSU may be changed. For example, as illustrated in FIG. 6B, when both the first and second transistors T1 and T2 in the pixel circuit PXC are N-type transistors, the pixel circuit PXC may be connected between the light source unit LSU and the second power source VSS and the storage capacitor Cst may be connected between the first node N1 and the second power source VSS. However, the present disclosure is not limited thereto. For example, in an embodiment, even when the pixel circuit PXC is formed of N-type transistors, the pixel circuit PXC may be connected between the first power source VDD and the light source unit LSU.

The pixel PXL shown in FIG. 6B is substantially similar in configuration and operation to the pixel PXL shown in FIG. 6A, except that the connection positions of some circuit elements and the voltage levels of control signals (e.g., a scan signal SSi and a data signal DSj) are changed depending on a change in type of the first and second transistors T1 and T2. Therefore, a further detailed description of the pixel PXL shown in FIG. 6B will be omitted.

The structure of the pixel circuit PXC is not limited to the embodiments illustrated in FIGS. 6A and 6B. For example, the configuration of the pixel circuit PXC may be similar to that of embodiments illustrated in FIG. 6C or 6D. In other words, the pixel circuit PXC may be formed of a well-known pixel circuit, which may have various structures and/or may be operated by various driving schemes.

Figure 6C:
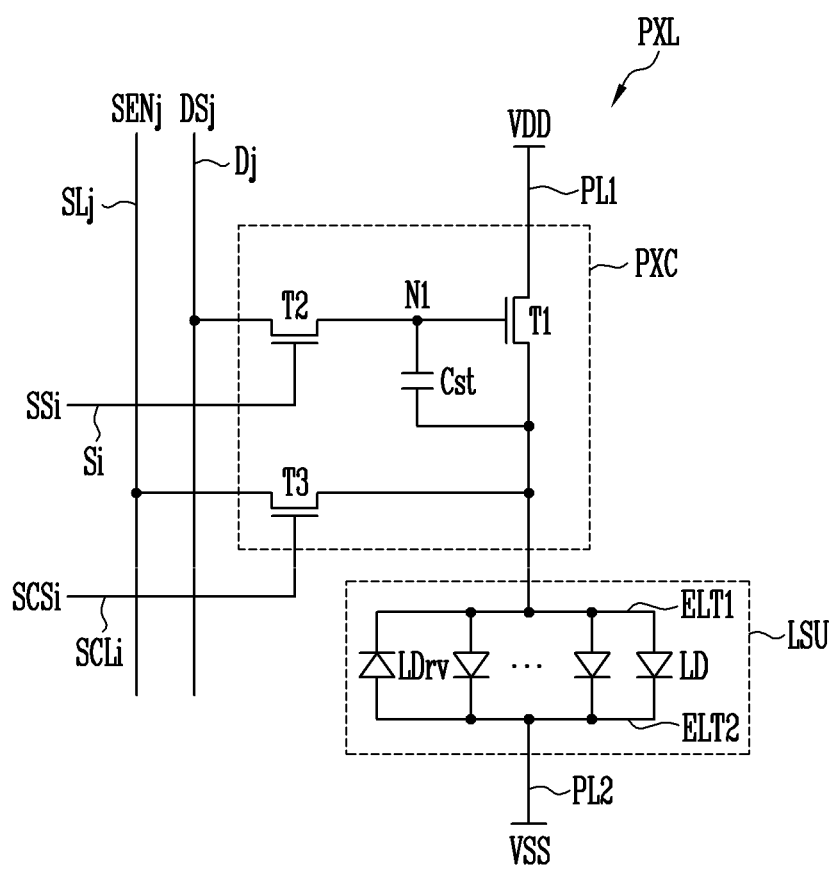

Referring to FIG. 6C, the pixel circuit PXC may be further connected to a sensing control line SCLi and a sensing line SLj. For example, the pixel circuit PXC of the pixel PXL disposed on the i-th horizontal line and the j-th vertical line of the display area DA may be connected to an i-th sensing control line SCLi and a j-th sensing line SLj in the display area DA. The pixel circuit PXC may further include a third transistor T3. In an embodiment, the sensing line SLj may be omitted, and characteristics of the pixel PXL may be detected by detecting a sensing signal SENj through the data line Dj.

The third transistor T3 is connected between the first transistor T1 and the sensing line SLj. For example, a first electrode of the third transistor T3 may be connected to a first electrode (e.g., a source electrode) of the first transistor T1 connected to the first electrode ELT1, and a second electrode of the third transistor T3 may be connected to the sensing line SLj. In an embodiment in which the sensing line SLj is omitted, the second electrode of the third transistor T3 may be connected to the data line Dj.

In an embodiment, a gate electrode of the third transistor T3 is connected to the sensing control line SCLi. In an embodiment in which the sensing control line SCLi is omitted, the gate electrode of the third transistor T3 may be connected to the scan line Si. The third transistor T3 may be turned on by a sensing control signal SCSi having a gate-on voltage (e.g., a high level voltage) supplied to the sensing control line SCLi during a sensing period (e.g., a predetermined sensing period) and, thus, electrically connect the sensing line SLj with the first transistor T1.

In an embodiment, the sensing period may be a period in which characteristics of each of the pixels PXL disposed in the display area DA (e.g., a threshold voltage, etc. of the first transistor T1) are extracted. During the sensing period, the first transistor T1 may be turned on by supplying a reference voltage (e.g., a predetermined reference voltage) capable of turning on the first transistor T1 to the first node N1 through the data line Dj and the second transistor T2, or connecting each pixel PXL to a current source or the like. Furthermore, the third transistor T3 may be turned on by supplying a sensing control signal SCSi having a gate-on voltage to the third transistor T3 so that the first transistor T1 is connected to the sensing line SLj. Thereafter, a sensing signal SENj may be obtained through the sensing line SLj, and characteristics of each pixel PXL including the threshold voltage, etc. of the first transistor T1 may be detected using the sensing signal SENj. Information about the characteristics of each pixel PXL may be used to convert image data such that a deviation in characteristic between pixels PXL disposed in the display area DA can be compensated for.

Although the embodiment shown in FIG. 6C has all of the first, second, and third transistors T1, T2, and T3 being N-type transistors, the present disclosure is not limited thereto. For example, at least one of the first, second, and third transistors T1, T2, and T3 may be changed to a P-type transistor. Furthermore, although the embodiment shown in FIG. 6C has the light source unit LSU being connected between the pixel circuit PXC and the second power source VSS, the present disclosure is not limited thereto. For example, in an embodiment, the light source unit LSU may be connected between the first power source VDD and the pixel circuit PXC.

Figure 6D:
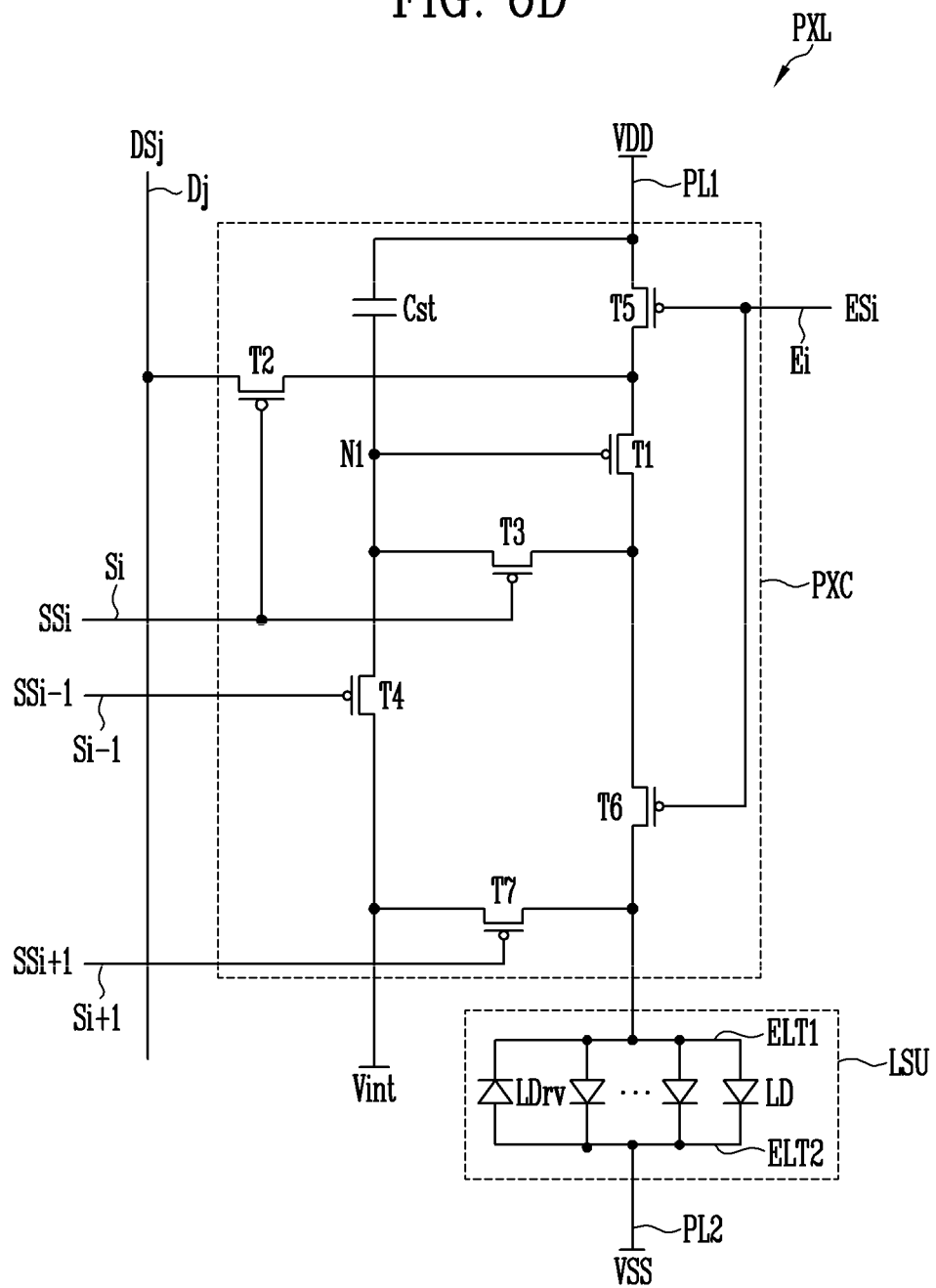

Referring to FIG. 6D, the pixel circuit PXC may be connected not only to a scan line Si of a corresponding horizontal line but also to at least one another scan line or a control line. For example, the pixel circuit PXC of the pixel PXL disposed on the i-th horizontal line of the display area DA may be further connected to an i−1-th scan line Si−1 and/or an i+1-th scan line Si+1. In an embodiment, the pixel circuit PXC may be connected not only to the first and second power sources VDD and VSS but also to other power sources. For instance, the pixel circuit PXC may also be connected to an initialization power source Vint. In an embodiment, the pixel circuit PXC may include first to seventh transistors T1 to T7 and a storage capacitor Cst.

The first transistor T1 may be connected between the first power source VDD and the light source unit LSU. For example, a first electrode (e.g., a source electrode) of the first transistor T1 may be connected to the first power source VDD through the fifth transistor T5 and the first power line PL1, and a second electrode (e.g., a drain electrode) of the first transistor T1 may be connected via the sixth transistor T6 to one electrode (e.g., the first electrode ELT1) of the light source unit LSU. A gate electrode of the first transistor T1 is connected to a first node N1. The first transistor T1 may control driving current to be supplied to the light source unit LSU in response to the voltage of the first node N1.

The second transistor T2 is connected between the data line Dj and the first electrode (e.g., the source electrode) of the first transistor T1. A gate electrode of the second transistor T2 is connected to the corresponding scan line Si. When a scan signal SSi having a gate-on voltage is supplied from the scan line Si, the second transistor T2 may be turned on to electrically connect the data line Dj to the first electrode of the first transistor T1. Hence, when the second transistor T2 is turned on, a data signal DSj supplied from the data line Dj may be transmitted to the first transistor T1.

The third transistor T3 may be connected between the second electrode (e.g., the drain electrode) of the first transistor T1 and the first node N1. A gate electrode of the third transistor T3 is connected to the corresponding scan line Si. When a scan signal SSi having a gate-on voltage is supplied from the scan line Si, the third transistor T3 may be turned on to connect the first transistor T1 in the form of a diode. Therefore, during a period in which the scan signal SSi having a gate-on voltage is supplied, the first transistor T1 may be turned on in the form of a diode so that the date signal DSj may be supplied from the data line Dj to the first node N1 successively via the second transistor T2, the first transistor T1, and the third transistor T3. Hence, a voltage corresponding to the data signal DSj and the threshold voltage of the first transistor T1 is charged to the storage capacitor Cst.

The fourth transistor T4 is connected between the first node N1 and the initialization power source Vint. A gate electrode of the fourth transistor T4 is connected to a preceding scan line (e.g., an i−1-th scan line Si−1). When a scan signal SSi−1 having a gate-on voltage is supplied to the i−1-th scan line Si−1, the fourth transistor T4 may be turned on so that the voltage of the initialization power source Vint may be transmitted to the first node N1.

In an embodiment, the voltage of the initialization power source Vint may be a minimum voltage of the data signal DSj or less. Before each pixel PXL is supplied with a data signal DSj of a corresponding frame, the first node N1 may be initialized to the voltage of the initialization power source Vint by a scan signal SSi−1 that has a gate-on voltage and is supplied to the i−1-th scan line Si−1. Hence, regardless of the voltage of the data signal DSj of a preceding frame, during a period in which a scan signal SSi having a gate-on voltage is supplied to the i-th scan line Si, the first transistor T1 is diode-connected in the forward direction so that the data signal DSj of the corresponding frame may be reliably transmitted to the first node N1.

The fifth transistor T5 is connected between the first power source VDD and the first transistor T1. A gate electrode of the fifth transistor T5 is connected to a corresponding emission control line, e.g., an i-th emission control line Ei. The fifth transistor T5 may be turned off when an emission control signal ESi having a gate-off voltage (e.g., a high level voltage) is supplied to the emission control line Ei and may be turned on in other cases.

The sixth transistor T6 is connected between the first transistor T1 and the light source unit LSU. A gate electrode of the sixth transistor T6 is connected to a corresponding emission control line (e.g., the i-th emission control line Ei). The sixth transistor T6 is turned off when an emission control signal ESi having a gate-off voltage is supplied to the emission control line Ei and is turned on in other cases.

The fifth and sixth transistors T5 and T6 may control an emission period of the pixel PXL. For example, when the fifth and sixth transistors T5 and T6 are turned on, a current path may be formed so that driving current can flow from the first power source VDD to the second power source VSS successively via the fifth transistor T5, the first transistor T1, the sixth transistor T6, and the light source unit LSU. When the fifth and sixth transistors T5 and T6 are turned off, the current path may be blocked so that emission of the pixel PXL can be prevented.

The seventh transistor T7 is connected between the first electrode (e.g., the first electrode ELT1) of the light source unit LSU and the initialization power source Vint. A gate electrode of the seventh transistor T7 is connected to a scan line (e.g., the i+1-th scan line Si+1) for selecting the pixels PXL of a subsequent horizontal line. When a scan signal SSi+1 having a gate-on voltage is supplied to the i+1-th scan line Si+1, the seventh transistor T7 is turned on so that the voltage of the initialization power source Vint may be supplied to the first electrode (e.g., the first pixel electrode ELT1) of the light source unit LSU. In such an embodiment, during each initialization period in which the voltage of the initialization power source Vint is transmitted to the light source unit LSU, the voltage of the first electrode of the light source unit LSU may be initialized.

The control signal for controlling the operation of the seventh transistor T7 may be changed in various suitable ways. For example, in an embodiment, the gate electrode of the seventh transistor T7 may be connected to a scan line of a corresponding horizontal line (e.g., an i-th scan line Si) or a scan line of a preceding horizontal line (e.g., an i−1-th scan line Si−1). In such an embodiment, when a scan signal SSi (or SSi−1) having a gate-on voltage is supplied to the i-th scan line Si or the i−1th scan line Si−1, the seventh transistor T7 may be turned on so that the voltage of the initialization power voltage Vint may be supplied to the first electrode of the light source unit LSU. Hence, during each frame period, the pixel PXL may emit light having a more uniform luminance in response to the data signal DSj The storage capacitor Cst is connected between the first power source VDD and the first node N1. The storage capacitor Cst may store, during each frame period, a voltage corresponding both to the data signal DSj applied to the first node N1 and to the threshold voltage of the first transistor T1.

Although all of the transistors included in the pixel circuit PXC shown in FIG. 6D (e.g., the first to seventh transistors T1 to T7) are illustrated as being P-type transistors, the present disclosure is not limited thereto. For example, at least one of the first to seventh transistors T1 to T7 may be changed to an N-type transistor.

Figure 6E:
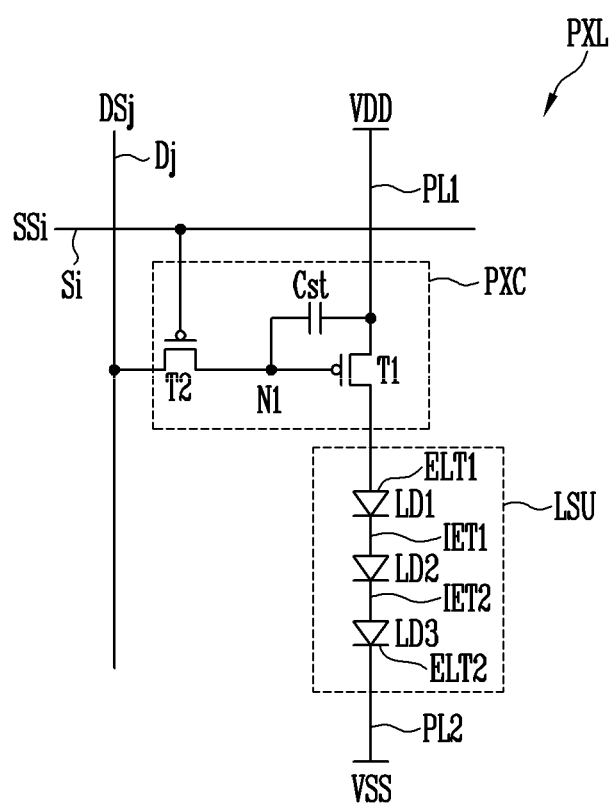
Figure 6F:
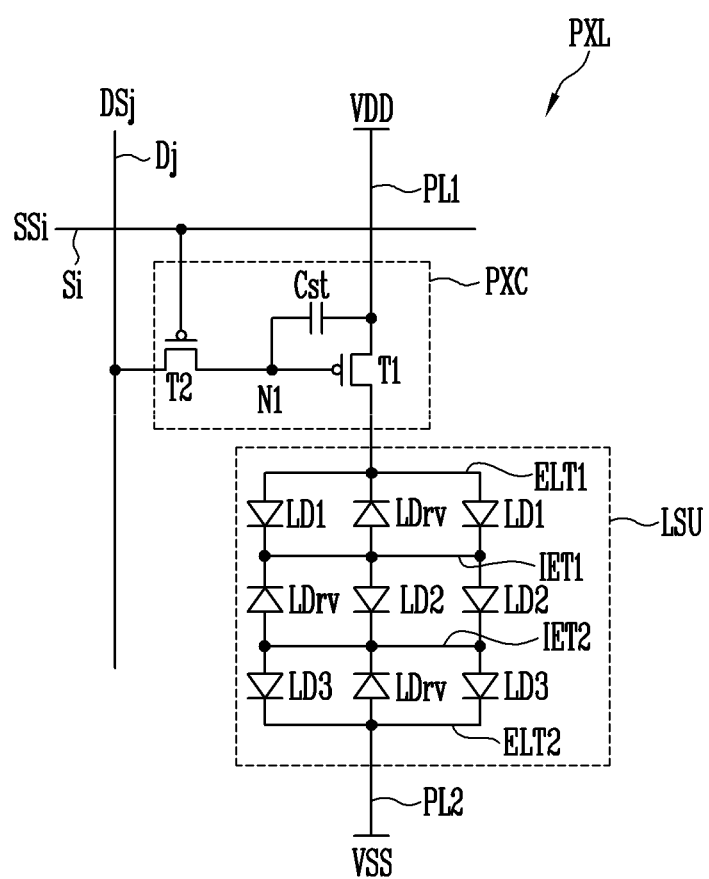
Figure 6G:
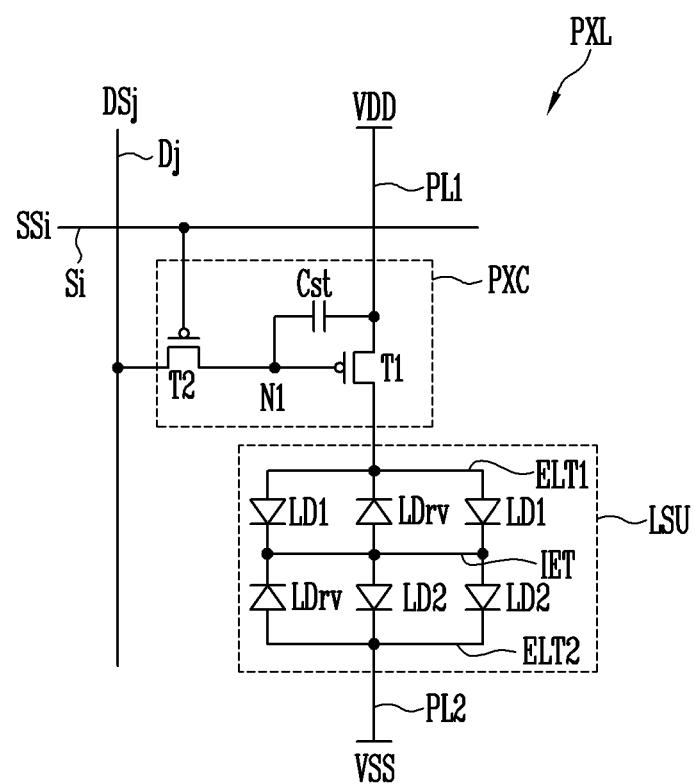

Although FIGS. 6A to 6D illustrate embodiments in which all valid light sources (e.g., light emitting elements LD properly connected between the electrodes ELT1 and ELT2) constituting each light source unit LSU are connected in parallel to each other, the present disclosure is not limited thereto. For example, in an embodiment of the present disclosure, as illustrated in FIGS. 6E to 6G, the light source unit LSU of each pixel PXL may be configured to include a two- (or more) stage serial structure. In the following descriptions of embodiments shown in FIGS. 6E to 6G, detailed explanations of components (e.g., the pixel circuit PXC) similar or equal to that of the embodiments shown in FIGS. 6A to 6D will be omitted.

Referring to FIG. 6E, the light source unit LSU may include at least two light emitting elements connected in series to each other. For example, the light source unit LSU may include a first light emitting element LD1, a second light emitting element LD2, and a third light emitting element LD3, which are connected in series in a forward direction between the first power source VDD and the second power source VSS and, thus, each form valid light source. Hereinafter, when a specific light emitting element from among the first, second, and third light emitting elements LD1, LD2, and LD3 is designated, the corresponding light emitting element will be referred to as "first light emitting element LD1", "second light emitting element LD2", or "third light emitting element LD3". The term "light emitting element LD" or "light emitting elements LD" will be used to arbitrarily designate at least one light emitting element from among the first, second, and third light emitting elements LD1, LD2, and LD3 or collectively designate the first, second, and third light emitting elements LD1, LD2, and LD3.

A first end (e.g., a P-type end) of the first light emitting element LD1 is connected to the first power source VDD via a first electrode (e.g., a first pixel electrode) ELT1 of the light source unit LSU, etc. A second end (e.g., an N-type end) of the first light emitting element LD1 is connected to a first end (e.g., a P-type end) of the second light emitting element LD2 through a first intermediate electrode IET1 (also referred to as "third pixel electrode").

The first end (e.g., the P-type end) of the second light emitting element LD2 is connected to the second end of the first light emitting element LD1. A second end (e.g., an N-type end) of the second light emitting element LD2 is connected to a first end (e.g., a P-type end) of the third light emitting element LD3 through a second intermediate electrode IET2 (also referred to as "fourth pixel electrode").

The first end (e.g., the P-type end) of the third light emitting element LD3 is connected to the second end of the second light emitting element LD2. A second end (e.g., an N-type end) of the third light emitting element LD3 is connected to the second power source VSS via a second electrode (e.g., a second pixel electrode) ELT2 of the light source unit LSU, etc. In this way, the first, second, and the third light emitting elements LD1, LD2, and LD3 may be successively connected in series between the first and second electrodes ELT1 and ELT2 of the light source unit LSU.

Although the embodiment illustrated in FIG. 6E shows the light emitting elements LD connected so as to have a three-stage serial structure, the present disclosure is not limited thereto. For example, in an embodiment of the present disclosure, two light emitting elements LD may be connected to have a two-stage serial structure, or four or more light emitting elements LD may be connected to have a four- or more-stage serial structure.

When it is assumed that the same luminance is expressed using light emitting elements LD having the same conditions (e.g., the same size and/or number) in a light source unit LSU having a structure in which light emitting elements LD are connected in series, the voltage to be applied between the first and second electrodes ELT1 and ELT2 may be increased, and the amount of driving current flowing to the light source unit LSU may be reduced compared to a light source unit LSU having a structure in which light emitting elements LD are connected in parallel. Therefore, in an embodiment in which the light source unit LSU of each pixel PXL is formed by using a serial structure, panel current flowing through the display panel PNL may be reduced.

In an embodiment, at least one serial stage may include a plurality of light emitting elements LD connected in parallel to each other. In such an embodiment, the light source unit LSU may be formed of a serial/parallel combination structure. For example, the light source unit LSU may be configured as illustrated in the embodiment of FIG. 6F or 6G.

Referring to FIG. 6F, at least one serial stage that forms the light source unit LSU may include a plurality of light emitting elements LD connected in parallel to each other in a forward direction. For example, the light source unit LSU may include at least one first light emitting element LD1 disposed on a first serial stage (also referred to as "first stage" or "first row"), at least one second light emitting element LD2 disposed on a second serial stage (also referred to as "second stage" or "second row") subsequent to the first serial stage, and at least one third light emitting element LD3 disposed on a third serial stage (also referred to as "third stage" or "third row") subsequent to the second serial stage. Furthermore, at least one of the first, second, and third serial stages may include a plurality of light emitting elements LD connected in the forward direction.

Although the embodiment in FIG. 6F has the light source unit LSU formed of light emitting elements LD disposed in three serial stages, the present disclosure is not limited thereto. For example, as illustrated in FIG. 6G, the light source unit LSU may include a plurality of light emitting elements LD disposed in only two serial stages (e.g., a first serial stage and a second serial stage). For example, the light source unit LSU may include at least one first light source element LD1 disposed in the first serial stage and including a first end (e.g., a P-type end) and a second end (e.g., an N-type end) that are respectively connected to a first electrode ELT1 and an intermediate electrode IET, and at least one second light emitting element LD2 disposed in the second serial stage and including a first end (e.g., a P-type end) and a second end (e.g., an N-type end) that are respectively connected to the intermediate electrode IET and a second electrode ELT2. Furthermore, at least one of the first and second serial stages may include a plurality of light emitting elements LD connected in the forward direction.

In addition, the number of serial stages that form the light source unit LSU may be changed in various ways. For example, the light source unit LSU may include a plurality of light emitting elements LD distributed in four or more serial stages. Furthermore, the number of light emitting elements LD connected in the forward direction in each serial stage may be changed in various ways.

In an embodiment, the number of light emitting elements LD included in the pixels PXL disposed in the display area (see, e.g., the display area DA of FIG. 5) may be equal or similar to each other. For example, in an operation of supplying the light emitting elements LD to each pixel PXL, the light emitting elements LD may be aligned in such a way that light emitting element ink (also referred to as "light emitting element solution") including the light emitting elements LD is controlled to be uniformly applied to an emission area of each pixel PXL, and a uniform electric field is controlled to be applied to each pixel PXL. Hence, the light emitting elements LD may be relatively uniformly supplied to and aligned in the pixels PXL.

In an embodiment, as illustrated in FIGS. 6F and 6G, each pixel PXL may further include at least one reverse light emitting element LDrv disposed in at least one serial stage. For example, at least one of a plurality of serial stages may further include at least one reverse light emitting element LDrv connected in a direction opposite to that of the light emitting elements LD.

Even when the reverse light emitting element LDrv is connected to at least one serial stage, the driving current of the pixel PXL may flow successively via the serial stages as long as at least one valid light source (e.g., the first, second, and/or third light emitting elements LD1, LD2, and LD3) connected in the forward direction to the serial stage is disposed. Hence, the light source unit LSU may emit light at a luminance corresponding to the driving current.

As described in the foregoing embodiments, each light source unit LSU may include a plurality of light emitting elements LD connected in the forward direction between the first and second power sources VDD and VSS and form respective valid light sources. Furthermore, the connection structure between the light emitting elements LD may be changed in various ways depending on embodiments. For example, the light emitting elements LD may be connected only in series or parallel to each other or may be connected in a series/parallel combination structure.

As described above, the pixel PXL may include a pixel circuit PXC and/or a light source unit LSU, which may have various structures. The structure of the pixel PXL which may be applied to the present disclosure is not limited to the embodiments illustrated in FIGS. 6A to 6G, and each pixel PXL may have various well-known structures. For instance, each pixel circuit PXC may be formed of a well-known pixel circuit, which may have various structures and/or be operated in various driving manners. In an embodiment of the present disclosure, each pixel PXL may be configured in a passive light emitting display device, or the like. In such an embodiment, the pixel circuit PXC may be omitted, and each of the first and second electrodes ELT1 and ELT2 of the light source unit LSU may be directly connected to the scan line Si, the data line Dj, the first power line PL1, the second power line PL2, or other signal lines or power lines, etc.

Figure 7A:
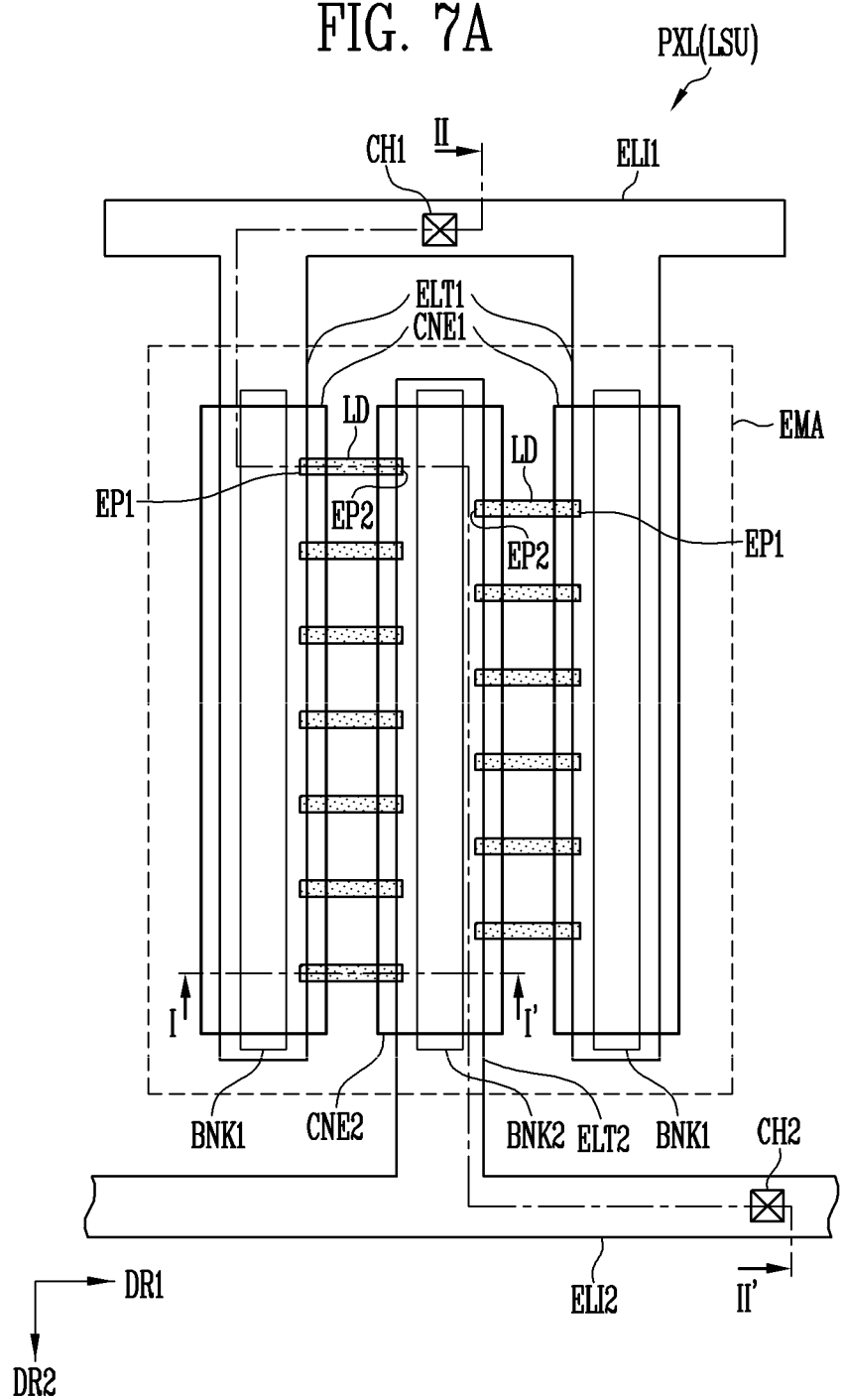
FIGS. 7A and 7B are plan views, each illustrating a pixel in accordance with an embodiment of the present disclosure.
Figure 7B:
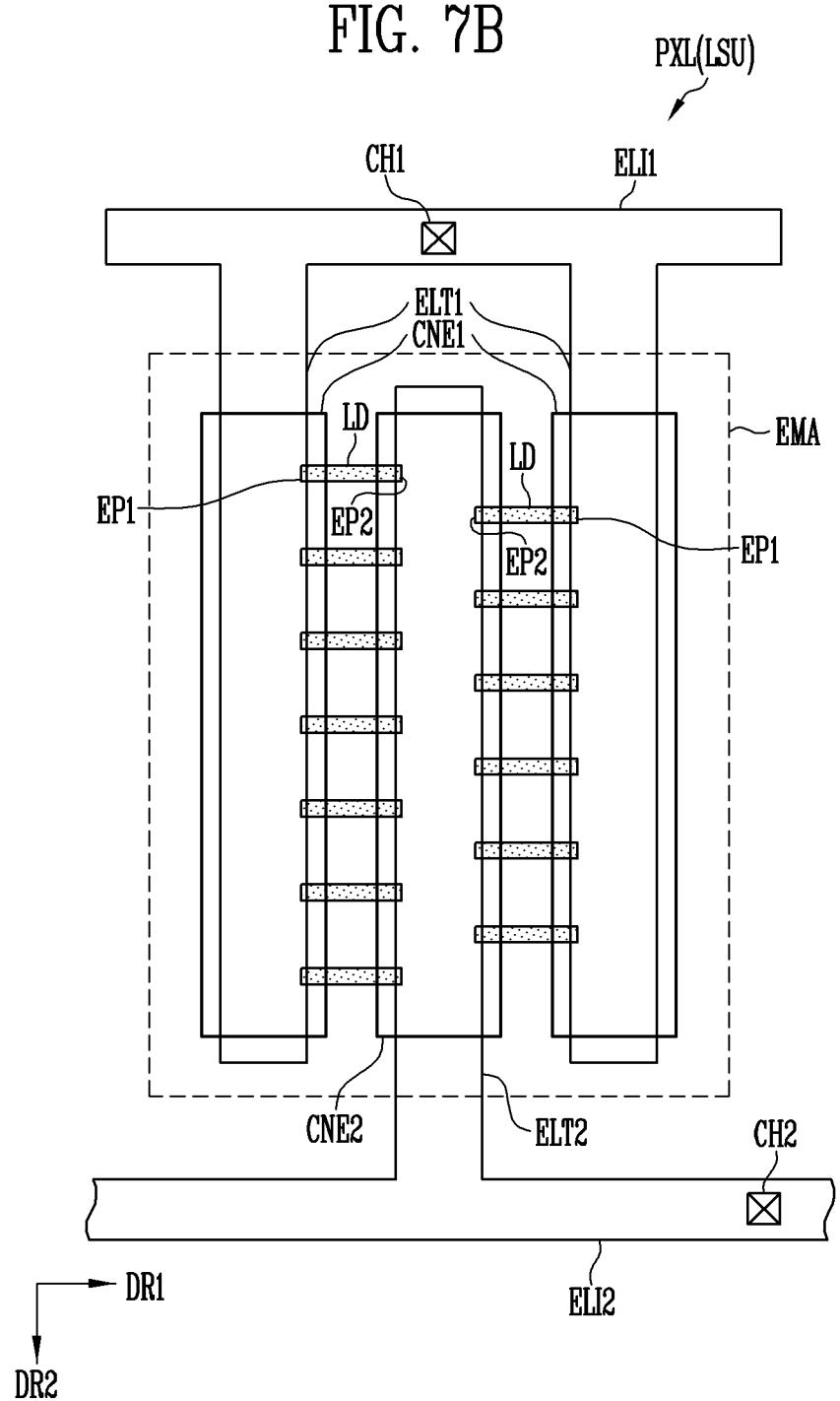

FIGS. 7A and 7B are plan views illustrating pixels PXL in accordance with respective embodiments of the present disclosure. For example, FIGS. 7A and 7B illustrate different embodiments of a pixel PXL, which may be disposed in the display area DA shown in FIG. 5. For example, FIG. 7A illustrates an embodiment of a pixel PXL including first and second bank patterns BNK1 and BNK2 disposed under first and second electrodes ELT1 and ELT2. FIG. 7B illustrates an embodiment of a pixel PXL which omits the first and second bank patterns BNK1 and BNK2.

The structure of each pixel PXL shown in FIGS. 7A and 7B will be described focusing on the light source unit LSU of the pixel PXL. In an embodiment, each pixel PXL may selectively further include circuit elements (e.g., a plurality of circuit elements that form each pixel circuit PXC) connected to the light source unit LSU.

Furthermore, FIGS. 7A and 7B illustrate embodiments in which each light source unit LSU is connected, through first and second contact holes (e.g., contact openings) CH1 and CH2, to a power line (e.g., first and/or second power lines PL1 and PL2), a circuit element (e. g., at least one circuit element that forms the pixel circuit PXC), and/or a signal line (e.g., a scan line Si and/or a data line Dj). However, the present disclosure is not limited thereto. For example, in an embodiment, at least one of the first and second electrodes ELT1 and ELT2 of each pixel PXL may be directly connected to a power line and/or signal line without using a contact hole (or contact opening) and/or an intermediate line.

Referring to FIGS. 5 to 7B, the pixel PXL in accordance with an embodiment of the present disclosure may include a first electrode ELT1 and a second electrode ELT2, which are disposed in each emission area EMA, and at least one light emitting element LD arranged between the first and second electrodes ELT1 and ELT2 (e.g., a plurality of light emitting elements LD connected in parallel between the first and second electrodes ELT1 and ELT2). Furthermore, the pixel PXL may further include a first electrode line ELI1 (also referred to as "first connection electrode" or "first alignment line") and a first contact hole CH1, which are provided to connect the first electrode ELT1 to the pixel circuit PXC and/or the first power line PL1, a second electrode line ELT2 (also referred to as "second connection electrode" or "second alignment line") and a second contact hole CH2, which are provided to connect the second electrode ELT2 to the second power line PL2, and a first contact electrode CNE1 (also referred to as "third electrode") and a second contact electrode CNE2 (also referred to as "fourth electrode"), which are provided to electrically connect the light emitting elements LD between the first and second electrodes ELT1 and ELT2.

In addition, the pixel PXL may selectively further include a first bank pattern BNK1 (also referred to as "first partition wall") and a second bank pattern BNK2 (also referred to as "second partition wall"), which respectively overlap the first electrode ELT1 and the second electrode ELT2. For example, as illustrated in the embodiment shown in FIG. 7A, the pixel PXL may include a first bank pattern BNK1, which is disposed under each first electrode ELT1 and overlaps one area of the first electrode ELT1, and a second bank pattern BNK2, which is disposed under the second electrode ELT2 and overlaps one area of the second electrode ELT2. In another embodiment, as illustrated in the embodiment shown in FIG. 7B, the pixel PXL may not include (or may omit) the first bank pattern BNK1 and the second bank pattern BNK2.

The first and second bank patterns BNK1 and BNK2, the first and second electrodes ELT1 and ELT2, the light emitting elements LD, and/or the first and second contact electrodes CNE1 and CNE2, etc. may form a light source unit LSU of the pixel PXL.

The first electrode ELT1 and the second electrode ELT2 may be disposed in each pixel area in which the pixel PXL is provided and/or formed. For example, the first electrode ELT1 and the second electrode ELT2 may be disposed in the emission area EMA of each pixel PXL.

In an embodiment, each pixel area may have (or may comprehensively mean) a pixel circuit area on which circuit elements for forming the corresponding pixel PXL are disposed and an emission area EMA on which the light source unit LSU of the pixel PXL is disposed. The emission area EMA may be an area in which light emitting elements LD (e.g., valid light sources completely connected between the first and second electrodes ELT1 and ELT2) that form the light source unit LSU of each pixel PXL are disposed. Furthermore, electrodes connected to the light emitting elements LD (e.g., the first and second electrodes ELT1 and ELT2 and/or the first and second contact electrodes CNE1 and CNE2) or partial areas of the electrodes may be disposed on the emission area EMA.

The emission area EMA may be enclosed by a light shielding and/or reflective bank structure (e. g., a pixel define (or defining) layer and/or a black matrix), which is formed between the pixels PXL to define each pixel area and the emission area EMA formed in the pixel area. For example, a bank structure which encloses (e.g., which extends around a periphery of) the emission area EMA may be disposed around the emission area EMA.

In an embodiment, the first and second electrodes ELT1 and ELT2 may be spaced apart from each other. For example, the first and second electrodes ELT1 and ELT2 may be disposed in parallel in each emission area EMA at positions spaced apart from each other by a distance (e.g., a predetermined distance) in a first direction DR1.

In an embodiment, each of the first and second electrodes ELT1 and ELT2 may have a bar shape extending in any one direction. For example, each of the first and second electrodes ELT1 and ELT2 may have a bar shape extending in the second direction DR2 crossing (e.g., intersecting and/or perpendicular to) the first direction DR1. However, the present disclosure is not limited to this. For example, the shapes, the orientations, and/or the relative disposition relationship of the first and second electrodes ELT1 and ELT2 may be changed in various ways.

Furthermore, one or more first and second electrodes ELT1 and ELT2 may be disposed in each emission area EMA, and the numbers of first and second electrodes ELT1 and ELT2 disposed in the emission area EMA are not particularly limited. For example, a plurality of first electrodes ELT1, which extend in the second direction DR2 and are parallel to each other, may be disposed in the emission area EMA. Facing each first electrode ELT1, at least one second electrode ELT2 may be disposed in the emission area EMA. For example, one second electrode ELT2 disposed between two first electrodes ELT1 or a plurality of second electrodes ELT2 that respectively correspond to the plurality of first electrodes ELT1 may be disposed in the emission area EMA.

In an embodiment, the first electrode ELT1 may be electrically connected to a circuit element (e.g., at least one transistor that forms the pixel circuit PXC), a power line (e.g., the first power line PL1), and/or a signal line (e.g., a scan line Si, a data line Dj, or a control line) through the first electrode line ELI1 and/or the first contact hole CH1. In an embodiment, the first electrode ELT1 may be electrically connected to a circuit element disposed therebelow through the first electrode line ELI1 and the first contact hole CH1 and may be electrically connected to a first line through the circuit element. The first line may be the first power line PL1 for supply of the first power source VDD, but the present disclosure is not limited thereto. For example, in an embodiment, the first line may be a signal line through which a first driving signal (e.g., a scan signal, a data signal, or a control signal) may be supplied.

In an embodiment, the first electrode ELT1 may be directly connected to a power line or signal line without passing through the first electrode line ELI1, the first contact hole CH1, and/or the circuit element. In such an embodiment, the first electrode ELT1 may be integrally or non-integrally connected to the power line or the signal line.

In an embodiment, the first electrode ELT1 and the first electrode line ELI1 may extend in different directions in each pixel area. For example, when the first electrode line ELI1 extends in the first direction DR1, the first electrode ELT1 may extend in the second direction DR2 that crosses the first direction DR1.

In an embodiment, the first electrode ELT1 and the first electrode line ELI1 may be integrally connected with (e.g., integrally formed with) each other. For instance, the first electrode ELT1 may diverge in at least one way from the first electrode line ELI1. In an embodiment in which the first electrode ELT1 and the first electrode line ELI1 are integrally connected with each other, the first electrode line ELI1 may be regarded as one area (or one portion) of the first electrode ELT1. However, the present disclosure is not limited thereto. For example, in an embodiment, the first electrode ELT1 and the first electrode line ELI1 may be formed separately from each other and connected to each other through at least one contact hole (e.g., contact opening), via hole (e.g., via opening), or the like.

In an embodiment, the second electrode ELT2 may be electrically connected to a circuit element (e.g., at least one transistor that forms the pixel circuit PXC), a power line (e.g., the second power line PL2), and/or a signal line (e.g., a scan line Si, a data line Dj, or a control line) through the second electrode line ELT2 and/or the second contact hole CH2. For example, the second electrode ELT2 may be electrically connected, through the second electrode line ELI2 and the second contact hole CH2, to a second line disposed thereunder. The second line may be the second power line PL2 for supply of the second power source VSS, but the present disclosure is not limited thereto. For example, in an embodiment, the second line may be a signal line through which a second driving signal (e.g., a scan signal, a data signal, or a control signal) may be supplied.

In an embodiment, the second electrode ELT2 may be directly connected to a power line or signal line without passing through the second electrode line ELI2 and/or the second contact hole CH2. In such an embodiment, the second electrode ELT2 may be integrally or non-integrally connected to the power line or the signal line.

In an embodiment, the second electrode ELT2 and the second electrode line ELI2 may extend in different directions. For example, when the second electrode line ELI2 extends in the first direction DR1, the second electrode ELT2 may extend in the second direction DR2 that crosses the first direction DR1.

In an embodiment, the second electrode ELT2 and the second electrode line ELI2 may be integrally connected with (e.g., integrally formed with) each other. For instance, the second electrode ELT2 may diverge in at least one way from the second electrode line ELI2. In an embodiment in which the second electrode ELT2 and the second electrode line ELI2 are integrally connected with each other, the second electrode line ELI2 may be regarded as one area (or portion) of the second electrode ELT2. However, the present disclosure is not limited thereto. For example, in an embodiment, the second electrode ELT2 and the second electrode line ELI2 may be formed separately from each other and connected to each other through at least one contact hole (e.g., contact opening), via hole (e.g., via opening), or the like.

During a process of forming the pixel PXL, such as before the alignment of the light emitting elements LD is completed, the first electrodes ELT1 of the pixels PXL disposed on the display area DA may be connected to each other and the second electrodes ELT2 of the pixels PXL may be connected to each other. The first and second electrodes ELT1 and ELT2 may be respectively supplied with a first alignment signal (or a first alignment voltage) and a second alignment signal (or a second alignment voltage) in an operation (or process) of aligning the light emitting elements LD. For example, any one of the first and second electrodes ELT1 and ELT2 may be supplied with an AC alignment signal, and the other one of the first and second electrodes ELT1 and ELT2 may be supplied with an alignment voltage (e.g., a ground voltage) having a constant voltage level.

For example, in the operation of aligning the light emitting elements LD, alignment signals (e.g., predetermined alignment signals) may be applied to the first and second electrodes ELT1 and ELT2 so that an electric field can be formed between the first and second electrodes ELT1 and ELT2. The light emitting elements LD supplied to each pixel area, including the emission area EMA of each pixel PXL, may be self-aligned between the first and second electrodes ELT1 and ELT2 by the electric field. After the alignment of the light emitting elements LD has been completed, the first electrodes ELT1 and/or the second electrodes ELT2 may be disconnected (e.g., severed or cut) between the pixel PXL so that the pixels PXL can be individually driven.

Each of the first and second electrodes ELT1 and ELT2 may have a single-layer or multi-layer structure. For example, each first electrode ELT1 may include at least one reflective electrode layer and may selectively further include at least one transparent electrode layer and/or a conductive capping layer. Similarly, each second electrode ELT2 may include at least one reflective electrode layer and may selectively further include at least one transparent electrode layer and/or a conductive capping layer.

The first and second bank patterns BNK1 and BNK2 may be selectively disposed under the first and second electrodes ELT1 and ELT2. For example, the first bank pattern BNK1 may be disposed under one area of the first electrode ELT1, and the second bank pattern BNK2 may be disposed under one area of the second electrode ELT2.

The first bank pattern BNK1 may be disposed under each first electrode ELT1 to overlap the first electrode ELT1. For example, the first bank pattern BNK1 may have a width less than that of each first electrode ELT1 and may be disposed under the first electrode ELT1. Hence, the first electrode ELT1 may protrude upwardly in an area in which the first bank pattern BNK1 is disposed. The first bank pattern BNK1 may form a reflective bank (also referred to as "reflective partition wall") along with the electrode ELT1. For example, each first electrode ELT1 and/or each first bank pattern BNK1 may be formed of material having reflexibility (e.g., may be formed of a reflective material) or at least one material layer having reflexibility may be formed on a sidewall of the first electrode ELT1 and/or the first bank pattern BNK1. Therefore, light emitted from the first ends EP1 of the light emitting elements LD that face the first electrode ELT1 may be controlled to more effectively travel in the frontal direction of the display device.

The second bank pattern BNK2 may be disposed under the second electrode ELT2 to overlap one area of the second electrode ELT2. For example, the second bank pattern BNK2 may have a width less than that of the second electrode ELT2 and may be disposed under the second electrode ELT2. Hence, the second electrode ELT2 may protrude upwardly in an area in which the second bank pattern BNK2 is disposed. The second bank pattern BNK2 along with the second electrode ELT2 may form a reflective bank pattern. For example, each second electrode ELT2 and/or each second bank pattern BNK2 may be formed of material having reflexibility (e.g., a reflective material) or at least one material layer having reflexibility may be formed on a sidewall of the second electrode ELT2 and/or the second bank pattern BNK2. Therefore, light emitted from the second ends EP2 of the light emitting elements LD that face the second electrode ELT2 may be controlled to more effectively travel in the frontal direction of the display device.

In an embodiment in which each pixel PXL includes a plurality of first electrodes ELT1 and/or second electrodes ELT2, the pixel PXL may include a plurality of first bank patterns BNK1 and/or second bank patterns BNK2 that overlap respective first electrodes ELT1 and/or respective second electrodes ELT2. For example, the respective first bank patterns BNK1 and/or the respective second bank pattern BNK2 may be provided in the form of individual patterns separated from each other.

In another embodiment, a plurality of bank patterns including at least one first bank pattern BNK1 and/or at least one second bank pattern BNK2 may be integrally connected to each other to form an integrated bank pattern. The integrated bank pattern may have an embossed surface which protrudes in a height-wise direction in one area corresponding to each first electrode ELT1 and/or each second electrode ELT2. Because one area of the first electrode ELT1 and/or the second electrode ELT2 protrudes upwardly, light emitted from the light emitting elements LD may be controlled to travel more reliably in the frontal direction of the display device.

As illustrated in the embodiment shown in FIG. 7B, the pixel PXL may not include the first and second bank patterns BNK1 and BNK2. In such an embodiment, the first and second electrodes ELT1 and ELT2 may have a substantially planar shape or may be formed to have an embossed surface. For example, the embossed surface may be formed by changing the thickness of each of the first and second electrodes ELT1 and ELT2 by areas, and one area of each of the first and second electrodes ELT1 and ELT2 may protrude upwardly. Hence, light emitted from the light emitting elements LD may be controlled to travel more reliably in the frontal direction of the display device.

The light emitting elements LD may be connected in parallel between the first electrode ELT1 and the second electrode ELT2. For example, each light emitting element LD may be disposed in the first direction DR1 (e.g., in a horizontal direction in FIGS. 7A and 7B) between the first electrode ELT1 and the second electrode ELT2 and may be electrically connected between the first and second electrodes ELT1 and ELT2.

Although FIGS. 7A and 7B illustrate that the light emitting elements LD are uniformly oriented in any one direction (e.g., in the first direction DR1), the present disclosure is not limited thereto. For example, at least one of the light emitting elements LD may be oriented in a diagonal direction between the first and second electrodes ELT1 and ELT2. Although not illustrated in FIGS. 7A and 7B, at least one light emitting element that is incompletely connected between the first and second electrodes ELT1 and ELT2 (i.e., an invalid light source) may be further disposed in each emission area EMA and/or a peripheral area thereof.

In an embodiment, each of the light emitting elements LD may be a light emitting element which is made of material having an inorganic crystal structure and has a subminiature size, for example, ranging from the nanoscale to the microscale. For example, each light emitting element LD may be a subminiature light emitting element having a size ranging from the nanoscale to the microscale as illustrated in FIGS. 1A to 4B. However, the type and/or size of the light emitting element LD may be changed in various ways depending on design conditions, etc. of each light emitting device (e.g., the pixel PXL) using the light emitting element LD as a light source.

In an embodiment, each light emitting element LD may have a first end EP1 disposed to face the adjacent first electrode ELT1 and a second end EP2 disposed to face the adjacent second electrode ELT2. In an embodiment, each of the light emitting elements LD may overlap the adjacent first electrode ELT1 and/or second electrode ELT2 or may not overlap the adjacent first electrode ELT1 and/or second electrode ELT2. For example, the first end EP1 of the light emitting element LD may or may not overlap the adjacent first electrode ELT1. Likewise, the second end EP2 of the light emitting element LD may or may not overlap the adjacent second electrode ELT2.

In an embodiment, the respective first ends EP1 of the light emitting elements LD may be connected to the first electrode ELT1. The respective second ends EP2 of the light emitting elements LD may be connected to the second electrode ELT2. For example, the respective first ends EP1 of the light emitting elements LD may be electrically connected to the first electrode ELT1 through the first contact electrode CNE1. The respective second ends EP2 of the light emitting elements LD may be electrically connected to the second electrode ELT2 through the second contact electrode CNE2. In an embodiment, at least one of the first and second ends EP1 and EP2 of each of the light emitting elements LD may directly contact the first and/or second electrodes ELT1 and/or ELT2 and may be electrically connected to the first and/or second electrodes ELT1 and/or ELT2. In such an embodiment, the first contact electrode CNE1 and/or the second contact electrode CNE2 may be selectively formed.

In an embodiment, the light emitting elements LD may be prepared in a diffused form in a solution (e.g., a predetermined solution), and then supplied to each pixel area (e.g., the emission area EMA of each pixel PXL) by various schemes, such as an inkjet scheme or a slit coating scheme. For example, the light emitting elements LD may be mixed with a volatile solvent and supplied to the emission area EMA of each pixel PXL. Here, when alignment voltages (e.g., predetermined alignment voltages or alignment signals) are applied to the first and second electrodes ELT1 and ELT2 of the pixels PXL, an electric field is formed between the first and second electrodes ELT1 and ELT2, and the light emitting elements LD may be aligned between the first and second electrodes ELT1 and ELT2. After the light emitting elements LD have been aligned, the solvent may be removed by a volatilization scheme or other schemes. In this way, the light emitting elements LD may be reliably disposed (e.g., arranged) between the first and second electrodes ELT1 and ELT2.

In an embodiment, the first contact electrode CNE1 and the second contact electrode CNE2 may be respectively formed on the opposite ends (e.g., the first and second ends EP1 and EP2) of the light emitting elements LD. Consequently, the light emitting elements LD may be more reliably connected between the first and second electrodes ELT1 and ELT2.

The first contact electrode CNE1 may be disposed on each first electrode ELT1 and the first end EP1 of at least one light emitting element LD adjacent thereto such that the first contact electrode CNE1 overlaps the first electrode ELT1 and the first end EP1 of the light emitting element LD. For example, the first contact electrode CNE1 may be disposed on each first electrode ELT1 and the first ends EP1 of a plurality of light emitting elements LD adjacent thereto such that the first contact electrode CNE1 overlaps the first electrode ELT1 and the first ends EP1 of the light emitting elements LD.

The first contact electrode CNE1 may electrically connect the first electrode ELT1 with the first ends EP1 of the light emitting elements LD. Furthermore, the first contact electrode CNE1 may stably fix the first ends EP1 of the light emitting elements LD in place. In an embodiment in which the first contact electrode CNE1 is omitted (e.g., is not formed), the first ends EP1 of the light emitting elements LD may be disposed to overlap the adjacent first electrode ELT1 and may be directly connected to the first electrode ELT1.

The second contact electrode CNE2 may be disposed on each second electrode ELT2 and the second end EP2 of at least one light emitting element LD adjacent thereto such that the second contact electrode CNE2 overlaps the second electrode ELT2 and the second end EP2 of the light emitting element LD. For example, the second contact electrode CNE2 may be disposed on each second electrode ELT2 and the second ends EP2 of a plurality of light emitting elements LD adjacent thereto such that the second contact electrode CNE2 overlaps the second electrode ELT2 and the second ends EP2 of the light emitting elements LD.

The second contact electrode CNE2 may electrically connect the second electrode ELT2 with the second ends EP2 of the light emitting elements LD. Furthermore, the second contact electrode CNE2 may stably fix the second ends EP1 of the light emitting elements LD in place. In an embodiment in which the second contact electrode CNE2 is omitted (e.g., is not formed), the second ends EP2 of the light emitting elements LD may be disposed to overlap the adjacent second electrode ELT2 and may be directly connected to the second electrode ELT2.

Each light emitting element LD connected in the forward direction between the first and second electrodes ELT1 and ELT2 may form a valid light source of the corresponding pixel PXL. Such valid light sources may be grouped to form the light source unit LSU of the corresponding pixel PXL.

For example, when a voltage of the first power source VDD (or a first control signal, such as a scan signal or a data signal) is applied to the first ends EP1 of the light emitting elements LD via the first power line PL1, the first electrode ELT1, and/or the first contact electrode CNE1, and a voltage of the second power source VSS (or a second control signal, such as a scan signal or a data signal) is applied to the second ends EP2 of the light emitting elements LD via the second power line PL2, the second electrode ELT2, and/or the second contact electrode CNE2, the light emitting elements LD connected in the forward direction between the first and second electrodes ELT1 and ELT2 may emit light. Hence, light is emitted from the pixel PXL.

Figure 8A:
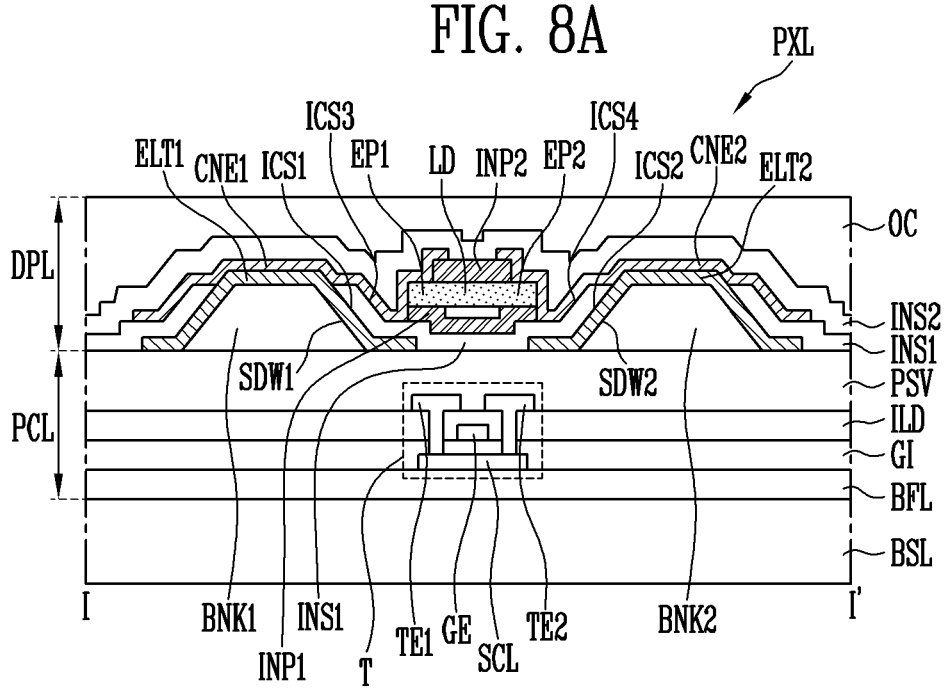
FIGS. 8A to 8D are sectional views, each illustrating a pixel in accordance with an embodiment of the present disclosure.
Figure 8B:
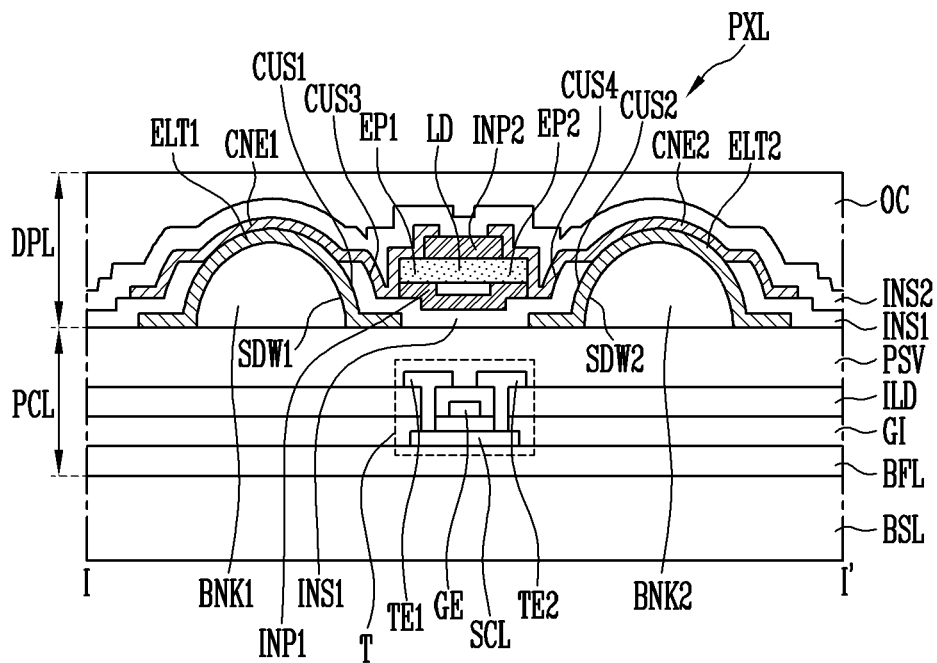
Figure 8C:
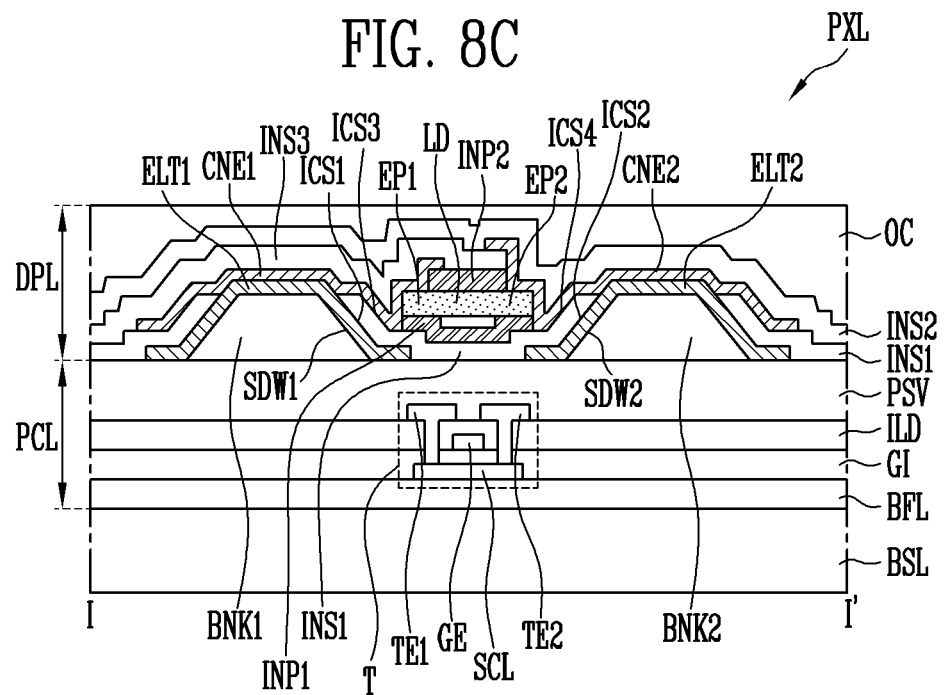
Figure 8D:
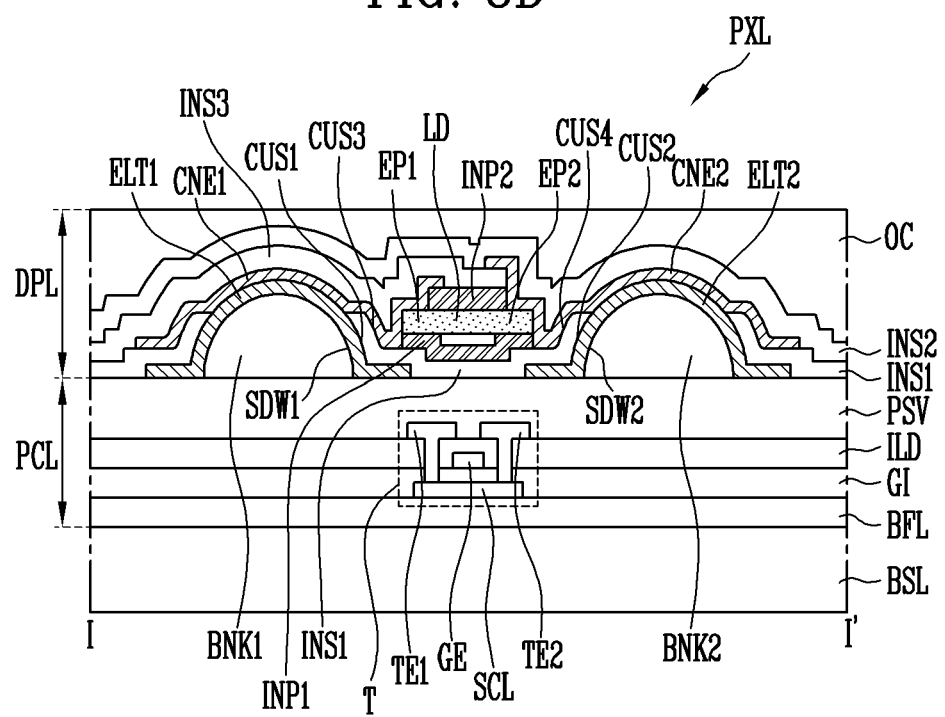
Figure 9:
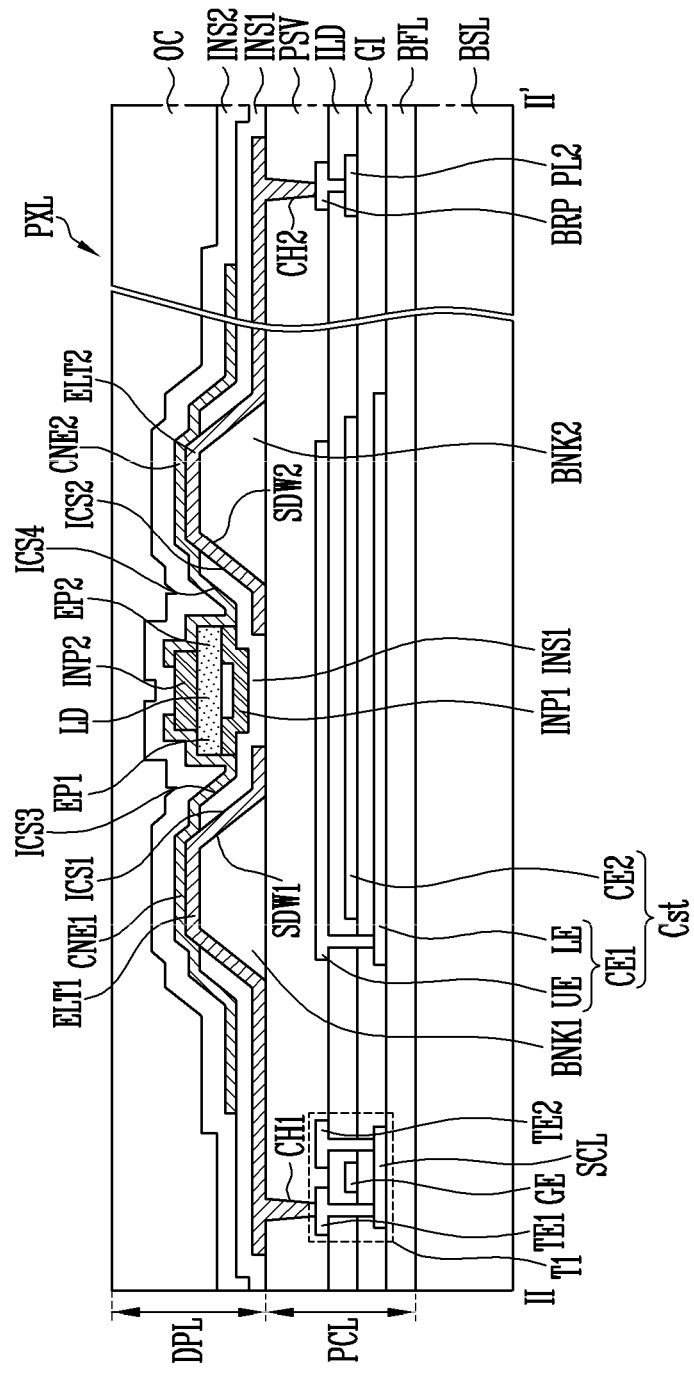
FIG. 9 is a sectional view illustrating a pixel in accordance with an embodiment of the present disclosure.

FIGS. 8A to 8D and 9 are sectional views, each illustrating a pixel PXL in accordance with an embodiment of the present disclosure. For example, FIGS. 8A to 8D illustrate different embodiments of a cross-section of the pixel PXL that is taken along the line I-I' of FIG. 7A. FIG. 9 illustrates an embodiment of a cross-section of the pixel PXL that is taken along the line II-II' of FIG. 7A. In an embodiment, the pixels PXL disposed in the display area (see, e.g., the display area DA of FIG. 5) may have substantially identical or similar cross-sectional structures.

To show various circuit elements that form the pixel circuit PXC, FIGS. 8A to 8D illustrate any one transistor T of the circuit elements, and FIG. 9 illustrates a storage capacitor Cst and a transistor (e.g., the first transistor T1 shown in FIGS. 6A and 6b) connected to the first electrode ELT1 from among the circuit elements. Hereinafter, when there is no need to separately designate the first transistor T1, the term "transistor T" may be used to refer to the first transistor T1.

In an embodiment, the transistors T that form each pixel circuit PXC may have a substantially identical or similar structure, but the present disclosure is not limited thereto. Furthermore, the structures and/or positions of the transistors T and the storage capacitor Cst may be changed in various ways depending on embodiments and are not limited to those of the embodiments shown in FIGS. 8A to 8D and 9.

Referring to FIGS. 5 to 9, the pixel PXL according to an embodiment of the present disclosure and the display device including the pixel PXL may include a circuit layer PCL and a display layer DPL, which are disposed to overlap each other on one surface of the base layer BSL. For example, the display area DA may include the circuit layer PCL disposed on the one surface of the base layer BSL and the display layer DPL disposed on the circuit layer PCL.

In an embodiment, circuit elements that form the pixel circuit PXC of each pixel PXL and various lines connected thereto may be disposed on the circuit layer PCL. Furthermore, forming the light source unit LSU of each pixel PXL, electrodes (e.g., the first and second electrodes ELT1 and ELT2), and light emitting elements LD connected thereto may be disposed on the display layer DPL.

The circuit layer PCL may include at least one circuit element electrically connected to the light emitting elements LD of each pixel PXL. For example, the circuit layer PCL may include a plurality of transistors T and a storage capacitor Cst, which are disposed in each pixel area and form the pixel circuit PXC of the corresponding pixel PXL. Furthermore, the circuit layer PCL may further include at least one power line and/or signal line, etc., which are connected to each pixel circuit PXC and/or the light source unit LSU. For example, the circuit layer PCL may include the first power line PL1, the second power line PL2, and the scan line Si and the data line Dj of each pixel PXL. In an embodiment in which the pixel circuit PXC is omitted and the light source unit LSU of each pixel PXL is directly connected to the first and second power lines PL1 and PL2 (or signal lines), the circuit layer PCL may be omitted.

The circuit layer PCL may include a plurality of insulating layers. For example, the circuit layer PCL may include a buffer layer BFL, a gate insulating layer GI, an interlayer insulating layer ILD, and/or a passivation layer PSV, which are successively stacked on one surface of the base layer BSL. The circuit layer PCL may selectively further include at least one light shielding pattern disposed under at least some transistors T.

The buffer layer BFL may prevent impurities from diffusing into each circuit element. The buffer layer BFL may be a single layer or may be formed of a plurality of (or multiple) layers (e.g., at least two or more layers). In an embodiment in which the buffer layer BFL is formed of multiple layers, the respective layers may be formed of the same material or different materials. Various circuit elements, such as the transistors T and the storage capacitor Cst, and various lines connected to the circuit elements may be disposed on the buffer layer BFL. In an embodiment, the buffer layer BFL may be omitted. In such an embodiment, at least one circuit element and/or line may be directly disposed on one surface of the base layer BSL.

Each transistor T may include a semiconductor layer SCL (also referred to as "semiconductor pattern" or "active layer"), a gate electrode GE, and first and second transistor electrodes TE1 and TE2. Although FIGS. 8A to 9 illustrate an embodiment in which each transistor T includes the first and second transistor electrodes TE1 and TE2 that are formed separately from the semiconductor layer SCL, the present disclosure is not limited thereto. For example, in an embodiment of the present disclosure, the first and/or second transistor electrode TE1 and/or TE2 provided in at least one transistor T may be integrated with (e.g., may be integral with) the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area, which contacts the first transistor electrode TE1, a second area, which contacts the second transistor electrode TE2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with an impurity (e.g., a predetermined impurity).

In an embodiment, the semiconductor layers SCL of the transistors T that form each pixel circuit PXC may be formed of substantially identical or similar material. For example, the semiconductor layers SCL of the transistors T may be formed of any one identical material from among polysilicon, amorphous silicon, and an oxide semiconductor. In an embodiment, some of the transistors M and the other transistors may include semiconductor layers SCL formed of different materials. For example, the semiconductor layers SCL of some of the transistors T may be formed of polysilicon or amorphous silicon, and the semiconductor layers SCL of the other transistors T may be formed of an oxide semiconductor.

The gate insulating layer GI may be disposed on the semiconductor layer SCL. For example, the gate insulating layer GI may be disposed between the semiconductor layer SCL and the gate electrode GE. The gate insulating layer GI may be a single layer or of a plurality of (or multiple) layers and may include at least one inorganic insulating material and/or organic insulating material. For example, the gate insulating layer GI may include various kinds of known organic/inorganic insulating materials, including silicon nitride ($SiN_x$), silicon oxide ($SiO_x$), etc. The constituent material of the gate insulating layer GI is not particularly limited.

The gate electrode GE may be disposed on the gate insulating layer GI. For example, the gate electrode GE may be disposed to overlap the semiconductor layer SCL with the gate insulating layer GI interposed therebetween. Although FIGS. 8A to 9 each illustrate a transistor T having a top-gate structure, the transistor T may have a bottom-gate structure in other embodiments. In such an embodiment, the gate electrode GE may be disposed under the semiconductor layer SCL to overlap with the semiconductor layer SCL.

The interlayer insulating layer ILD may be disposed on the gate electrode GE. For example, the interlayer insulating layer ILD may be disposed between the gate electrode GE and the first and second transistor electrodes TE1 and TE2. The interlayer insulating layer ILD may be a single layer or a plurality of (or multiple) layers and may include at least one inorganic insulating material and/or organic insulating material. For example, the interlayer insulating layer ILD may include various kinds of known organic/inorganic insulating materials. The constituent material of the interlayer insulating layer ILD is not particularly limited.

The first and second transistor electrodes TE1 and TE2 may be disposed on each semiconductor layer SCL with at least one interlayer insulating layer ILD interposed therebetween. For example, the first and second transistor electrodes TE1 and TE2 may be disposed on respective different ends of the semiconductor layer SCL with the gate insulating layer GI and the interlayer insulating layer ILD interposed therebetween. The first and second transistor electrodes TE1 and TE2 may be electrically connected to each semiconductor layer SCL. For example, the first and second transistor electrodes TE1 and TE2 may be connected to the first and second areas of the semiconductor layer SCL through corresponding contact holes (e.g., contact openings), which pass through the gate insulating layer GI and the interlayer insulating layer ILD. In an embodiment, any one of the first and second transistor electrodes TE1 and TE2 may be a source electrode, and the other may be a drain electrode.

At least one transistor T provided in the pixel circuit PXC may be connected to at least one pixel electrode. For example, the first transistor T1 shown in FIGS. 6A to 6C or the sixth and seventh transistors T6 and T7 shown in FIG. 6D may be electrically connected to the first electrode ELT1 and/or the first electrode line ELI1 of the corresponding pixel PXL through a contact hole (e.g., the first contact hole CH1) passing through the passivation layer PSV.

The storage capacitor Cst may include a first capacitor electrode CE1 and a second capacitor electrode CE2, which overlap each other. In an embodiment, each of the first and second capacitor electrodes CE1 and CE2 may be a single layer or a plurality of (or multiple) layers. Furthermore, at least one of the first and second capacitor electrodes CE1 and CE2 may be disposed on the same layer as that of at least one electrode of the first transistor T1 or the semiconductor layer SCL.

For example, the first capacitor electrode CE1 may be formed of a multilayer electrode including a lower electrode LE disposed on the same layer as that of the semiconductor layer SCL of the first transistor T1 and an upper electrode UE disposed on the same layer as that of the first and second transistor electrodes TE1 and TE2 of the first transistor T1 and electrically connected to the lower electrode LE. The second capacitor electrode CE2 may be a single layer electrode that is disposed on the same layer as that of the gate electrode of the first transistor T1 and is disposed between the lower electrode LE and the upper electrode UE of the first capacitor electrode CET1.

The present disclosure, however, is not limited thereto. The structure and/or position of each of the first and second capacitor electrodes CE1 and CE2 may be changed in various ways. For example, in an embodiment, any one of the first and second capacitor electrodes CE1 and CE2 may include at least one conductive pattern layer disposed on a layer different from that of the electrodes (e.g., the gate electrode GE and the first and second transistor electrodes TE1 and TE2) and the semiconductor layer SCL that form the first transistor T1.

In an embodiment, at least one signal line and/or power line that is connected to each pixel PXL may be disposed on the same layer as that of one electrode of each of the circuit elements that form the pixel circuit PXC. For example, the scan line Si of each pixel PXL may be disposed on the same layer as that of the gate electrodes GE. The data line Dj of each pixel PXL may be disposed on the same layer as that of the first and second transistor electrodes TE1 and TE2 of the transistors T. Furthermore, the first and/or second power lines PL1 and PL2 may be disposed on the same layer as that of the gate electrodes GE or the first and second transistor electrodes TE1 and TE2 of the transistors T. For example, the second power line PL2 for supplying the voltage of the second power source VSS may be disposed on the same layer as that of the gate electrodes GE of the transistors T1 and may be electrically connected to the second electrode line ELI2 and/or the second electrode ELT2 of the light source unit LSU disposed over the passivation layer PSV, both through a bridge pattern BRP disposed on the same layer as that of the first and second transistor electrodes TE1 and TE2 of the transistors T and through a second contact hole CH2 passing through the passivation layer PSV. However, the structures and/or positions of the second power line PL2, etc. may be changed in various ways.

In an embodiment, the circuit layer PCL may further include at least one conductive layer (e.g., any one conductive layer on which one electrode of the storage capacitor Cst is disposed and which is disposed on a layer different from the gate electrodes GE and the first and second transistor electrodes TE1 and TE2). In such an embodiment, at least one line connected to each pixel PXL may be disposed on the conductive layer.

A passivation layer PSV may be disposed over the lines and/or the circuit elements including the transistors T and the storage capacitor Cst. The passivation layer PSV may be a single layer or a plurality of (or multiple) layers and may include at least one inorganic insulating material and/or organic insulating material. For example, the passivation layer PSV may include at least one organic insulating layer and may substantially planarize the surface of the circuit layer PCL. The display layer DPL may be disposed over the passivation layer PSV.

The display layer DPL may include the light source unit LSU of each pixel PXL and may selectively include the first and/or second electrode lines ELI1 and/or ELI2 that are connected to the first and/or second electrodes ELT1 and ELT2 of the light source unit LSU. For example, the display layer DPL may include at least one pair of first and second electrodes ELT1 and ELT2, which are disposed in the emission area EMA of each pixel PXL and form each light source unit LSU, at least one light emitting element LD connected between the first electrode ELT1 and the second electrode ELT2, and a first electrode line ELI1 and a second electrode line ELI2, which are respectively connected to the first electrode ELT1 and the second electrode ELT2.

In an embodiment, each pixel PXL may include a plurality of light emitting elements LD connected in the forward direction between the first and second electrodes ELT1 and ELT2, as shown in, for example, FIGS. 6A to 7B. However, the number of light emitting elements LD provided in each pixel PXL is not limited thereto and may be changed in various ways. For the sake of explanation, in the description of the embodiments shown in FIGS. 8A to 9 and the other embodiments to be described below, each embodiment will be explained on the assumption that each pixel PXL includes a plurality of light emitting elements LD. It should be noted, however, that the light emitting elements LD provided in the pixel PXL in accordance with each embodiment may be changed to a single light emitting element LD.

Furthermore, the display layer DPL may selectively further include first and second bank patterns BNK1 and BNK2, which are configured to protrude partial areas of the first and second electrodes ELT1 and ELT2, respectively, upwardly, and/or first and second contact electrodes CNE1 and CNE2, which are configured to more reliably connect the light emitting elements LD between the first and second electrodes ELT1 and ELT2. In addition, the display layer DPL may further include, for example, at least one conductive layer and/or insulating layer.

For example, the display layer DPL may include the first and second bank patterns BNK1 and BNK2, the first and second electrodes ELT1 and ELT2, a first insulating layer INS1, a first insulating pattern INP1, the light emitting elements LD, a second insulating pattern INP2, the first and second contact electrodes CNE1 and CNE2, and a second insulating layer INS2, which are successively disposed and/or formed over the circuit layer PCL. Furthermore, the display layer DPL may further include an overcoat layer OC disposed over the second insulating layer INS2.

The first and second bank patterns BNK1 and BNK2 may be disposed at positions spaced apart from each other on one surface of the base layer BSL on which the circuit layer PCL is selectively formed. For example, the first and second bank patterns BNK1 and BNK2 may be disposed at positions spaced apart from each other on each pixel area (e.g., each emission area EMA) on the base layer BSL. The first and second bank patterns BNK1 and BNK2 may protrude in a height-wise direction of the base layer BSL from the one surface of the base layer BSL on which the circuit layer PCL is formed. In an embodiment, the first and second bank patterns BNK1 and BNK2 may have substantially the same height, but the present disclosure is not limited thereto.

In an embodiment, the first bank pattern BNK1 may be disposed between the base layer BSL and/or the circuit layer PCL and each first electrode ELT1. The first bank pattern BNK1 may be disposed adjacent to the first ends EP1 of the light emitting elements LD. For example, the first bank pattern BNK1 may include a first sidewall SDW1, which is positioned adjacent to the first ends EP1 of the light emitting elements LD and faces the first ends EP1.

In an embodiment, the second bank pattern BNK2 may be disposed between the base layer BSL and/or the circuit layer PCL and the second electrode ELT2. The second bank pattern BNK2 may be disposed adjacent to the second ends EP2 of the light emitting elements LD. For example, the second bank pattern BNK2 may include a second sidewall SDW2, which is positioned adjacent to the second ends EP2 of the light emitting elements LD and faces the second ends EP2.

In an embodiment, each of the first and second bank patterns BNK1 and BNK2 may have various shapes. In an embodiment, as illustrated in FIGS. 8A and 8C, the first and second bank patterns BNK1 and BNK2 may have a trapezoidal cross-section, the width of which is gradually reduced upwardly. In such an embodiment, the first and second sidewalls SDW1 and SDW2 of the first and second bank patterns BNK1 and BNK2 each may be formed of an inclined surface, which is inclined at an angle within a range (e.g., within a predetermined range) with respect to the base layer BSL. In an embodiment, as illustrated in FIGS. 8B and 8D, the first and second bank patterns BNK1 and BNK2 may have a semi-circular or semi-elliptical cross-section, the width of which is gradually reduced upwardly. In such an embodiment, the first and second sidewalls SDW1 and SDW2 of the first and second bank patterns BNK1 and BNK2 each may be formed of a curved surface.

The first and second electrodes ELT1 and ELT2 and/or the first insulating layer INS1, etc. disposed over the first and second bank patterns BNK1 and BNK2 may have shapes corresponding to the first and second bank patterns BNK1 and BNK2. For example, the first electrode ELT1 may have a first inclined surface ICS1 or a first curved surface CUS1, which is disposed on the first sidewall SDW1 of the first bank pattern BNK1 and has a shape corresponding to the shape of the first sidewall SDW1. The second electrode ELT2 may have a second inclined surface ICS2 or a second curved surface CUS2, which is disposed on the second sidewall SDW2 of the second bank pattern BNK2 and has a shape corresponding to the shape of the second sidewall SDW2. Similarly, the first insulating layer INS1 may include third and fourth inclined surfaces ICS3 and ICS4 or third and fourth curved surfaces CUS3 and CUS4, which cover the first and second sidewalls SDW1 and SDW2 of the first and second bank patterns BNK1 and BNK2 and have shapes corresponding to the shapes of the first and second sidewalls SDW1 and SDW2.

In the present disclosure, the shapes of the first and second bank patterns BNK1 and BNK2, and electrodes (e.g., the first and second electrodes ELT1 and ELT2) and/or an insulating layer (e.g., the first insulating layer INS1) that are formed over the first and second bank patterns BNK1 and BNK2, are not particularly limited and may be changed in various ways depending on embodiments. For example, in an embodiment, each of the first and second bank patterns BNK1 and BNK2 may have a stepped shape. In an embodiment, at least one of the first and second bank patterns BNK1 and BNK2 may be omitted or changed in position.

Each of the first and second bank patterns BNK1 and BNK2 may include insulating material having at least one inorganic material and/or organic material. For example, the first and second bank patterns BNK1 and BNK2 may include at least one inorganic layer including various known inorganic insulating materials, such as silicon nitride ($SiN_x$) or silicon oxide ($SiO_x$). In other embodiments, the first and second bank patterns BNK1 and BNK2 may include at least one organic layer and/or a photoresist layer containing various kinds of known organic insulating materials or may be a single- or multi-layer insulator containing organic/inorganic materials in combination. In an embodiment of the present disclosure, the constituent materials of the first and second bank patterns BNK1 and BNK2 may be changed in various ways.

In an embodiment, the first and second bank patterns BNK1 and BNK2 each may act as a reflector. For example, the first and second bank patterns BNK1 and BNK2, along with the first and second electrodes ETL1 and ETL2 provided thereon, may act as reflectors that guide light emitted from each light emitting element LD in a desired direction (e.g., a frontal direction of the display panel PNL), thus enhancing the light efficiency of the pixel PXL.

The first and second electrodes ELT1 and ELT2 that form the pixel electrodes of each pixel PXL may be disposed over the first and second bank patterns BNK1 and BNK2. In an embodiment, the first and second electrodes ELT1 and ELT2 may respectively have shapes corresponding to the first and second bank patterns BNK1 and BNK2. For example, the first and second electrodes ELT1 and ELT2 may respectively have first and second inclined surfaces ICS1 and ICS2 or first and second curved surfaces CUS1 and CUS2 that correspond to the first and second bank patterns BNK1 and BNK2 and may protrude in the height-wise direction of the base layer BSL. In an embodiment in which the first and second bank patterns BNK1 and BNK2 are omitted (or are not formed), each of the first and second electrodes ELT1 and ELT2 may be formed on the passivation layer PSV to have a substantially even (e.g., flat) surface or may have different thicknesses by areas so that one area thereof may protrude in the height-wise direction of the base layer BSL.

Each of the first and second electrodes ELT1 and ELT2 may include at least one conductive material. For example, each of the first and second electrodes ELT1 and ELT2 may include at least one conductive material from among various metal materials, including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxides, such as indium tin oxide (ITO), indium zinc oxide (IZO), zinc oxide (ZnO), antimony zinc oxide (AZO), indium tin zinc oxide (ITZO), zinc oxide (ZnO), tin oxide ($SnO_2$), and a conductive polymer, such as PEDOT, but the present disclosure is not limited thereto. For example, each of the first and second electrodes ELT1 and ELT2 may include other conductive materials, such as a carbon nano tube and a graphene. For example, each of the first and second electrodes ELT1 and ELT2 may include at least one of various conductive materials to have conductivity, and the constituent material thereof is not particularly limited. Furthermore, the first and second electrodes ELT1 and ELT2 may include the same conductive material. In other embodiments, the first and second electrodes ELT1 and ELT2 may include different conductive materials.

Each of the first and second electrodes ELT1 and ELT2 may be a single layer or a plurality of (or multiple) layers. For example, each of the first and second electrodes ELT1 and ELT2 may include a reflective electrode layer including reflective conductive material. Each of the first and second electrodes ETL1 and ETL2 may selectively further include at least one of a transparent electrode layer disposed over and/or under the reflective electrode layer and a conductive capping layer covering an upper portion of the reflective electrode layer and/or the transparent electrode layer.

In an embodiment, the reflective electrode layer may be formed of conductive material having a uniform reflectivity. For example, the reflective electrode layer may include at least one of various metal materials, including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof., but the present disclosure is not limited thereto. The reflective electrode layer included in each of the first and second electrodes ETL1 and ETL2 may be formed of various reflective conductive materials.

Each of the first and second electrodes ELT1 and ELT2 that includes the reflective electrode layer may enable light emitted from the opposite ends of each of the light emitting elements LD (e.g., the first and second ends EP1 and EP2) to more reliably travel in a direction (e.g., in the frontal direction of the display panel PNL) in which an image is displayed. For example, when the first and second electrodes ELT1 and ELT2 respectively have inclined surfaces or curved surfaces (e.g., the first and second inclined surfaces ICS1 and ICS2 or the first and second curved surfaces CUS1 and CUS2) corresponding to the first and second bank patterns BNK1 and BNK2 and are respectively disposed to face the first and second ends EP1 and EP2 of the light emitting elements LD, light emitted from the first and second ends EP1 and EP2 of each of the light emitting elements LD may be reflected by the first and second electrodes ELT1 and ELT2 and, thus, more reliably travel in the frontal direction of the display panel PNL (e.g., in an upward direction of the base layer BSL). Thereby, the efficiency of light emitted from (e.g., light emission efficiency of) the light emitting elements LD may be improved.

Furthermore, the transparent electrode layer may be formed of various transparent conductive materials. For example, the transparent electrode layer may include ITO, IZO, or ITZO, but the present disclosure is not limited thereto. In an embodiment, each of the first and second electrodes ELT1 and ELT2 may have a triple layer structure having a stacked structure of ITO/Ag/ITO. As such, when each of the first and second electrodes ETL1 and ETL2 is a multilayer structure of at least two or more layers, voltage drop due to signal delay (e.g., RC delay) may be reduced or minimized. Thus, a desired voltage can be effectively transmitted to the light emitting elements LD.

In addition, each of the first and second electrodes ELT1 and ELT2 may include a conductive capping layer, which covers the reflective electrode layer and/or the transparent electrode layer. In such an embodiment, the reflective electrode layer, etc. of the first and second electrodes ELT1 and ELT2 may not be damaged by a defect which may occur, for example, during a process of fabricating the pixel PXL. However, the conductive capping layer may be selectively included in each of the first and second electrodes ETL1 and ETL2 and may be omitted depending on embodiments. Furthermore, the conductive capping layer may be considered as a component of each of the first and second electrodes ETL1 and ETL2 or considered as a separate component disposed on the first and second electrodes ETL1 and ETL2.

The first insulating layer INS1 may be disposed on one area of each of the first and second electrode ELT1 and ELT2. For example, the first insulating layer INS1 may be formed to cover one area of each of the first and second electrodes ETL1 and ETL2 and may have an opening to expose another area of each of the first and second electrodes ETL1 and ETL2.

For example, the first insulating layer INS1 may be disposed on one area of each of the first and second electrodes ELT1 and ELT2 including the first and second inclined surfaces ICS1 and ICS2 or the first and second curved surfaces CUS1 and CUS2 and an area between the first and second electrodes ELT1 and ELT2 and may expose another area of each of the first and second electrodes ELT1 and ELT2 on one area of each of the first and second bank patterns BNK1 and BNK2. In an embodiment, the first insulating layer INS1 may be omitted. In such an embodiment, the light emitting elements LD may be directly disposed on the passivation layer PSV and/or one end of each of the first and second electrodes ELT1 and ELT2.

In an embodiment, the first insulating layer INS1 may be primarily formed to cover the overall surfaces of the first and second electrodes ELT1 and ELT2. After the light emitting elements LD are supplied to and aligned on the first insulating layer INS1, the first insulating layer INS1 may be partially open (e.g., partially removed) to expose one area of each of the first and second electrodes ELT1 and ELT2 in one area of an upper portion of each of the first and second bank patterns BNK1 and BNK2. For example, the first insulating layer INS1 may have an opening which exposes one area of each of the first and second electrodes ELT1 and ELT2 on respective upper surfaces of the first and second bank patterns BNK1 and BNK2 and at least partially covers the first and second inclined surfaces ICS1 and ICS2 or the first and second curved surfaces CUS1 and CUS2 of the first and second electrodes ELT1 and ELT2. In another embodiment, the first insulating layer INS1 may be patterned in the form of an individual pattern that is sectionally disposed only under the light emitting elements LD after the supply and alignment of the light emitting elements LD have been completed.

The first insulating layer INS1 may be formed to cover the first and second electrodes ELT1 and ELT2 after the first and second electrode ELT1 and ELT2 have been formed. Hence, the first and second electrodes ELT1 and ELT2 may not be damaged during a subsequent process.

In an embodiment, the first insulating layer INS1 may be a single layer or a plurality of (or multiple) layers and may include at least one inorganic insulating material and/or organic insulating material. For example, the first insulating layer INS1 may include various kinds of organic/inorganic insulating materials, including silicon nitride ($SiN_x$), silicon oxide ($SiO_x$), aluminum oxide ($Al_2O_3$), etc. The constituent material of the first insulating material INS1 is not particularly limited.

In an embodiment, in an embodiment in which the first insulating layer INS1 is formed of inorganic insulating material, the first insulating layer INS1 may have a shape corresponding to the shapes of the first and second electrodes ELT1 and ELT2. For example, the first insulating layer INS1 may include third and fourth inclined surfaces ICS3 and ICS4 or third and fourth curved surfaces CUS3 and CUS4, which are disposed on the first and second inclined surfaces ICS1 and ICS2 or the first and second curved surfaces CUS1 and CUS2 of the first and second electrodes ELT1 and ELT2.

The first insulating pattern INP1 may be disposed on the first insulating layer INS1 in the area between the first electrode ELT1 and the second electrode ELT2. For example, the first insulating pattern INP1 may be sectionally disposed on the first insulating layer INS1 in the area between the first electrode ELT1 and the second electrode ELT2 such that the first insulating pattern INP1 is interposed between the first insulating layer INS1 and the light emitting elements LD.

In an embodiment, the first insulating pattern INP1 may be a single layer or a plurality of (or multiple) layers and may include at least one inorganic insulating material and/or organic insulating material. For example, the first insulating pattern INP1 may include various kinds of organic/inorganic insulating materials, including silicon nitride ($SiN_x$), silicon oxide ($SiO_x$), aluminum oxide ($Al_2O_3$), a photoresist (PR) material, etc. The constituent material of the first insulating pattern INP1 is not particularly limited.

In an embodiment of the present disclosure, the first insulating pattern INP1 may be formed to have an etch selectivity different from that of the first insulating layer INS1. For example, the first insulating layer INS1 may have a first etch selectivity. The first insulating pattern INP1 may have a second etch selectivity different from the first etch selectivity.

For example, the first insulating pattern INP1 may include material different from that of the first insulating layer INS1 (e.g., material formed of different elements and/or having a different composition ratio) and, thus, may have an etch selectivity different from that of the first insulating layer INS1 with respect to an etching gas (e.g., a predetermined etching gas). For example, in an embodiment in which the first insulating layer INS1 includes a first insulating material, the first insulating pattern INP1 may have a second insulating material different from the first insulating material. In an embodiment, the first insulating layer INS1 may be formed of silicon nitride ($SiN_x$), and the first insulating pattern INP1 may be formed of silicon oxide ($SiO_x$). However, the present disclosure is not limited thereto, and constituent materials of the first insulating layer INS1 and the first insulating pattern INP1 may be changed in various ways depending on embodiments.

In an embodiment, the first insulating pattern INP1 may be formed in the form of a first insulating material layer that primarily covers the overall surface of the first insulating layer INS1. The first insulating material layer may be patterned after the light emitting elements LD are supplied and aligned thereon, thus forming the first insulating pattern INP1.

In an embodiment, a first insulating material layer for forming the first insulating pattern INP1 and a second insulating material layer for forming the second insulating pattern INP2 may be made of the same material so that when, in the operation of etching the second insulating material layer, the first insulating material layer is etched along therewith, the first and second insulating patterns INP1 and INP2 may be concurrently (or simultaneously) patterned. In such an embodiment, a mask for forming the second insulating pattern INP2 by etching the second insulating material layer, and the light emitting elements LD may act as a mask for forming the first insulating pattern INP1. Hence, the first insulating pattern INP1 may be sectionally disposed on the first insulating layer INS1 only under the light emitting elements LD and the second insulating pattern INP2. For example, the first insulating pattern INP1 may be disposed under the central area of the light emitting elements LD, may overlap the second insulating pattern INP2, and may be disposed under the first and second ends EP1 and EP2 of the light emitting elements LD that are exposed by the second insulating pattern INP2.

For example, the first insulating pattern INP1 may be sectionally disposed on the first insulating layer INS1 and particularly disposed under the light emitting elements LD. Hence, each light emitting element LD may be spaced apart from the first insulating layer INS1 with the first insulating pattern INP1 interposed therebetween.

In an embodiment, the first insulating material layer may be patterned to form the first insulating pattern INP1 after the alignment of the light emitting elements LD has been completed. For example, the light emitting elements LD may be supplied and aligned on the first insulating material layer after the first insulating layer INS1 has been covered with the first insulating material layer. In such an embodiment, each light emitting element LD may be spaced apart from the first insulating layer INS1 by a distance equal to or greater than a thickness of the first insulating pattern INP1 (or the first insulating material layer). Hence, the first and second ends EP1 and EP2 of each of the light emitting elements LD may not make close contact with (e.g., may not directly contact) the first insulating layer INS1.

As such, when the spacing distance equal to or greater than the thickness of the first insulating pattern INP1 is provided between the first insulating layer INS1 and the first and second ends EP1 and EP2 of each of the light emitting elements LD, disconnections (or open defects) of the first and second contact electrodes CNE1 and CNE2 on the first and second ends EP1 and EP2 may not occur. Hence, a connection failure (e.g., a contact failure) of the light emitting elements LD due to a disconnection of the first and/or second contact electrodes CNE1 and/or CNE2 may be prevented from occurring.

Each light emitting element LD may be disposed on the first insulating pattern INP1. For example, each pixel PXL may include a plurality of light emitting elements LD disposed on the first insulating pattern INP1.

In an embodiment, the light emitting elements LD may be supplied to each pixel area (e.g., the emission area EMA of each pixel PXL) in which the first insulating layer INS1 and the first insulating material layer are formed and may be aligned between the first and second electrodes ELT1 and ELT2. For example, a plurality of light emitting elements LD may be supplied to the emission area EMA of each pixel PXL through an inkjet scheme, a slit coating scheme, or other various schemes, and the light emitting elements LD may be aligned with directionality between the first and second electrodes ETL1 and ETL2 by an alignment signals (e.g., predetermined alignment signals or alignment voltages) respectively applied to the first and second electrodes ETL1 and ETL2.

In an embodiment, at least some of the light emitting elements LD may be disposed in the horizontal direction or a diagonal direction between a pair of first and second electrodes ELT1 and ELT2 adjacent thereto such that the opposite ends (e.g., the first and second ends EP1 and EP2) of each light emitting element LD with respect to the longitudinal direction thereof overlap the pair of first and second electrodes ELT1 and ELT2. In an embodiment, at least some of the light emitting elements LD may be disposed between a pair of first and second electrodes ELT1 and ELT2 adjacent thereto such that the at least some light emitting elements LD do not overlap with (e.g., are offset from) the first and/or second electrode ELT1 and/or ELT2 and may be electrically connected to the pair of first and second electrodes ELT1 and ELT2, respectively, through the first and second contact electrodes CNE1 and CNE2. For example, in an embodiment, the light emitting elements LD may overlap or may not overlap the first and second electrode ELT1 and ELT2 and may be electrically connected between the first and second electrodes ELT1 and ELT2 by the first and second contact electrodes CNE1 and CNE2.

The second insulating pattern INP2 may be disposed on one area of each of the light emitting elements LD. For example, the second insulating pattern INP2 may be disposed on one area of each of the light emitting elements LD such that the first and second ends EP1 and EP2 of each of the light emitting elements LD are exposed. For example, the second insulating pattern INP2 may be partially disposed over only one area, such as a central area, of each of the light emitting elements LD.

Although the second insulating pattern INP2 is formed in an independent pattern in the emission area EMA of each pixel PXL, the present disclosure is not limited thereto. The second insulating pattern INP2 may be omitted depending on embodiments. In such an embodiment, one end of each of the first and second contact electrodes CNE1 and CNE2 may be directly disposed on upper surfaces of the light emitting elements LD.

In an embodiment, the second insulating pattern INP2 may be a single layer or a plurality of (or multiple) layers and may include at least one inorganic insulating material and/or organic insulating material. For example, the second insulating pattern INP2 may include various kinds of organic/inorganic insulating materials, including silicon nitride ($SiN_x$), silicon oxide ($SiO_x$), aluminum oxide ($Al_2O_3$), a photoresist (PR) material, etc. The constituent material of the second insulating pattern INP2 is not particularly limited.

After the alignment of the light emitting elements LD has been completed, the second insulating pattern INP2 is formed on the light emitting elements LD so that the light emitting elements LD may not be removed (or moved) from the aligned positions. In an embodiment in which space is present between the first insulating pattern INP1 (or the first insulating material layer for forming the first insulating pattern INP1) and the light emitting elements LD, the space may be filled with insulating material deposited during a process of forming the second insulating pattern INP2. Consequently, the light emitting elements LD may be more stably supported. In some embodiments, the space may not be completely filled. For example, the second insulating pattern INP2 may be formed only over the light emitting elements LD or may be formed both over and under the light emitting elements LD.

In an embodiment of the present disclosure, the second insulating pattern INP2 may be formed to have the same etch selectivity as that of the first insulating layer INS1. For example, the second insulating pattern INP2 may have the second etch selectivity in the same manner as that of the first insulating pattern INP1.

For example, the second insulating pattern INP2 may include the second insulating material in the same manner as that of the first insulating pattern INP1 and, thus, have the same etch selectivity as that of the first insulating pattern INP1 with respect to an etching gas (e.g., a predetermined etching gas) or the like. For example, in an embodiment in which the first insulating layer INS1 and the first insulating pattern INP1 are respectively formed of silicon nitride ($SiN_x$) and silicon oxide ($SiO_x$), the second insulating pattern INP2 may be formed of silicon oxide ($SiO_x$). In an embodiment, the second insulating pattern INP2 may be formed using material and/or a fabrication method different from that of the first insulating pattern INP1 and may be formed to have the same etch selectivity as that of the first insulating pattern INP1 with respect to the same etching gas.

In an embodiment in which the first and second insulating patterns INP1 and INP2 have the same etch selectivity, the first and second insulating patterns INP1 and INP2 may be formed by concurrently (or simultaneously) etching the first and second insulating material layers. Therefore, the process of fabricating the pixels PXL may be facilitated.

The opposite ends of the light emitting elements LD (e.g., the first and second ends EP1 and EP2), which are not covered with the second insulating pattern INP2, may be respectively covered with the first and second contact electrodes CNE1 and CNE2. The first and second contact electrodes CNE2 and CNE2 may be spaced apart from each other. For example, the first and second contact electrodes CNE1 and CNE2 that are adjacent to each other may be disposed, at positions spaced apart from each other, on the first and second ends EP1 and EP2 of at least one adjacent light emitting element LD, with the second insulating pattern INP2 interposed therebetween.

In an embodiment, the first and second contact electrodes CNE1 and CNE2 may be concurrently (or simultaneously) formed on the same layer on one surface of the base layer BSL, as illustrated in FIGS. 8A and 8B. Hence, a process of fabricating the pixel PXL and the display device including the pixel PXL may be simplified.

The positions and the relative disposition relationships of the first and second contact electrodes CNE1 and CNE2 may be changed in various ways. For example, in an embodiment, the first and second contact electrodes CNE1 and CNE2 may be successively formed on different layers on one surface of the base layer BSL, as illustrated in FIGS. 8C and 8D. Furthermore, a third insulating layer INS3 may be further disposed between the first contact electrode CNE1 and the second contact electrode CNE2. In an embodiment, the third insulating layer INS3 may be disposed on the first contact electrode CNE1 to completely cover the first contact electrode CNE1 or may be sectionally disposed on one area of the first contact electrode CNE1 such that the third insulating layer INS3 is interposed only between the first and second contact electrodes CNE1 and CNE2.

Furthermore, the first and second contact electrodes CNE1 and CNE2 may be disposed over the first and second electrodes ELT1 and ELT2 to cover respective exposed areas of the first and second electrodes ELT1 and ELT2. For example, the first and second contact electrodes CNE1 and CNE2 may be respectively disposed on at least some areas of the first and second electrodes ELT1 and ELT2 to respectively contact the first and second electrodes ELT1 and ELT2.

For example, the first contact electrode CNE1 may be disposed on the first ends EP1 of the light emitting elements LD and may extend to an upper portion of the first electrode ELT1 adjacent thereto via an upper portion of the first sidewall SDW1 of the first bank pattern BNK1 (e.g., a surface of the third inclined surface ICS3 or the third curved surface CUS3 of the first insulating layer INS1). Similarly, the second contact electrode CNE2 may be disposed on the second ends EP2 of the light emitting elements LD and may extend to an upper portion of the second electrode ELT2 adjacent thereto via an upper portion of the second sidewall SDW2 of the second bank pattern BNK2 (e.g., a surface of the fourth inclined surface ICS4 or the fourth curved surface CUS4 of the first insulating layer INS1).

Hence, the first and second contact electrodes CNE1 and CNE2 may be respectively electrically connected to the first and second electrodes ELT1 and ELT2. Each of the first and second electrodes ELT1 and ELT2 may be electrically connected to the first or second end EP1 or EP2 of at least one light emitting element LD adjacent thereto through a corresponding one of the first and second contact electrodes CNE1 and CNE2.

In an embodiment, the first and second contact electrodes CNE1 and CNE2 may be formed of various transparent conductive materials. For example, the first and second contact electrodes CNE1 and CNE2 may include at least one of various transparent conductive materials, including ITO, IZO, and ITZO, and may be substantially transparent or translucent. Hence, light emitted from the light emitting elements LD through the first and second ends EP1 and EP2 thereof may be emitted out of the display panel PNL through the first and second contact electrodes CNE1 and CNE2.

The second insulating layer INS2 may be disposed on the first and second contact electrodes CNE1 and CNE2. For example, the second insulating layer INS2 may be formed and/or disposed on the overall surface of the display area DA to cover the first and second bank patterns BNK1 and BNK2, the first and second electrodes ELT1 and ELT2, the first insulating layer INS1, the first insulating pattern INP1, the light emitting elements LD, the second insulating pattern INP2, and the first and second contact electrodes CNE1 and CNE2 that are formed in each emission area EMA. The second insulating layer INS2 may include at least one inorganic layer and/or organic layer.

In an embodiment, the second insulating layer INS2 may include a thin-film encapsulation layer having a multilayer structure. For example, the second insulating layer INS2 may be formed of a thin-film encapsulation layer having a multilayer structure including at least two inorganic insulating layers and at least one organic insulating layer interposed between the at least two inorganic insulating layers. The constituent material and/or structure of the second insulating layer INS2 may be changed in various ways. In some embodiments, at least one overcoat layer OC, and/or an encapsulation substrate, etc. may be further disposed over the second insulating layer INS2.

In an embodiment, the second insulating layer INS2 and the overcoat layer OC each may be a single layer or a plurality of (or multiple) layers and may include at least one inorganic insulating material and/or organic insulating material. For example, the second insulating layer INS2 and the overcoat layer OC each may include various kinds of well-known organic/inorganic insulating materials.

According to the above-mentioned embodiment, a spacing distance may be provided between the first insulating layer INS1 and the first and second ends EP1 and EP2 of each of the light emitting elements LD by forming the first insulating pattern INP1 (or the first insulating material layer for forming the first insulating pattern INP1). Hence, disconnections of the first and second contact electrodes CNE1 and CNE2 may not occur so that each light emitting element LD can be reliably connected between the first electrode ELT1 and the second electrode ELT2 of each pixel PXL.

Therefore, according to the above-described embodiments, a utilization rate of the light emitting elements LD supplied to each pixel area (e.g., a use rate as each valid light source) may be increased, and emission characteristics of the pixel PXL may be stabilized. For example, a rate at which the light emitting elements LD supplied to each pixel area are electrically connected between the first and second electrodes ELT1 and ELT2 may be increased. Consequently, efficiency of material used to form the pixels PXL (e.g., the utilization rate of the light emitting elements LD) may be increased so that the cost of fabricating the display device may be reduced, and the light source unit LSU of each pixel PXL may be reliably formed.

Figure 10:
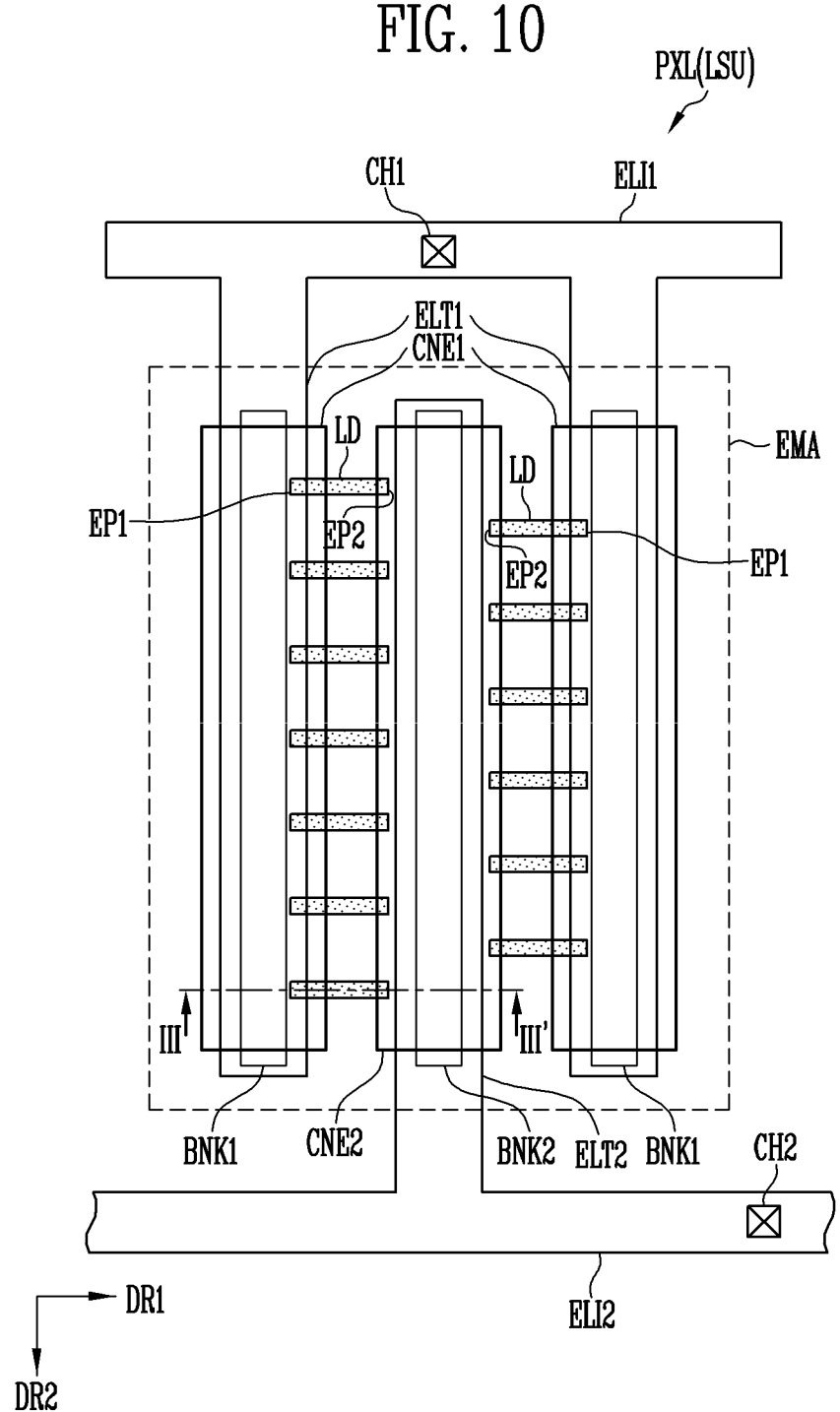
FIG. 10 is a plan view illustrating a pixel in accordance with an embodiment of the present disclosure.
Figure 11A:
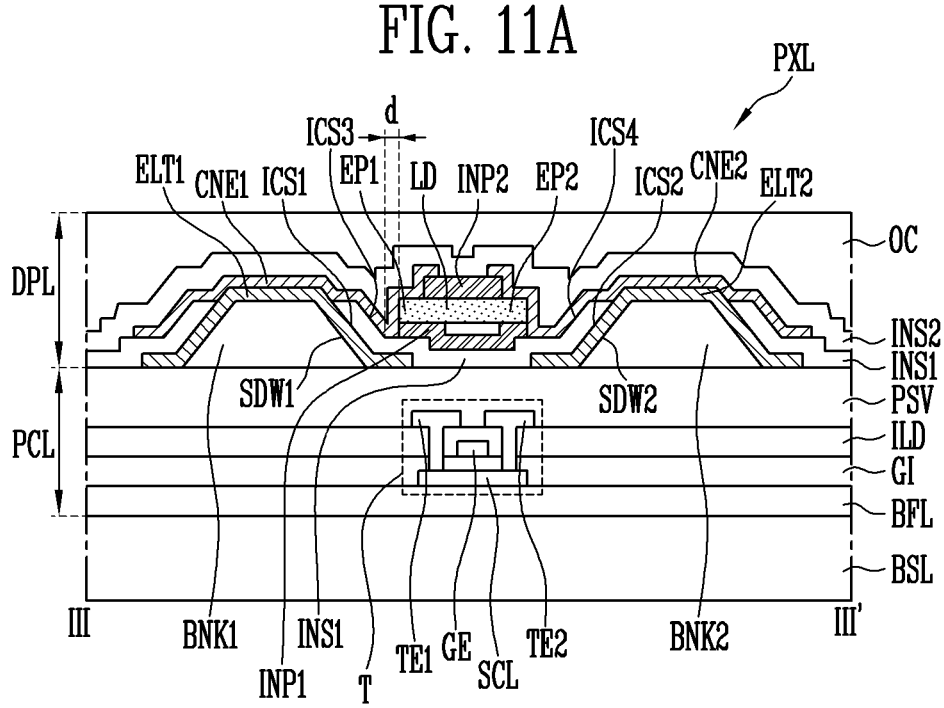
FIGS. 11A to 11D are sectional views, each illustrating a pixel in accordance with an embodiment of the present disclosure.
Figure 11B:
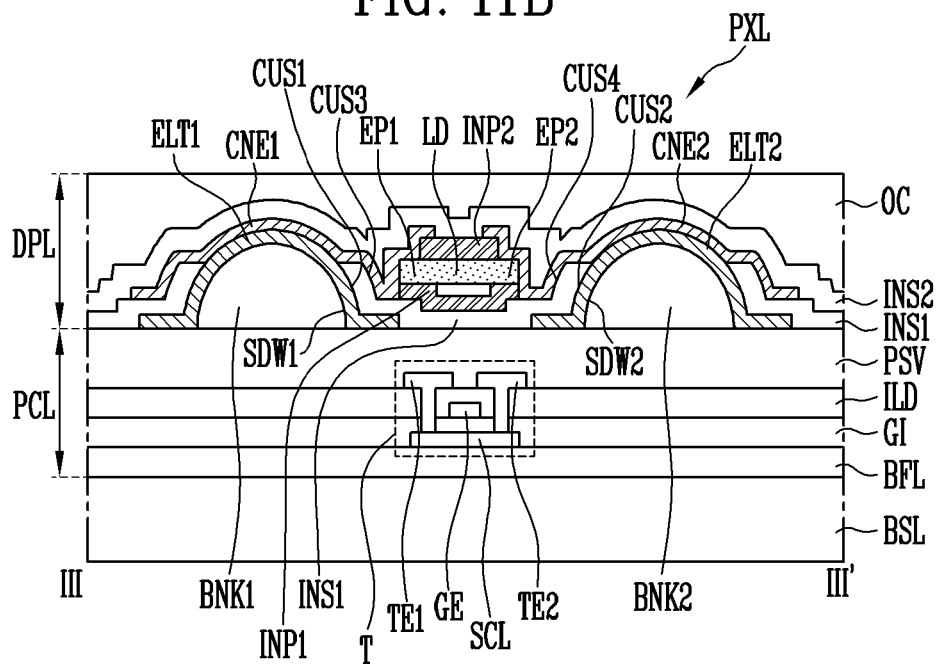
Figure 11C:
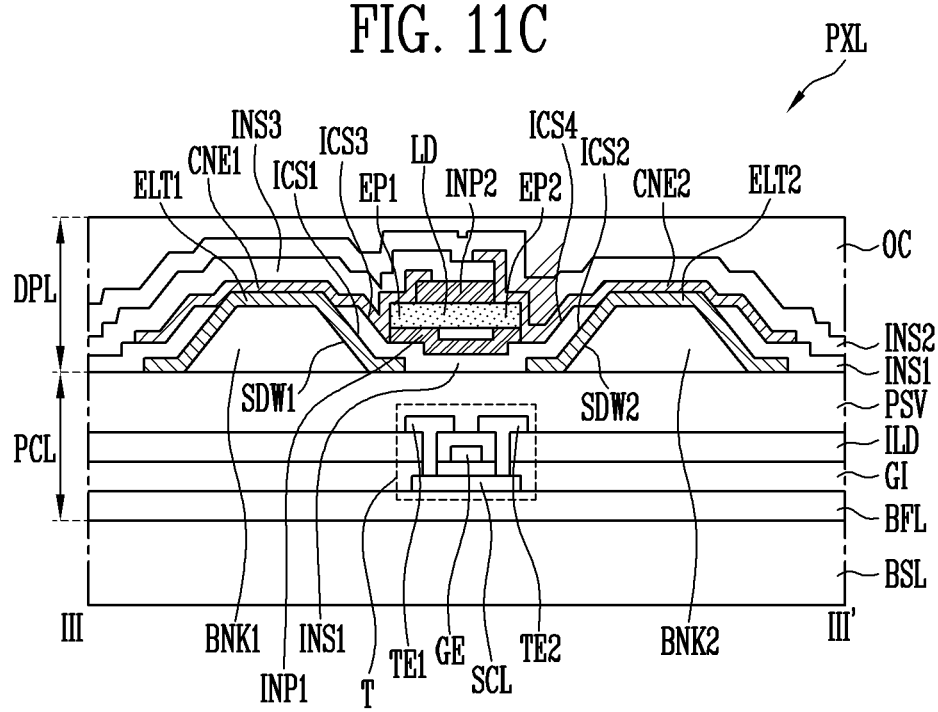

FIG. 10 is a plan view illustrating a pixel PXL in accordance with an embodiment of the present disclosure and, for example, illustrates a modified embodiment of the pixel PXL according to the embodiment shown in FIG. 7A. FIGS. 11A to 11D each are a sectional view illustrating a pixel PXL in accordance with an embodiment of the present disclosure and, for example, illustrate different embodiments of a cross-section of the pixel PXL taken along the line III-III' of FIG. 10. FIG. 12 is a sectional view illustrating an embodiment of a pixel omitting the first insulating pattern INP1 and, for example, illustrates a sectional view corresponding to the line III-III' of FIG. 10 with regard to a pixel PXL according to a comparative example which does not include the first insulating pattern INP1. For example, FIG. 12 illustrates a pixel PXL according to a comparative example which omits the first insulating pattern INP1, with regard to the pixel PXL in accordance with the embodiment of FIG. 11A. In the description of the embodiments shown in FIGS. 10 to 12, like reference numerals will be used to designate components (e.g., corresponding components) similar or equal to those of the previous embodiments, and detailed explanation thereof will be omitted.

Figure 11D:
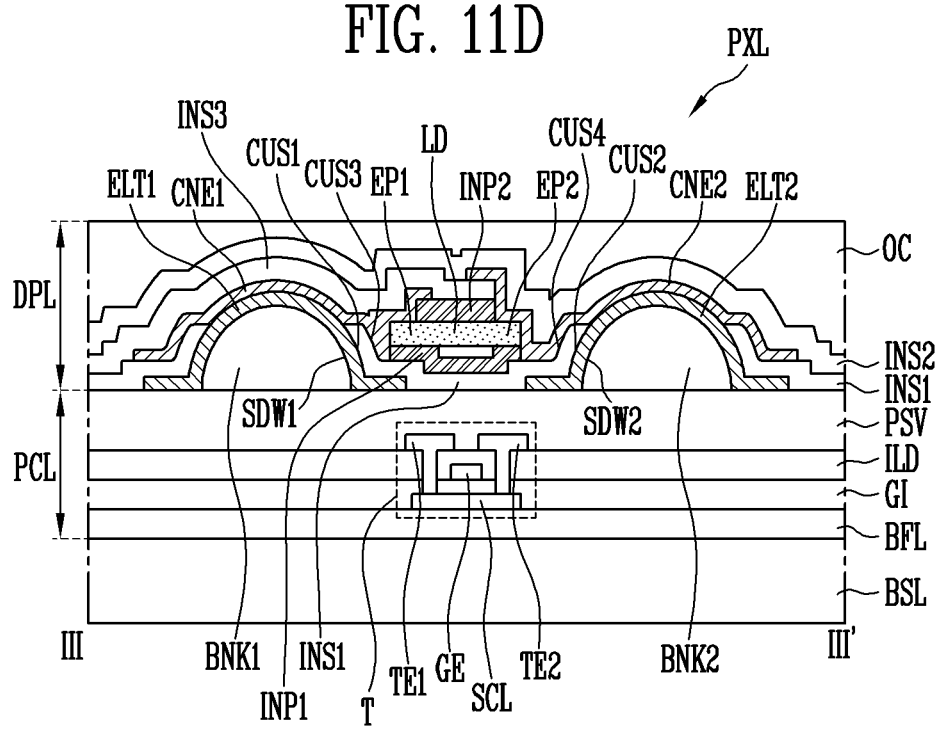
Figure 12:
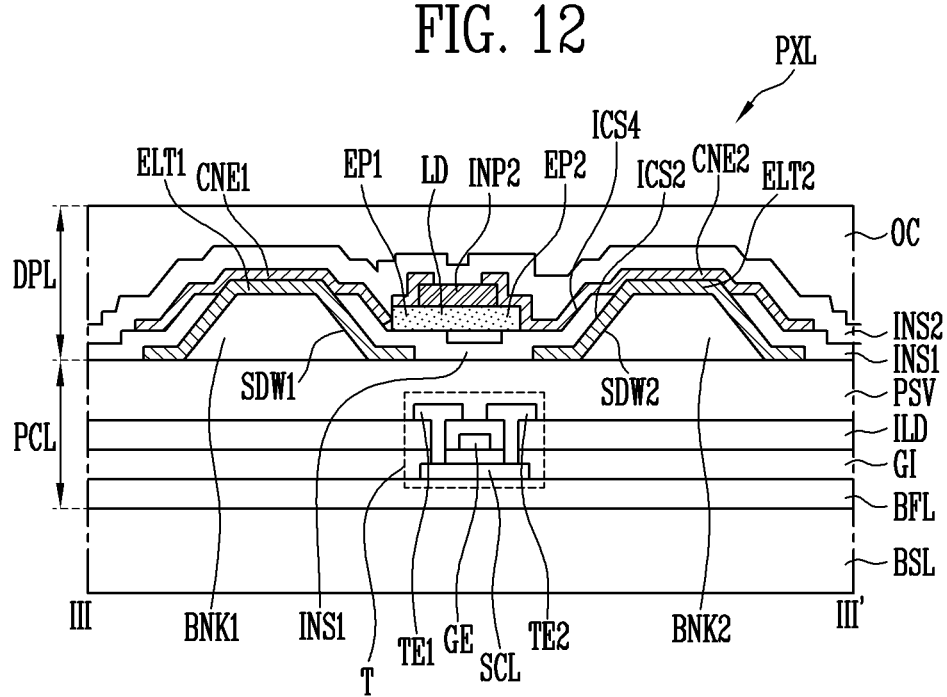
FIG. 12 is a sectional view illustrating a pixel omitting a first insulating pattern in accordance with an embodiment of the present disclosure.

Referring to FIGS. 10 to 11D, the light emitting elements LD may be aligned and biased to be positioned closer to any one electrode from among the first and second electrodes ELT1 and ELT2 than to the other. For example, most of the light emitting elements connected between the first and second electrodes ELT1 and ELT2 of each pixel PXL (e.g., approximately 70% or more or approximately 80% or more) of the light emitting elements LD and LDrv connected in the forward direction and/or reverse direction between the first and second electrodes ELT1 and ELT2 may be aligned to be positioned closer to the first electrode ELT1 than to the second electrode ELT2 and connected in the forward direction between the first and second electrodes ELT1 and ELT2.

In an embodiment, in the operation of aligning the light emitting elements LD between the first and second electrode ELT1 and ELT2 to form each light source unit LSU, the light emitting elements LD supplied to each pixel area (e.g., the emission area EMA of each pixel PXL) may be controlled to be aligned and biased in any one direction (e.g., the forward direction) by adjusting alignment signals (or alignment voltages) to be applied to the first and second electrodes ELT1 and ELT2 for forming a magnetic field. For example, the light emitting elements LD may be aligned to be biased such that the number of light emitting elements LD connected in the forward direction between the first and second electrodes ELT1 and ELT2 of each pixel PXL is increased by controlling alignment signals (or alignment voltages) to be applied to the first and second electrodes ELT1 and ELT2 for forming a magnetic field. In such an embodiment, the light emitting elements LD may be aligned and biased toward any one electrode (e.g., the first electrode ELT1) from among the first and second electrodes ELT1 and ELT2.

As such, in an embodiment in which the light emitting elements LD are biased and/or eccentrically aligned such that the number of light emitting elements LD connected in the forward direction between the first and second electrodes ELT1 and ELT2 is increased, the utilization rate of the light emitting elements LD supplied to each pixel area (e.g., the use rate as each valid light source) may be increased. Hence, the cost of fabricating the display device may be reduced, and each light source unit LSU may be reliably formed.

Furthermore, in an embodiment of the present disclosure, because the first insulating pattern INP1 is formed under the light emitting elements LD, disconnections of the first and second contact electrodes CNE1 and CNE2 may be reduced or effectively prevented from occurring even when the light emitting elements LD are eccentrically aligned between the first and second electrodes ELT1 and ELT2. For example, in an embodiment of the present disclosure, after the light emitting elements LD are aligned after the first insulating material layer has been formed to cover the first insulating layer INS1, the second insulating material layer may be formed on the light emitting elements LD, and then, the first and second insulating patterns INP1 and INP2 may be formed by concurrently (or simultaneously) etching the first and second insulating material layers. Hence, a spacing distance d equal to or greater than the thickness of the first insulating pattern INP1 (or the first insulating material layer) is secured between the first insulating layer INS1 and the first and second ends EP1 and EP2 of each of the light emitting elements LD so that space sufficient to form the first and second contact electrodes CNE1 and CNE2 between the first insulating layer INS1 and the first and second ends EP1 and EP2 may be secured. Hence, the disconnections of the first and second contact electrodes CNE1 and CNE2 may be reduced or effectively prevented from occurring.

On the other hand, the pixel PXL in accordance with the embodiment shown in FIG. 12 omits the first insulating pattern INP1 so that when the light emitting elements LD are aligned (e.g., are eccentrically aligned according to the biased alignment), one end of each of the light emitting elements LD may be aligned in close contact with the first insulating layer INS1. For example, the first ends EP1 of the light emitting elements LD may be aligned in close contact with the first insulating layer INS1 so that space sufficient to form the first contact electrode CNE1 (e.g., space for deposition of conductive material to form the first contact electrode CNE1) may not be provided between the first end EP1 and the first insulating layer INS1. In this case, if the first contact electrode CNE1 is formed by a sputtering scheme or the like, conductive material for forming the first contact electrode CNE1 may not be deposited to reliably cover the first ends EP1, and the first contact electrode CNE1 may be disconnected. For example, conductive material for forming the first contact electrode CNE1 may not reach an area under the first ends EP1, so that the first contact electrode CNE1 may be disconnected around the first ends EP1. Hence, the light emitting elements LD may not be completely connected between the first and second electrodes ELT1 and ELT2, and the utilization efficiency of the light emitting elements LD may be reduced. Furthermore, if a sufficient number of light emitting elements LD are not connected in the forward direction between the first and second electrodes ELT1 and ELT2, the corresponding pixel PXL may present as a dark spot due to a connection failure caused in the light source unit LSU.

FIGS. 13A to 13J are sectional views sequentially illustrating a method of fabricating a display device in accordance with an embodiment of the present disclosure and, for example, illustrate an embodiment of a method of fabricating a display device including the pixel PXL shown in FIGS. 10 and 11A.

Referring to FIGS. 5 to 13A, the circuit layer PCL including the pixel circuit PXC is formed in each pixel area on the base layer BSL. The first bank pattern BNK1 and the second bank pattern BNK2 are formed on the circuit layer PCL. In an embodiment in which the circuit layer PCL is omitted, the first bank pattern BNK1 and the second bank pattern BNK2 may be directly formed on one surface of the base layer BSL (or the base layer BSL on which the buffer layer BFL is formed).

In an embodiment, the first and second bank patterns BNK1 and BNK2 may be formed through a process of forming an insulating layer including inorganic material and/or organic material and/or a patterning process (e.g., a photo process) and may be formed through various types of known processes. In an embodiment, the first and second bank patterns BNK1 and BNK2 may be concurrently (or simultaneously) formed using identical material on an identical layer (or an identical plane) on the base layer BSL, but the present disclosure is not limited thereto.

Figure 13A:
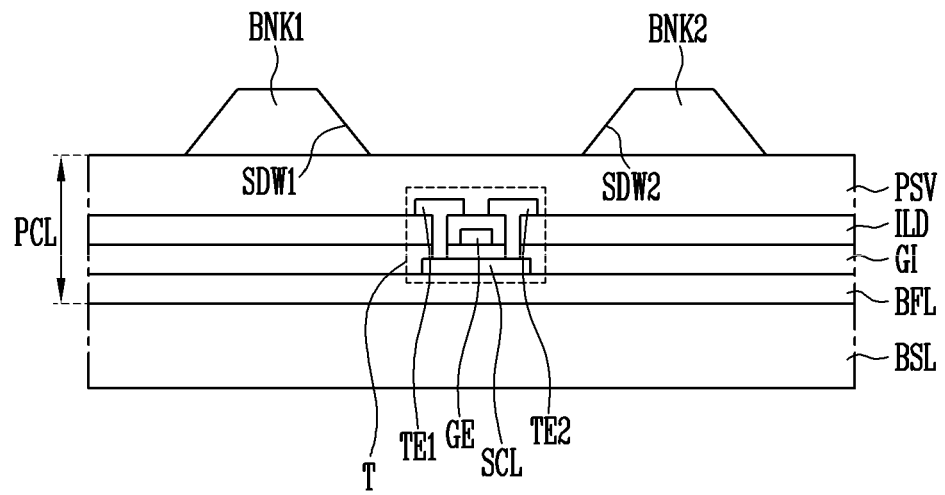
FIGS. 13A to 13J are sectional views sequentially illustrating a method of fabricating a display device in accordance with an embodiment of the present disclosure.
Figure 13B:
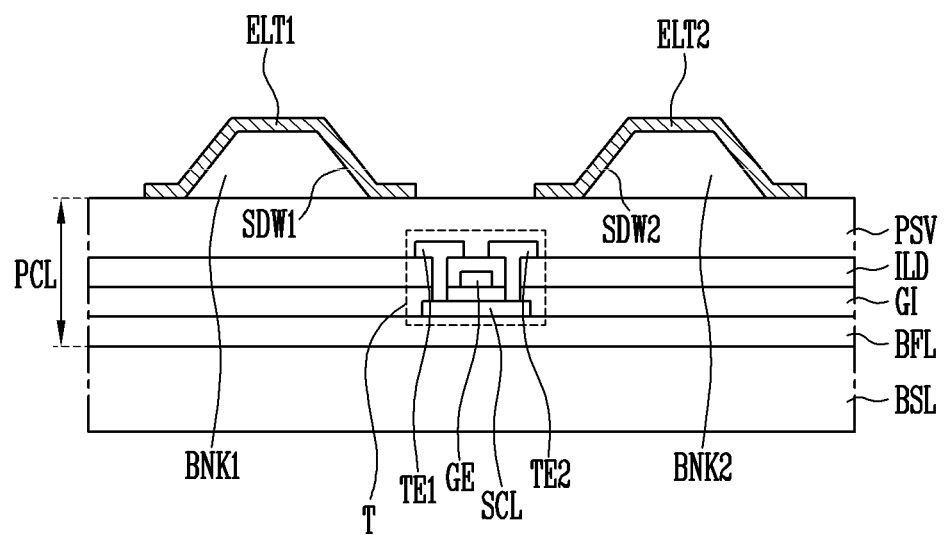

Referring to FIG. 13B, the first electrode ELT1 and the second electrode ELT2 are formed on the base layer BSL on which the first and second bank patterns BNK1 and BNK2 are formed. For example, the first electrode ELT1 and the second electrode ELT2 may be respectively formed on the first bank pattern BNK1 and the second bank pattern BNK2 In an embodiment in which the first and/or second bank patterns BNK1 and/or BNK2 are omitted, the first electrode ELT1 and the second electrode ELT2 may be directly formed on one surface of the base layer BSL (or the base layer BSL on which the circuit layer PCL is formed).

In an embodiment, the first electrode ELT1 may be formed on the first bank pattern BNK1 such that one area thereof protrudes due to the first bank pattern BNK1. Similarly, the second electrode ELT2 may be formed on the second bank pattern BNK2 such that one area thereof protrudes due to the second bank pattern BNK2.

In an embodiment, the first and second electrodes ELT1 and ELT2 may be formed through a process of forming a conductive layer including at least one conductive material and/or a patterning process and may be formed through various types of known processes. Each of the first and second electrodes ELT1 and ELT2 may be a single layer or a plurality of (or multiple) layers. For example, each of the first and second electrodes ELT1 and ELT2 may be formed of a conductive pattern having a single layer structure or a conductive pattern having a multilayer structure including a corresponding reflective electrode and a corresponding conductive capping layer. In an embodiment, the first and second electrodes ELT1 and ELT2 may be concurrently (or simultaneously) by formed using identical material on an identical layer (or an identical plane) on the base layer BSL, but the present disclosure is not limited thereto.

Figure 13C:
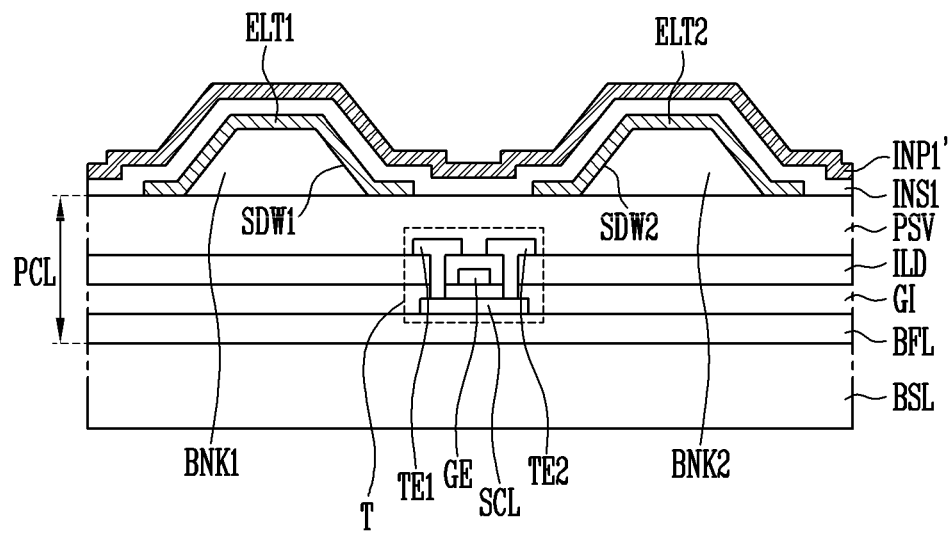

Referring to FIG. 13C, the first insulating layer INS1 and a first insulating material layer INP1' are formed on the base layer BSL including the first and second electrodes ELT1 and ELT2. In an embodiment, the first insulating layer INS1 and the first insulating material layer INP1' are sequentially formed and have different etch selectivities. For example, after the first insulating layer INS1 having a first etch selectivity is formed on the base layer BSL to cover the first and second electrodes ELT1 and ELT2, the first insulating material layer INP1' having a second etch selectivity may be formed on the first insulating layer INS1 to cover the first insulating layer INS1.

In an embodiment, the first insulating layer INS1 and the first insulating material layer INP1' each may be formed through a deposition process of an insulating layer including inorganic insulating material and/or organic insulating material and may be formed through various types of known processes. Furthermore, the first insulating layer INS1 and the first insulating material layer INP1' may have the same thickness or different thicknesses.

In an embodiment, the first insulating layer INS1 and the first insulating material layer INP1' may be formed of different materials. For example, the first insulating layer INS1 may be formed of first insulating material, and the first insulating material layer INP1' may be formed of second insulating material different from the first insulating material. For example, the first insulating layer INS1 may be formed by depositing silicon nitride ($SiN_x$) on the base layer BSL including the first and second electrodes ELT1 and ELT2. The first insulating material layer INP1' may be formed by depositing silicon oxide ($SiO_x$) on the first insulating layer INS1.

Figure 13D:
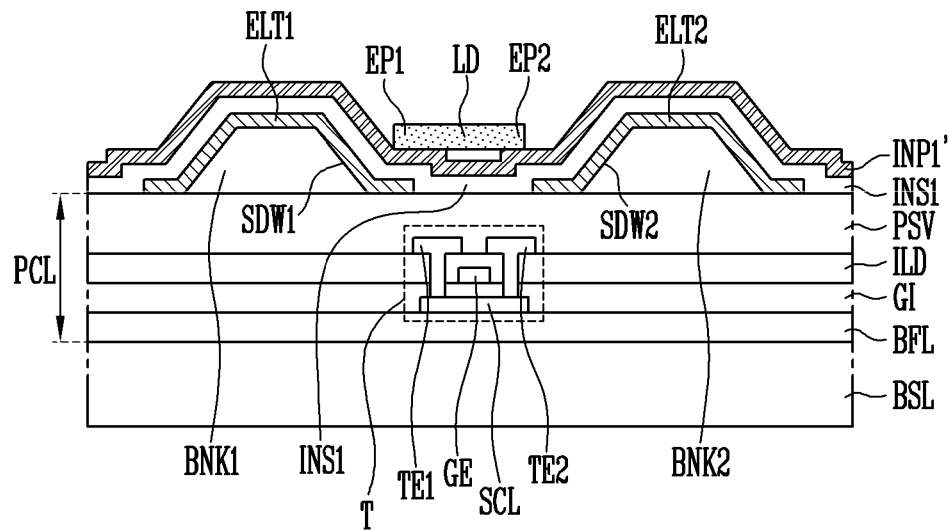

Referring to FIG. 13D, one or a plurality of light emitting elements LD may be supplied and aligned between the first electrode ELT1 and the second electrode ELT2 of each pixel PXL. For example, a plurality of light emitting elements LD may be supplied to each pixel area (e.g., the emission area EMA of each pixel PXL) on the base layer BSL on which the first and second electrodes ELT1 and ELT2, the first insulating layer INS1, the first insulating material layer INP1', etc. are formed. In addition, an electric field may be formed between the first and second electrodes ELT1 and ELT2 by applying alignment voltages (e.g., predetermined alignment voltages) to the first and second electrodes ELT1 and ELT2, whereby the light emitting elements LD may be aligned between the first and second electrodes ELT1 and ELT2. The operation of applying the alignment voltages to the first and second electrodes ELT1 and ELT2 may be performed concurrently (or simultaneously) with the supply of the light emitting elements or performed after the supply of the light emitting elements LD.

In an embodiment, the light emitting elements LD may be supplied to each pixel area in such a way that a solution (also referred to as "light emitting element ink (LED ink)") in which a plurality of light emitting elements LD are dispersed is applied to each emission area EMA of the base layer BSL through an inkjet printing scheme or a slit coating scheme, etc. However, the scheme of supplying the light emitting elements LD is not limited to the foregoing scheme, and the light emitting elements LD may be supplied to each pixel area in various other ways.

In an embodiment, an electric field for self-alignment of the light emitting elements LD may be formed between the first and second electrodes ELT1 and ELT2 by supplying an AC alignment voltage or a constant voltage having a reference potential to each of the first and second electrodes ELT1 and ELT2. For example, the light emitting elements LD may be aligned between the first and second electrodes ELT1 and ELT2 of each pixel PXL by applying an AC alignment voltage to the second electrode ELT2 of each of the pixels PXL and supplying a constant voltage having a reference potential (e.g., a ground potential) to the first electrode ELT1 of each of the pixels PXL.

In an embodiment, each light emitting element LD may be aligned in a horizontal direction between the first and second electrodes ELT1 and ELT2 of the corresponding pixel PXL. For example, the first end EP1 of each of the light emitting elements LD may be disposed to face the first electrode ELT1, and the second end EP2 of each of the light emitting elements LD may be disposed to face the second electrode ELT2.

In an embodiment, the light emitting elements LD supplied to each pixel area may be controlled to be aligned and biased in any one direction (e.g., the forward direction) by adjusting alignment signals (or alignment voltages) to be applied to the first and second electrodes ELT1 and ELT2 or forming a magnetic field. In such an embodiment, the light emitting elements LD may be eccentrically aligned to be positioned closer to any one electrode (e.g., the first electrode ELT1) from among the first and second electrodes ELT1 and ELT2. For example, at least some (e.g., a first group of) light emitting elements LD may be aligned to be closer to the first electrode ELT1 such that the some light emitting elements LD are in close contact with one area of the first insulating material layer INP1' disposed on the first sidewall SDW1 of the first bank pattern BNK1.

Figure 13E:
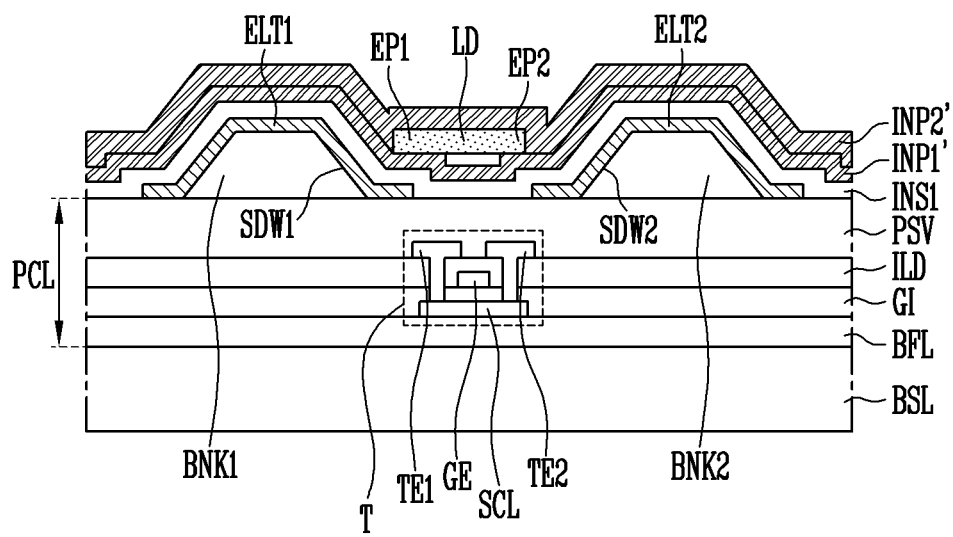

Referring to FIG. 13E, a second insulating material layer INP2' is formed to cover the first insulating material layer INP1' and the light emitting elements LD on the base layer BSL on which the first insulating material layer INP1' and the light emitting elements LD are disposed. The second insulating material layer INP2' may be formed through a deposition process of an insulating layer including inorganic insulating material and/or organic insulating material and a patterning process and may be formed through various types of known processes.

In an embodiment, the second insulating material layer INP2' may be formed to have the same etch selectivity (e.g., the second etch selectivity) as that of the first insulating material layer INP1'. For example, in an embodiment in which the first insulating layer INS1 and the first insulating material layer INP1' are respectively formed of first insulating material and second insulating material, the second insulating material layer INP2' may be formed of the second insulating material. Thus, the first and second insulating material layers INP1' and INP2' may have the same etch selectivity. In another embodiment, the second insulating material layer INP2' may be formed using material and/or fabrication method different from that of the first insulating material layer INP1', and the first and second insulating material layers INP1' and INP2' may be formed to have the same selectivity with respect to the same etching gas.

Figure 13F:
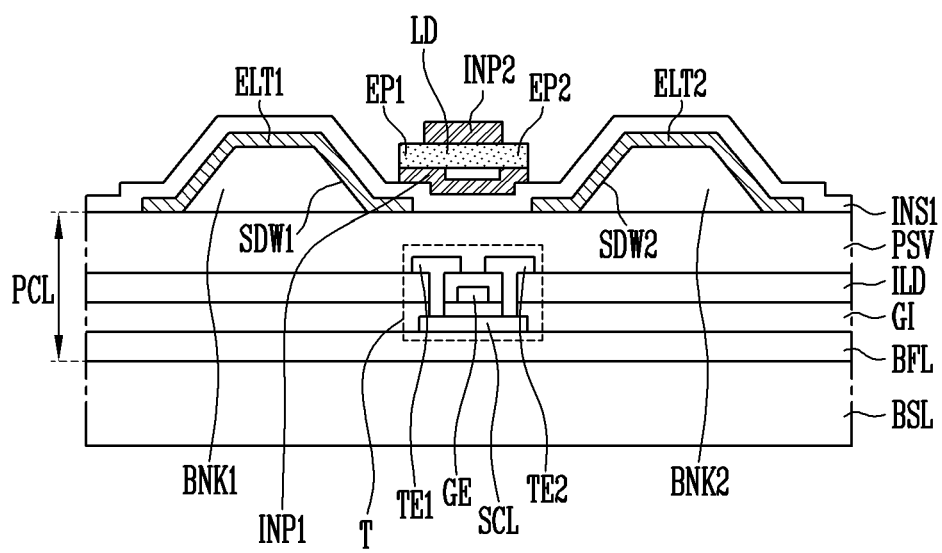

Referring to FIG. 13F, the first and second ends EP1 and EP2 of the light emitting elements LD may be exposed by etching the first insulating material layer INP1' and the second insulating material layer INP2'. For example, the first and second insulating patterns INP1 and INP2 may be formed by concurrently (or simultaneously) etching the first and second insulating material layers INP1' and INP2' by using an etching gas (e.g., a predetermined etching gas).

In an embodiment, as the first insulating material layer INP1' is etched, the first insulating pattern INP1 may be formed to be disposed under lower portions of the light emitting elements LD including the first and second ends EP1 and EP2 of the light emitting elements LD. Furthermore, as the second insulating material layer INP2' is etched, the second insulating pattern INP2 may be formed to be disposed over some areas of the light emitting elements LD except the first and second ends EP1 and EP2 of the light emitting elements LD. Hence, the first and second ends EP1 and EP2 of the light emitting elements LD may be exposed.

Figure 13G:
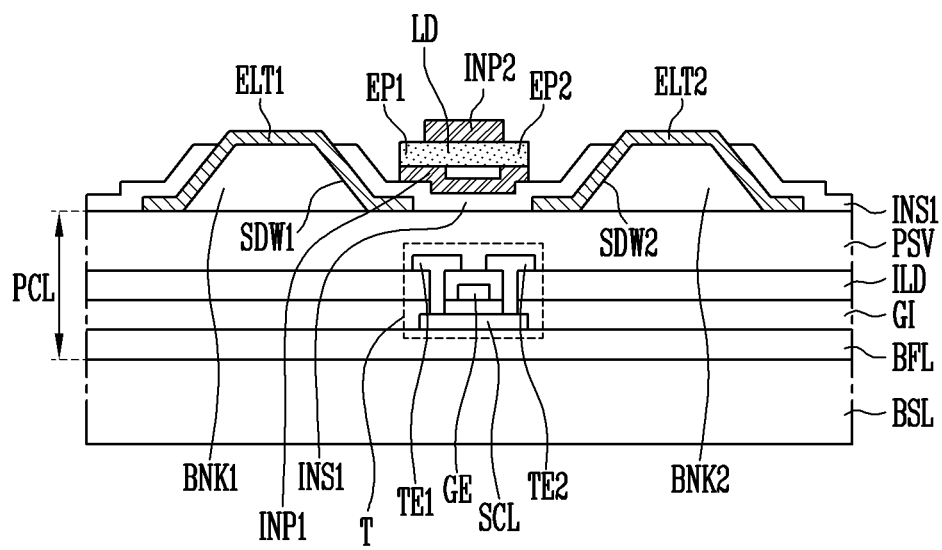

Referring to FIG. 13G, one area of each of the first and second electrodes ELT1 and ELT2 is exposed by etching the first insulating layer INS1. For example, the first insulating layer INS1 may be etched over one area of each of the first and second bank patterns BNK1 and BNK2 such that one area of each of the first and second electrodes ELT1 and ELT2 is exposed.

Figure 13H:
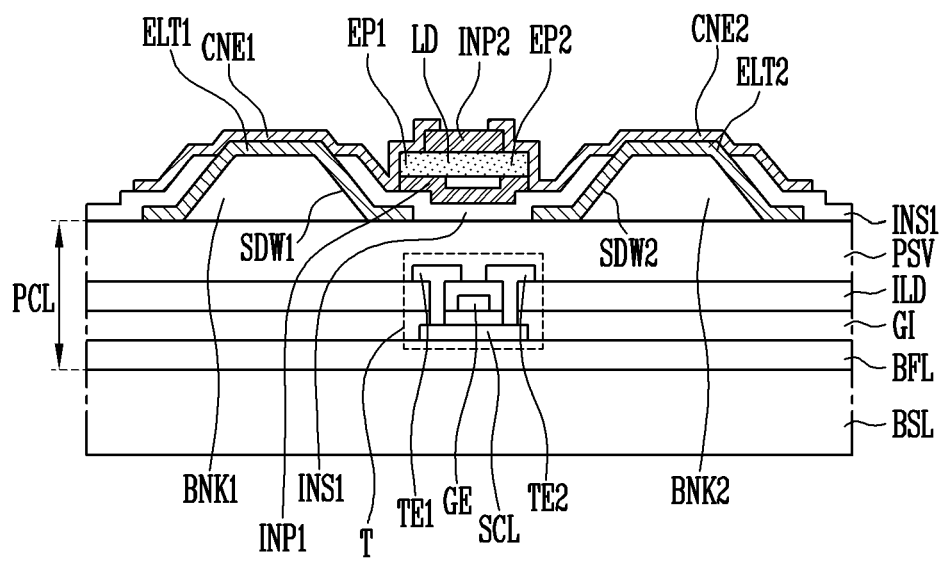

Referring to FIG. 13H, the first contact electrode CNE1 is formed on the first ends EP1 of the light emitting elements LD and the first electrode ELT1, and the second contact electrode CNE2 is formed on the second ends EP2 of the light emitting elements LD and the second electrode ELT2. In an embodiment, the first contact electrode CNE1 may be formed to electrically connect the first ends EP1 of the light emitting elements LD to the first electrode ELT1, and the second contact electrode CNE2 may be formed to electrically connect the second ends EP2 of the light emitting elements LD to the second electrode ELT2.

In an embodiment, the first and second contact electrodes CNE1 and CNE2 may be concurrently (or simultaneously) formed. However, the present disclosure is not limited thereto. For example, in an embodiment, the first and second contact electrodes CNE1 and CNE2 may be sequentially formed.

In an embodiment, the first and second contact electrodes CNE1 and CNE2 may be formed through a process of forming a conductive layer including at least one identical or different conductive materials and/or a patterning process and may be formed through various types of known processes. In an embodiment, each of the first and second contact electrodes CNE1 and CNE2 may be formed to be substantially transparent by using at least one transparent electrode material. Hence, light emitted from the light emitting elements LD through the first and second ends EP1 and EP2 may pass through the first and second contact electrodes CNE1 and CNE2.

Figure 13I:
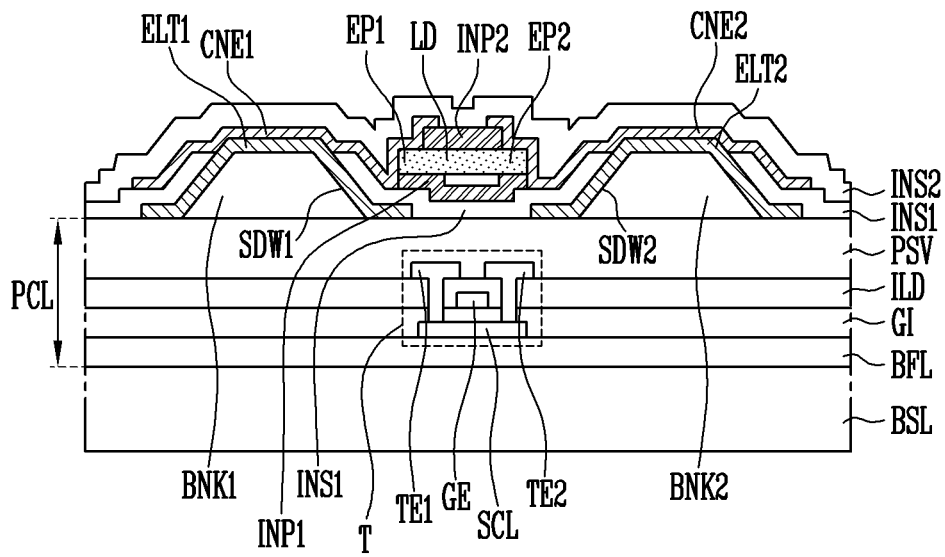

Referring to FIG. 13I, the second insulating layer INS2 is formed on one surface of the base layer BSL on which the first and second contact electrodes CNE1 and CNE2 are formed. In an embodiment, the second insulating layer INS2 may be formed through a deposition process of at least one insulating layer, including inorganic insulating material and/or organic insulating material, and may be formed through various types of known processes.

Figure 13J:
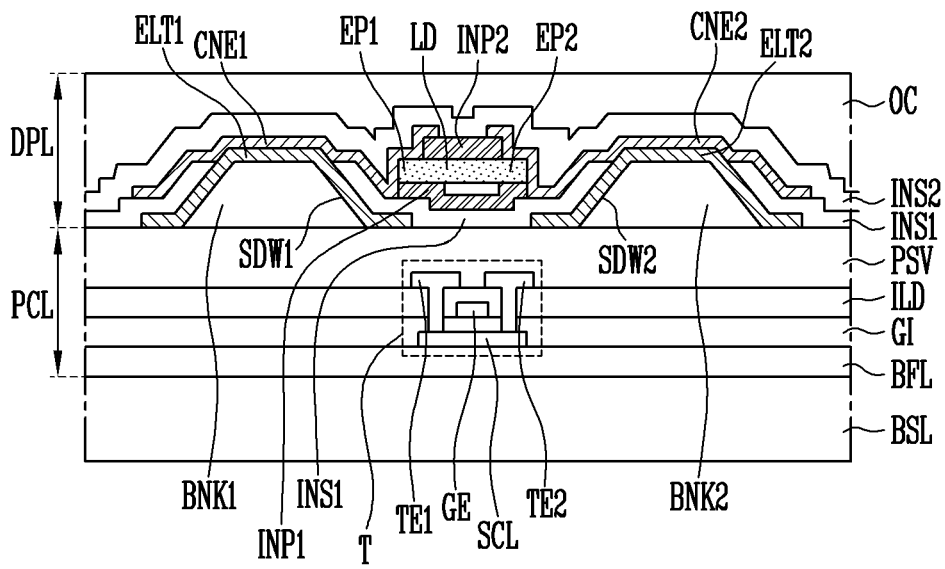

Referring to FIG. 13J, the overcoat layer OC is formed on one surface of the base layer BSL on which the second insulating layer INS2 is formed. In an embodiment, the overcoat layer OC may be formed through a deposition process of at least one insulating layer, including inorganic insulating material and/or organic insulating material, and may be formed through various types of known processes.

In an embodiment, the overcoat layer OC may be a thin film encapsulation layer, which includes a plurality of inorganic insulating layers and at least one organic insulating layer interposed between the inorganic insulating layers. In an embodiment, the overcoat layer OC may be a single layer, or the overcoat layer OC may be omitted. In an embodiment, in lieu of the overcoat layer OC, an encapsulation substrate or the like may be disposed on the base layer BSL including the pixels PXL.

The display panel PNL including the pixel PXL in accordance with an embodiment of the present disclosure (e.g., the pixel PXL in accordance with the embodiment shown in FIG. 11A) may be fabricated through the foregoing process.

Figure 14A:
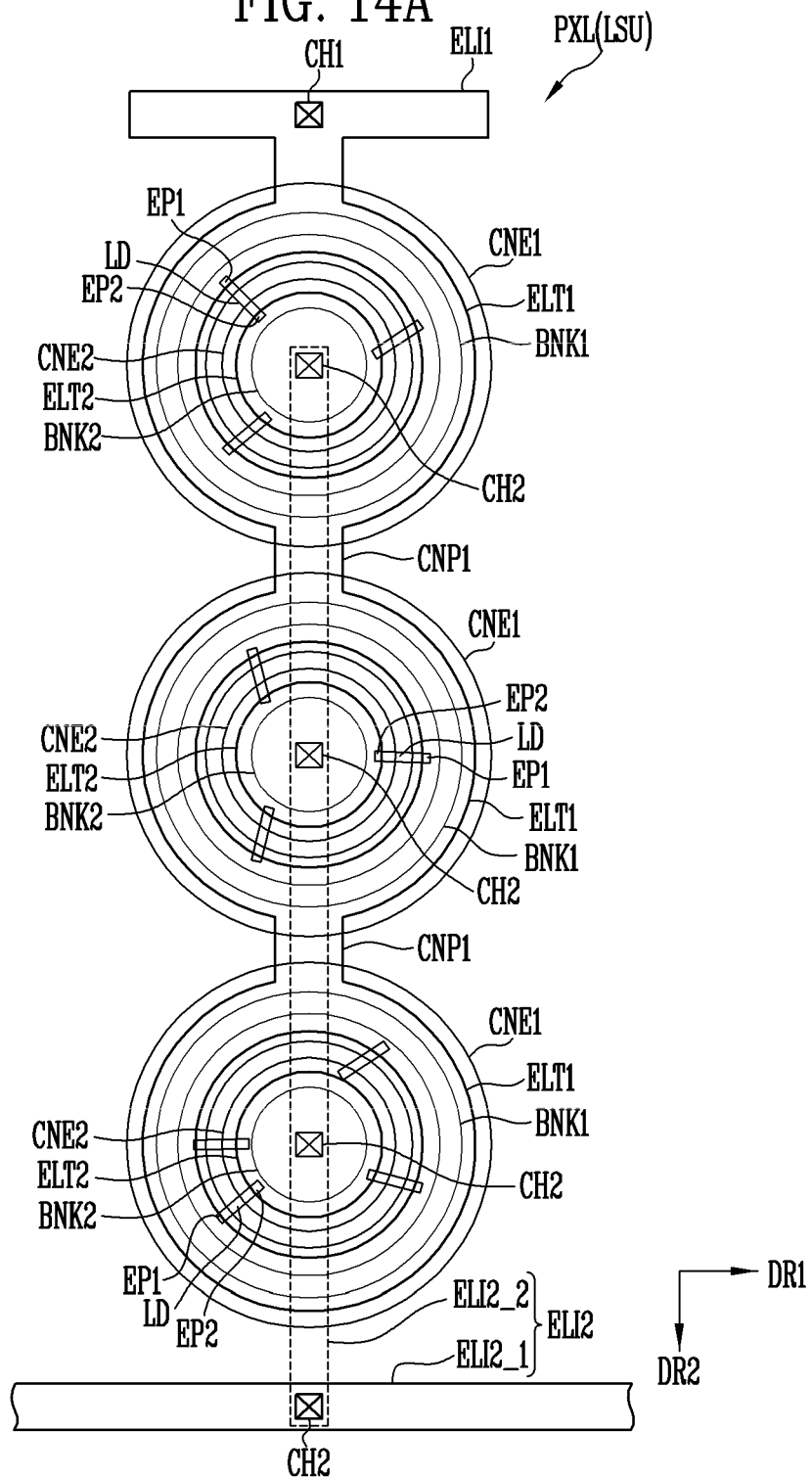
FIGS. 14A to 14C are plan views each illustrating a pixel in accordance with an embodiment of the present disclosure.
Figure 14B:
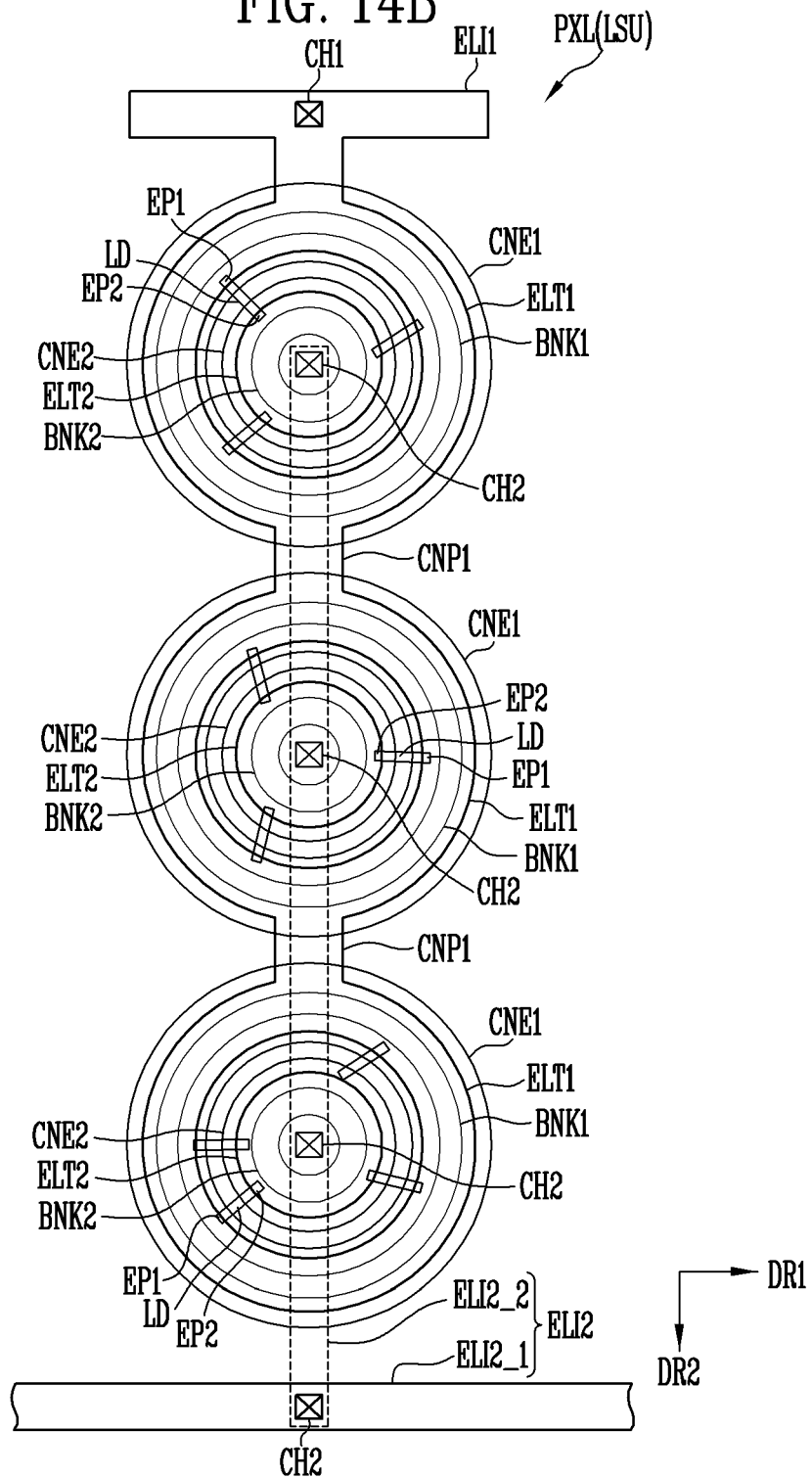
Figure 14C:
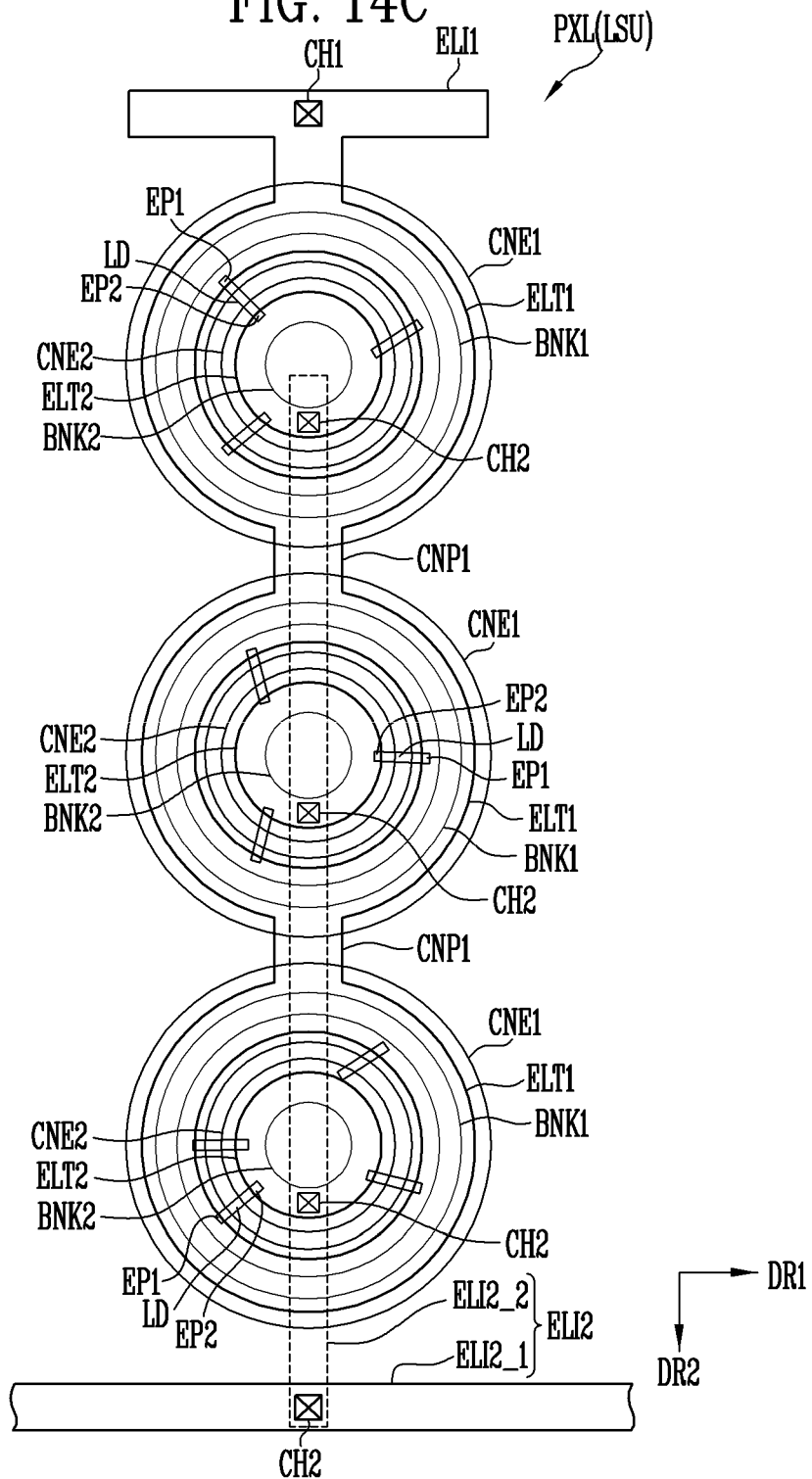

FIGS. 14A to 14C are plan diagrams each illustrating a pixel PXL in accordance with an embodiment of the present disclosure. In the description of the embodiment of FIGS. 14A to 14C, like reference numerals will be used to designate components similar or equal to those of the previous embodiments, and detailed explanations thereof will be omitted.

Referring to FIG. 14A, each first electrode ELT1 and each second electrode ELT2 may have the shape of a circle or a ring. For example, the second electrode ELT2 may have a circular shape, and the first electrode ELT1 may have the shape of a ring enclosing each corresponding second electrode ELT2.

The first bank pattern BNK1 and/or the first contact electrode CNE1 may have a shape corresponding to the shape of each first electrode ELT1. For example, the first bank pattern BNK1 and the first contact electrode CNE1 may have the shape of a ring formed to overlap the first electrode ELT1.

The second bank pattern BNK2 and/or the second contact electrode CNE2 may have a shape corresponding to the shape of each second electrode ELT2. For example, the second bank pattern BNK2 and the second contact electrode CNE2 may have the shape of a circle formed to overlap the second electrode ELT2.

In an embodiment, a plurality of first electrodes ELT1 and/or a plurality of second electrodes ELt2 may be disposed in each pixel area. For example, at least two pairs of first electrodes ELT1 and second electrodes ELT2 may be disposed in each pixel area. For example, a plurality of second electrodes ELT2 may be disposed at positions spaced apart from each other in the second direction DR2. Furthermore, a plurality of first electrodes ELT1 may be disposed in the second direction DR2 to enclose each second electrode ELT2.

In an embodiment, a plurality of first electrodes ELT1 may be integrally or non-integrally connected to each other. For example, a plurality of first electrodes ELT1 may be integrally connected to each other by at least one first connector CNP1.

In an embodiment, a plurality of second electrodes ELT2 may be integrally or non-integrally connected to each other. For example, a plurality of second electrodes ELT2 may be individually spaced apart from each other and connected to a main electrode line ELI2_1 through second contact holes CH2 and a sub-electrode line ELI2_2.

In an embodiment, the main electrode line ELI2_1 and the sub-electrode line ELI2_2 may form the second electrode line ELT2, and each of the main electrode line ELI2_1 and the sub-electrode line ELI2_2 may be disposed on a layer equal to or different from the second electrodes ELT2. For example, the main electrode line ELI2_1 may be disposed on the same layer as that of the first and second electrodes ELT1 and ELT2. The sub-electrode line ELI2_2 may be disposed on a layer separated from that of the first and second electrodes ELT1 and ELT2 with at least one insulating layer interposed therebetween. For example, the sub-electrode line ELI2_2 may be disposed on the same layer as that of the first and second transistor electrodes TE1 and TE2 illustrated in FIG. 11A, etc., and electrically connected to the second electrode ELT2 and the main electrode line ELI2_1 through the second contact holes CH2.

Referring to FIG. 14B, at least one of the second bank pattern BNK2 and the second contact electrode CNE2 may be formed in a ring shape. For example, the second bank pattern BNK2 may have a ring shape having an opening formed in an area corresponding to each second contact hole CH2 so that the second bank pattern BNK2 does not overlap the second contact hole CH2.

Referring to FIG. 14C, the second contact hole CH2 may be disposed in a perimeter of an area in which each second bank pattern BNK2 is formed. In such an embodiment, even when the second bank pattern BNK2 does not have an opening, the second bank pattern BNK2 may not overlap the second contact hole CH2.

As shown in the foregoing embodiments, respective electrodes including the first and/or second electrodes ELT1 and ELT2, etc., which form the pixel PXL, the bank patterns, and/or the insulating patterns, etc. may be modified to have various shapes including a circular shape, etc., as well as a bar shape. For example, the first and second electrodes ELT1 and ELT2, the first and second contact electrodes CNE1 and CNE2, the first and second bank patterns BNK1 and BNK2, and the first and second insulating patterns INP1 and INP2 each may have a circular shape, an elliptical shape, various polygonal shapes, or a ring shape corresponding thereto. In other words, the shapes, the sizes, the numbers, and/or the positions, etc. of respective electrodes, bank patterns, and/or insulating patterns that form the pixel PXL may not be particularly limited and may be changed in various ways depending on embodiments.

While aspects and features of the present disclosure are described herein with reference to embodiments, it should be noted that the above-described embodiments are merely descriptive and should not be considered limiting. It should be understood by those skilled in the art that various changes, substitutions, and alternations may be made herein without departing from the scope of the present disclosure as defined by the following claims and their equivalents.

The scope of the present disclosure is not limited by detailed descriptions of the present disclosure and should be defined by the accompanying claims and their equivalents. Furthermore, all changes or modifications of the present disclosure derived from the meanings and scope of the claims, and equivalents thereof should be construed as being included in the scope of the present disclosure.

The invention claimed is:

1. A display device comprising a pixel in a display area, the pixel comprising:
   a first electrode and a second electrode spaced apart from each other;
   a first insulating layer on one area of each of the first electrode and the second electrode and in an area between the first electrode and the second electrode, and having a first etch selectivity;
   a first insulating pattern on the first insulating layer in the area between the first electrode and the second electrode, and having a second etch selectivity;
   a light emitting element on the first insulating pattern, and having a first end and a second end;
   a second insulating pattern having the second etch selectivity, and being on one area of the light emitting element such that the first end and the second end of the light emitting element are exposed; and
   a third electrode and a fourth electrode configured to electrically connect the first end and the second end of the light emitting element to the first electrode and the second electrode, respectively.

2. The display device according to claim 1,
   wherein the first insulating layer comprises a first insulating material, and
   wherein the first insulating pattern and the second insulating pattern comprise a second insulating material different from the first insulating material.

3. The display device according to claim 1, wherein the light emitting element is spaced apart from the first insulating layer with the first insulating pattern-therebetween.

4. The display device according to claim 1, wherein the first insulating pattern is on the first insulating layer and only under the light emitting element and the second insulating pattern.

5. The display device according to claim 1, wherein the light emitting element is spaced apart from the first insulating layer by a distance equal to or greater than a thickness of the first insulating pattern.

6. The display device according to claim 1, wherein the pixel further comprises:
   a first bank pattern under one area of the first electrode; and
   a second bank pattern under one area of the second electrode.

7. The display device according to claim 6,
   wherein the first bank pattern has a first sidewall facing the first end of the light emitting element, and
   wherein the second bank pattern has a second sidewall facing the second end of the light emitting element.

8. The display device according to claim 7,
   wherein the third electrode is on the first end and extends to an upper portion of the first electrode via an upper portion of the first sidewall, and
   wherein the fourth electrode is-on the second end of the light emitting element and extends to an upper portion of the second electrode via an upper portion of the second sidewall.

9. The display device according to claim 1,
   wherein the pixel comprises a plurality of light emitting elements comprising the light emitting element and being connected between the first electrode and the second electrode, and
   wherein the plurality of light emitting elements are closer to the first electrode than to the second electrode.

10. The display device according to claim 1,
    wherein the first electrode is connected to a first power source, and
    wherein the second electrode is connected to a second power source.

11. The display device according to claim 10,
    wherein the pixel further comprises a pixel circuit connected between the first power source and the first electrode, and
    wherein the display device further comprises, in the display area:
      a circuit layer comprising circuit elements of the pixel circuit; and
      a display layer overlapping the circuit layer, and comprising the first electrode, the second electrode, the light emitting element.

12. A method of fabricating a display device, the method comprising:
    forming a first electrode and a second electrode on a base layer;
    forming a first insulating layer having a first etch selectivity on the base layer so that the first insulating layer covers the first electrode and the second electrode;
    forming a first insulating material layer having a second etch selectivity on the first insulating layer;
    supplying a light emitting element onto the base layer on which the first insulating material layer is formed, and aligning the light emitting element between the first electrode and the second electrode;

forming a second insulating material layer having the second etch selectivity on the base layer so that the second insulating material layer covers the first insulating material layer and the light emitting element;

exposing a first end and a second end of the light emitting element by etching the first insulating material layer and the second insulating material layer;

exposing one area of each of the first electrode and the second electrode by etching the first insulating layer; and forming a third electrode and a fourth electrode configured to electrically connect the first end and the second end of the light emitting element to the first electrode and the second electrode, respectively.

13. The method according to claim 12, wherein the first insulating layer comprises a first insulating material, and
wherein the first insulating material layer comprises a second insulating material different from the first insulating material.

14. The method according to claim 13, wherein the second insulating material layer comprises the second insulating material.

15. The method according to claim 12, wherein the first insulating material layer and the second insulating material layer are simultaneously etched,
wherein a first insulating pattern is formed by etching the first insulating material layer such that the first insulating pattern is under a lower portion of the light emitting element having the first end and the second end of the light emitting element, and
wherein a second insulating pattern is formed by etching the second insulating material layer such that the second insulating pattern is over one area of the light emitting element other than the first end and the second end of the light emitting element.

16. The method according to claim 12, further comprising forming a first bank pattern and a second bank pattern on the base layer before forming the first electrode and the second electrode.

17. The method according to claim 16, wherein the first electrode is formed on the first bank pattern such that one area of the first electrode protrudes by the first bank pattern, and
wherein the second electrode is formed on the second bank pattern such that one area of the second electrode protrudes by the second bank pattern.

18. The method according to claim 12, wherein the supplying and aligning of the light emitting element comprises:
supplying a plurality of light emitting elements comprising the light emitting element to each pixel area in which the first electrode and the second electrode are formed; and
aligning the light emitting elements between the first electrode and the second electrode by forming an electric field between the first electrode and the second electrode.

19. The method according to claim 18, wherein the light emitting elements are aligned to be positioned closer to the first electrode than to the second electrode.

20. The method according to claim 12, further comprising forming a circuit layer comprising a pixel circuit on the base layer before forming the first electrode and the second electrode.

* * * * *